United States Patent
Tian et al.

(10) Patent No.: US 12,408,526 B2
(45) Date of Patent: Sep. 2, 2025

(54) DISPLAY PANEL AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Donghui Tian, Beijing (CN); Bo Zhang, Beijing (CN); Zhiwen Chu, Beijing (CN); Rong Wang, Beijing (CN); Yulong Wei, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 220 days.

(21) Appl. No.: 18/363,127

(22) Filed: Aug. 1, 2023

(65) Prior Publication Data

US 2023/0380234 A1 Nov. 23, 2023

Related U.S. Application Data

(63) Continuation-in-part of application No. 17/428,628, filed as application No. PCT/CN2020/122868 on Oct. 22, 2020, now Pat. No. 11,758,658.

(51) Int. Cl.
  *H05K 1/18* (2006.01)
  *H10K 59/131* (2023.01)

(52) U.S. Cl.
  CPC ........... *H10K 59/131* (2023.02); *H05K 1/189* (2013.01); *H05K 2201/10128* (2013.01)

(58) Field of Classification Search
  CPC ............... H05K 59/131; H05K 1/189; H05K 2201/10128

(Continued)

(56) References Cited

U.S. PATENT DOCUMENTS

2012/0134120 A1* 5/2012 Gondo ............... G02F 1/13452
                                                    174/250
2014/0319528 A1   10/2014 Kesho et al.
(Continued)

FOREIGN PATENT DOCUMENTS

CN         101800238 A      8/2010
CN         104122687 A      10/2014
(Continued)

OTHER PUBLICATIONS

International Search Report & Written Opinion mailed Jul. 16, 2021, regarding PCT/CN2020/122868.
(Continued)

*Primary Examiner* — Binh B Tran
(74) *Attorney, Agent, or Firm* — Intellectual Valley Law, P.C.

(57) ABSTRACT

A display panel having a bonding region for bonding a flexible printed circuit in a peripheral region is provided. The display panel includes a plurality of first signal lines on a base substrate; and a plurality of bonding pins on the base substrate and in the bonding region. The plurality of bonding pins include a plurality of first bonding pins respectively electrically connected to the plurality of first signal lines. The display panel further includes a plurality of connecting portions respectively connecting the plurality of first signal line portions to the plurality of first bonding pin portions. The respective first bonding pin portion includes a first sub-layer, a second sub-layer, and a third sub-layer, stacked together. The respective connecting portion is in a same layer as one of the first sub-layer, a second sub-layer, and a third sub-layer.

20 Claims, 30 Drawing Sheets

(58) Field of Classification Search
USPC .......................................................... 361/749
See application file for complete search history.

(56) References Cited

U.S. PATENT DOCUMENTS

| | | | |
|---|---|---|---|
| 2014/0321088 | A1 | 10/2014 | Bae et al. |
| 2015/0366049 | A1 | 12/2015 | Lee |
| 2016/0306214 | A1 | 10/2016 | Ikeda et al. |
| 2016/0316577 | A1 | 10/2016 | Yamamoto |
| 2017/0127512 | A1 | 5/2017 | Park et al. |
| 2018/0020543 | A1* | 1/2018 | Kim ..................... H05K 1/118 |
| 2019/0122943 | A1 | 4/2019 | Lim et al. |
| 2019/0281699 | A1 | 9/2019 | Bae et al. |
| 2019/0357367 | A1* | 11/2019 | Chung ................ G02F 1/13458 |
| 2020/0098675 | A1 | 3/2020 | Chang et al. |

FOREIGN PATENT DOCUMENTS

| | | | |
|---|---|---|---|
| CN | 104123902 | A | 10/2014 |
| CN | 105301851 | A | 2/2016 |
| CN | 205376003 | U | 7/2016 |
| CN | 205621412 | U | 10/2016 |
| CN | 106652786 | A | 5/2017 |
| CN | 109698184 | A | 4/2019 |
| CN | 109935169 | A | 6/2019 |
| CN | 110488545 | A | 11/2019 |
| CN | 111564111 | A | 8/2020 |

OTHER PUBLICATIONS

First Office Action in the Chinese Patent Application No. 202080002418. X, dated Jan. 1, 2023; English translation attached.
Second Office Action in the Chinese Patent Application No. 202080002418.X, dated Jul. 25, 2023; English translation attached.
Non-Final Office Action in the U.S. Appl. No. 17/428,628, dated Mar. 2, 2023.
Response to Non-Final Office Action in the U.S. Appl. No. 17/428,628, dated May 5, 2023.
Notice of Allowance in the U.S. Appl. No. 17/428,628, dated May 24, 2023.

\* cited by examiner

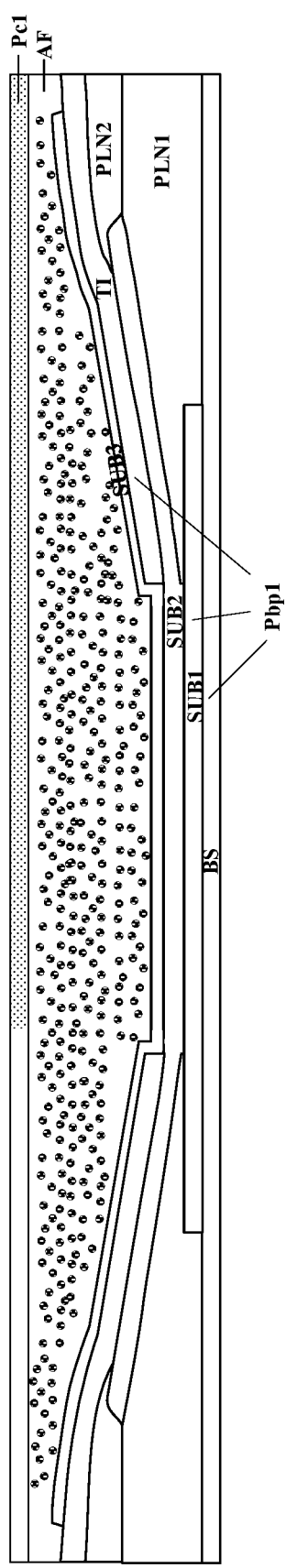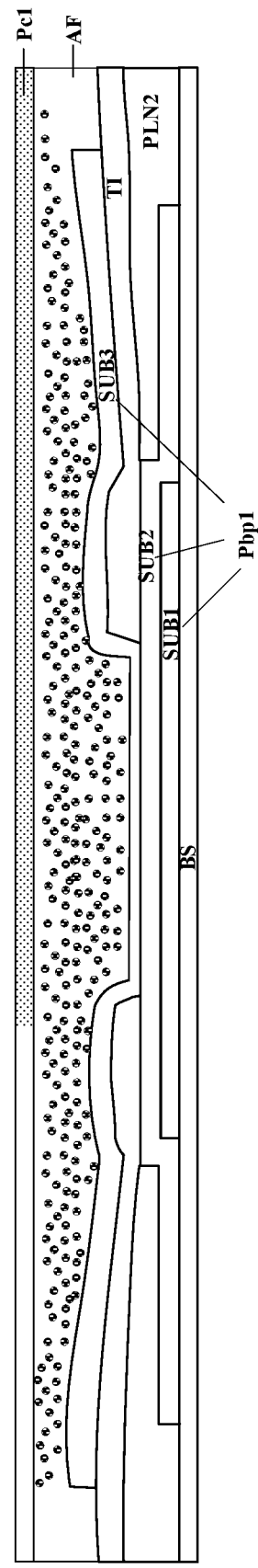
FIG. 12A
FIG. 12B

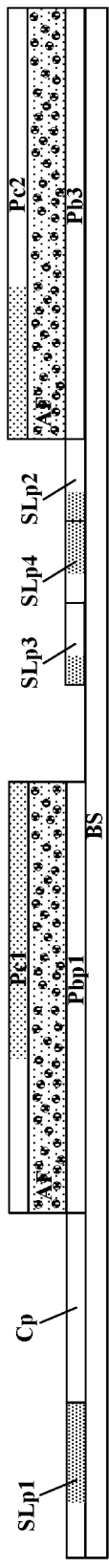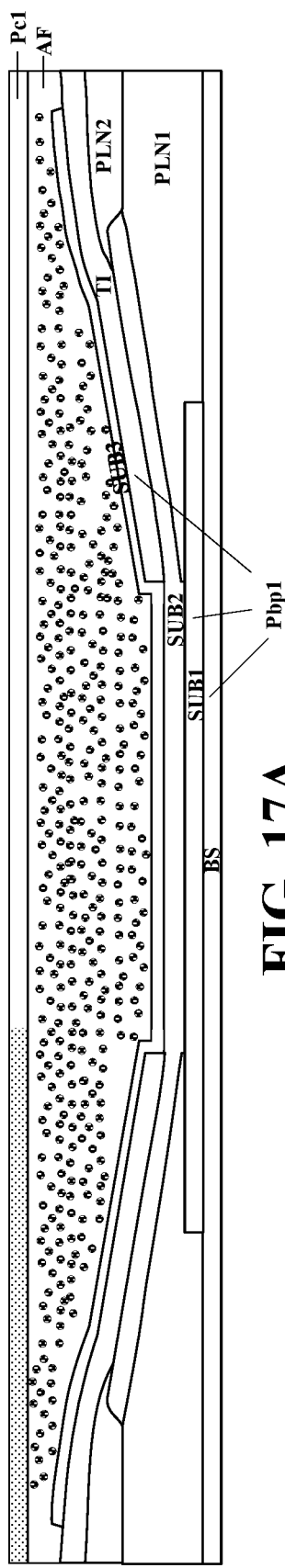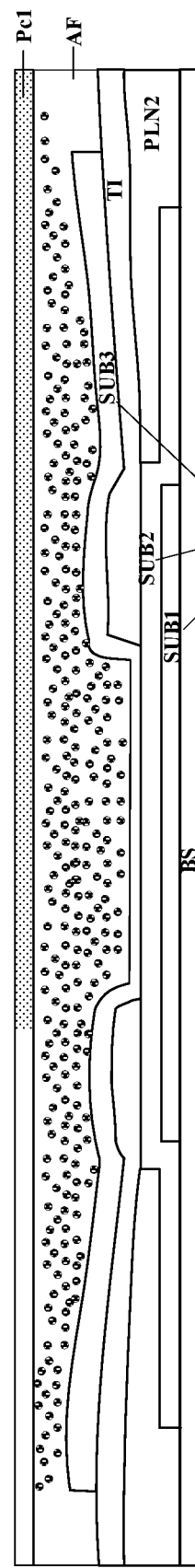
FIG. 16C
FIG. 17A
FIG. 17B

DISPLAY PANEL AND DISPLAY APPARATUS

CROSS-REFERENCE TO RELATED APPLICATION

This application is a continuation-in-part of U.S. application Ser. No. 17/428,628, filed Oct. 22, 2020, which is a national stage application under 35 U.S.C. § 371 of International Application No. PCT/CN2020/122868, filed Oct. 22, 2020. Each of the forgoing applications is herein incorporated by reference in its entirety for all purposes.

TECHNICAL FIELD

The present invention relates to display technology, more particularly, to a display panel and a display apparatus.

BACKGROUND

In a chip-on-glass type and chip-on-film type display apparatuses, a flexible printed circuit is directly mounted on an edge of a display panel of the display apparatus. In addition, the connections between the flexible printed circuit and the display apparatus may be completely hidden inside the display apparatus, and isolated from the external environment. Typically, the flexible printed circuit in the display apparatus is mounted to the display substrate using an anisotropic conductive film. In the chip-on-glass type display apparatus, an integrated circuit fabricated on a substrate of the display panel. In the chip-on-film type display apparatus, an integrated circuit is fabricated on the flexible printed circuit.

SUMMARY

In one aspect, the present disclosure provides a display panel, having a bonding region for bonding a flexible printed circuit in a peripheral region of the display panel, comprising a base substrate; a plurality of first signal lines on the base substrate; and a plurality of bonding pins on the base substrate and in the bonding region, the plurality of bonding pins comprising a plurality of first bonding pins respectively electrically connected to the plurality of first signal lines; wherein the plurality of first signal lines comprise a plurality of first signal line portions substantially parallel to each other, ends of the plurality of first signal line portions closer to the plurality of first bonding pins arranged along a first virtual line; and the plurality of first bonding pins comprise a plurality of first bonding pin portions, ends of the plurality of first bonding pin portions closer to the plurality of first signal lines arranged along a second virtual line; wherein the display panel further comprises a plurality of connecting portions respectively connecting the plurality of first signal line portions to the plurality of first bonding pin portions; the plurality of connecting portions are between the first virtual line and the second virtual line; a respective first bonding pin portion of the plurality of first bonding pin portions comprises at least two sub-layers of a first sub-layer, a second sub-layer, and a third sub-layer, stacked together; and a respective connecting portion of the plurality of connecting portions comprises at least one sub-layer of the at least two sub-layers.

Optionally, the respective first bonding pin portion comprises the first sub-layer, the second sub-layer, and the third sub-layer, stacked together.

Optionally, the respective connecting portion is in a same layer as one of the first sub-layer, the second sub-layer, and the third sub-layer.

Optionally, the respective connecting portion is in a same layer as the first sub-layer, and a respective first signal line portion of the plurality of first signal line portions is a layer different from the respective connecting portion and the first sub-layer.

Optionally, the respective connecting portion and a respective first signal line portion of the plurality of first signal line portions are in a same layer as the first sub-layer.

Optionally, the respective connecting portion is in a same layer as the second sub-layer, and a respective first signal line portion of the plurality of first signal line portions is a layer different from the respective connecting portion and the second sub-layer.

Optionally, the respective connecting portion and a respective first signal line portion of the plurality of first signal line portions are in a same layer as the second sub-layer.

Optionally, the respective connecting portion is in a same layer as the third sub-layer, and a respective first signal line portion of the plurality of first signal line portions is a layer different from the respective connecting portion and the third sub-layer.

Optionally, the respective first bonding pin portion and the respective connecting portion are substantially parallel to each other, and are arranged at a substantially same inclined angle with respect to a respective first signal line portion of the plurality of first signal line portions.

Optionally, the display panel in a region between the first virtual line and the second virtual line comprises a first pad, a second pad on the first pad, a third pad on a side of the second pad away from the first pad, and the respective connection portion on a side of the third pad away from the second pad.

Optionally, the plurality of connecting portions are respectively portions of the plurality of first signal lines; and a respective one of the plurality of first signal lines comprises a respective one of the plurality of first signal line portions and a respective one of the plurality of connecting portions.

Optionally, the plurality of connecting portions are respectively portions of the plurality of first bonding pin portions; and a respective one of the plurality of first bonding pins comprises a respective one of the plurality of first bonding pin portions and a respective one of the plurality of connecting portions.

Optionally, the plurality of bonding pins further comprise a plurality of second bonding pins other than the plurality of first bonding pins; and the ends of the plurality of first bonding pin portions and ends of the plurality of second bonding pins closer to the plurality of first signal lines are arranged along the second virtual line.

Optionally, the display panel is absent of connecting portions that are parts of or connected to the plurality of second bonding pins between the first virtual line and the second virtual line.

Optionally, the plurality of first bonding pins and the plurality of second bonding pins are clustered in a first region; the plurality of first bonding pins are clustered in a first sub-region in the first region; the plurality of second bonding pins are clustered in a second sub-region in the first region; and the first sub-region is non-overlapping with, and directly adjacent to, the second sub-region.

Optionally, the display panel further comprises a plurality of second signal lines; wherein the plurality of bonding pins further comprise a plurality of third bonding pins; the plurality of first bonding pins are clustered in a first region; the plurality of third bonding pins are clustered in a second region; the first region is spaced apart from the second region by an inter-pin region absent of any bonding pins; and the plurality of second signal lines respectively extend through the first region and the inter-pin region to respectively connect to the plurality of third bonding pins.

Optionally, the plurality of second signal lines comprise a plurality of second signal line portions in the inter-pin region and respectively connected to the plurality of third bonding pins; and a respective one of the plurality of second signal line portions and a respective one of the plurality of third bonding pins are substantially parallel to each other, and are arranged at a substantially same inclined angle with respect to a respective one of the plurality of first signal line portions.

Optionally, the plurality of second signal lines comprise a plurality of third signal line portions extending through the first region and partially into the inter-pin region; a respective one of the plurality of third signal line portions extends through a space between two directly adjacent bonding pins in the first region; and the respective one of the plurality of third signal line portions and the two directly adjacent bonding pins in the first region are substantially parallel to each other, and are arranged at a substantially same inclined angle with respect to a respective one of the plurality of first signal line portions.

Optionally, the plurality of first bonding pins are clustered in a first sub-region in the first region; the plurality of third signal line portions comprise a first group of third signal line portions in the first sub-region; a respective third signal line portion in the first group of third signal line portions extends through a space between two directly adjacent first bonding pins of the plurality of first bonding pins in the first sub-region; and the respective third signal line portion in the first group of third signal line portions and the two directly adjacent first bonding pins in the first sub-region are substantially parallel to each other, and are arranged at a substantially same inclined angle with respect to a respective one of the plurality of first signal line portions.

Optionally, the plurality of bonding pins further comprise a plurality of second bonding pins other than the plurality of first bonding pins; the ends of the plurality of first bonding pin portions and ends of the plurality of second bonding pins closer to the plurality of first signal lines are arranged along the second virtual line; the plurality of first bonding pins and the plurality of second bonding pins are clustered in the first region; the plurality of second bonding pins are clustered in a second sub-region in the first region; the plurality of third signal line portions comprise a second group of third signal line portions in the second sub-region; a respective third signal line portion in the second group of third signal line portions extends through a space between two directly adjacent second bonding pins of the plurality of second bonding pins in the second sub-region; and the respective third signal line portion in the second group of third signal line portions and the two directly adjacent second bonding pins in the second sub-region are substantially parallel to each other, and are arranged at a substantially same inclined angle with respect to a respective one of the plurality of first signal line portions.

Optionally, the plurality of second signal lines further comprise a plurality of fourth signal line portions in the inter-pin region and respectively connecting the plurality of third signal line portions and the plurality of second signal line portions; and a respective one of the plurality of fourth signal line portions is arranged at an inclined angle with respect to a respective one of the plurality of second signal line portions, and arranged at an inclined angle with respect to a respective one of the plurality of third signal line portions.

Optionally, the plurality of second signal lines further comprise a plurality of fifth signal line portions respectively connected to the plurality of third signal line portions; and the plurality of fifth signal line portions and the plurality of first signal line portions are substantially parallel to each other.

Optionally, the plurality of first bonding pins are clustered in a first sub-region in the first region; the plurality of third signal line portions comprise a first group of third signal line portions in the first sub-region; a respective third signal line portion in the first group of third signal line portions extends through a space between two directly adjacent first bonding pins of the plurality of first bonding pins in the first sub-region; the respective third signal line portion in the first group of third signal line portions and the two directly adjacent first bonding pins in the first sub-region are substantially parallel to each other, and are arranged at a substantially same inclined angle with respect to a respective one of the plurality of first signal line portions; the plurality of fifth signal line portions comprise a first group of fifth signal line portions; and signal line portions of the first group of fifth signal line portions and the plurality of first signal line portions are alternately arranged.

In another aspect, the present disclosure provides a display apparatus, comprising the display panel described herein or fabricated by a method described herein, and a flexible printed circuit bonded in a peripheral region of the display panel.

Optionally, the flexible printed circuit comprises a plurality of first circuit pins respectively electrically connected to the plurality of first bonding pins; and an orthographic projection of a respective one of the plurality of first circuit pins on the base substrate at least partially overlaps with an orthographic projections of a respective one of the plurality of first bonding pin portions on the base substrate, is non-overlapping with orthographic projections of the plurality of connecting portions on the base substrate, and is non-overlapping with orthographic projections of the plurality of first signal line portions on the base substrate.

Optionally, the respective one of the plurality of first circuit pins, the respective one of the plurality of first bonding pin portions, and the respective one of the plurality of connecting portions are substantially parallel to each other, and are arranged at a substantially same inclined angle with respect to the respective one of the plurality of first signal line portions.

Optionally, the display panel further comprises a plurality of second signal lines; the plurality of bonding pins further comprise a plurality of third bonding pins; the plurality of first bonding pins are clustered in a first region; the plurality of third bonding pins are clustered in a second region; the first region is spaced apart from the second region by an inter-pin region absent of any bonding pins; and the plurality of second signal lines respectively extend through the first region and the inter-pin region to respectively connect to the plurality of third bonding pins; wherein the flexible printed circuit comprises a plurality of second circuit pins respectively electrically connected to the plurality of third bonding pins.

Optionally, the plurality of second signal lines comprise a plurality of second signal line portions in the inter-pin region and respectively connected to the plurality of third bonding pins; and a respective one of the plurality of second circuit pins, a respective one of the plurality of second signal line portions, and a respective one of the plurality of third bonding pins are substantially parallel to each other, and are arranged at a substantially same inclined angle with respect to a respective one of the plurality of first signal line portions.

Optionally, an orthographic projection of a respective one of the plurality of second circuit pins on the base substrate at least partially overlaps with an orthographic projections of the respective one of the plurality of third bonding pins on the base substrate, and is non-overlapping with orthographic projections of the plurality of second signal line portions on the base substrate.

BRIEF DESCRIPTION OF THE FIGURES

The following drawings are merely examples for illustrative purposes according to various disclosed embodiments and are not intended to limit the scope of the present invention.

FIG. 12A is a cross-sectional view along an F-F' line in FIG. 7B.

FIG. 12B is a cross-sectional view along a G-G' line in FIG. 8B.

FIG. 16C is a cross-sectional view along a K-K' line in FIG. 16B.

FIG. 17A is a cross-sectional view along an L-L' line in FIG. 13B.

FIG. 17B is a cross-sectional view along an M-M' line in FIG. 14B.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display panel and a display apparatus that substantially obviate one or more of the problems due to limitations and disadvantages of the related art. In one aspect, the present disclosure provides a display panel having a bonding region for bonding a flexible printed circuit in a peripheral region of the display panel. In some embodiments, the display panel includes a base substrate; a plurality of first signal lines on the base substrate; a plurality of bonding pins on the base substrate and in the bonding region, the plurality of bonding pins including a plurality of first bonding pins respectively electrically connected to the plurality of first signal lines. Optionally, the plurality of first signal lines include a plurality of first signal line portions substantially parallel to each other, ends of the plurality of first signal line portions closer to the plurality of first bonding pins arranged along a first virtual line. Optionally, the plurality of first bonding pins include a plurality of first bonding pin portions, ends of the plurality of first bonding pin portions closer to the plurality of first signal lines arranged along a second virtual line. Optionally, the display panel further includes a plurality of connecting portions respectively connecting the plurality of first signal line portions to the plurality of first bonding pin portions. Optionally, the plurality of connecting portions between the first virtual line and the second virtual line. Optionally, a respective one of the plurality of first bonding pin portions and a respective one of the plurality of connecting portions are substantially parallel to each other, and are arranged at a substantially same inclined angle with respect to a respective one of the plurality of first signal line portions.

Figure 1:
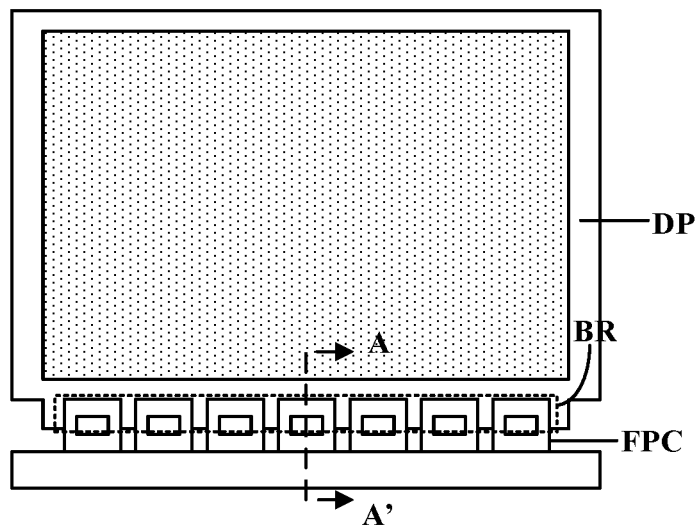
FIG. 1 is a schematic diagram of a display apparatus in some embodiments of the present disclosure.

FIG. 1 is a schematic diagram of a display apparatus in some embodiments of the present disclosure. Referring to FIG. 1, the display apparatus includes a display panel DP and a flexible printed circuit FPC connected to the display panel. The flexible printed circuit FPC is bonded to the display panel DP in a bonding region BR of the display panel DP.

Figure 2:
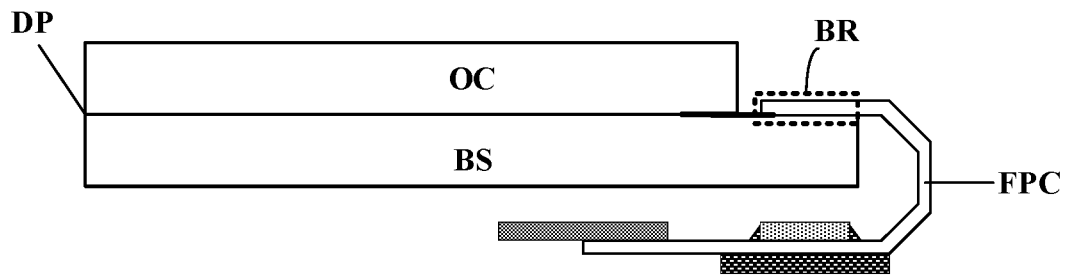
FIG. 2 is a cross-sectional view along an A-A' line in FIG. 1.

FIG. 2 is a cross-sectional view along an A-A' line in FIG. 1. Referring to FIG. 2, the display panel DP includes a base substrate BS and an overcoat layer OC on the base substrate BS. A portion of the flexible printed circuit FPC is mounted on the bonding region BR of the display panel DP. The flexible printed circuit FPC is bent around an edge of the display panel DP to a back side of the display panel DP.

Figure 3:
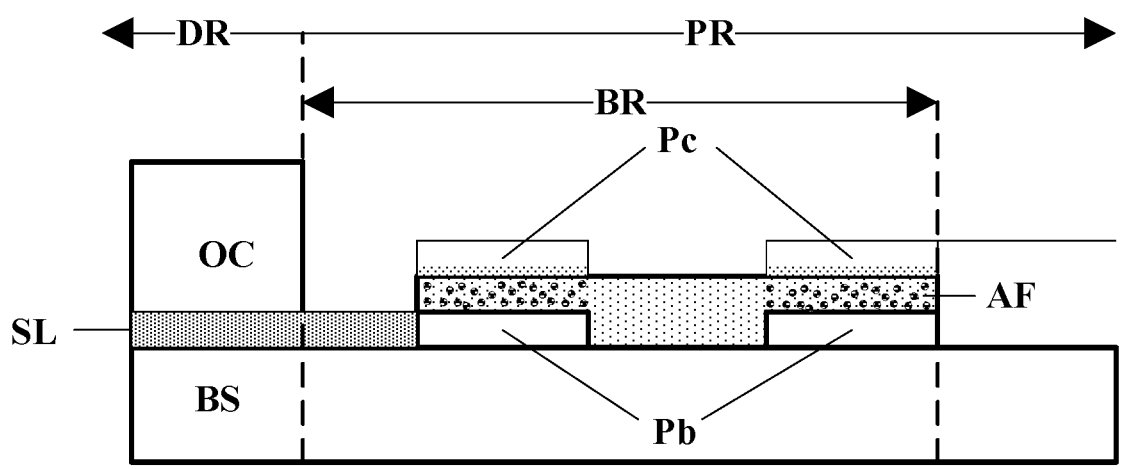
FIG. 3 is a zoom-in view of a bonding region in FIG. 2.

FIG. 3 is a zoom-in view of a bonding region in FIG. 2. Referring to FIG. 3, the display panel has a display region DR configured to display an image, and a peripheral region PR outside the display region DR. As used herein, the term "display region" refers to a region of the display panel where image is actually displayed. Optionally, the display region may include both a subpixel region and an inter-subpixel region. A subpixel region refers to a light emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels. As used herein the term "peripheral region" refers to a region where various circuits and wires are provided to transmit signals to the display panel. To increase the transparency of the display apparatus, non-transparent or opaque components of the display apparatus (e.g., battery, printed circuit board, metal frame), can be disposed in the peripheral area rather than in the display areas.

Referring to FIG. 3 again, the display panel includes a base substrate BS, a plurality of signal lines SL on the base substrate BS, and an overcoat layer OC on a side of the plurality of signal lines SL away from the base substrate BS. The overcoat layer OC covers at least respective portions of the plurality of signal lines SL in the display region DR. The display panel has a bonding region BR in the peripheral region PR. In the bonding region PR, the display panel further includes a plurality of bonding pins Pb (e.g., "gold fingers") on the base substrate BS. The plurality of bonding pins Pb are not covered by the overcoat layer OC. The flexible printed circuit includes a plurality of circuit pins Pc in the bonding region BR. The plurality of circuit pins Pc are respectively electrically connected to the plurality of bonding pins Pb through an anisotropic adhesive film AF, which includes conductive particles (e.g., gold particles) electrically connecting the bonding pin and the circuit pin. When mounting the flexible printed circuit to the display panel, the plurality of circuit pins Pc and the plurality of bonding pins Pb are respectively aligned with respect to each other, and are assembled together through the anisotropic adhesive film AF.

Figure 4:
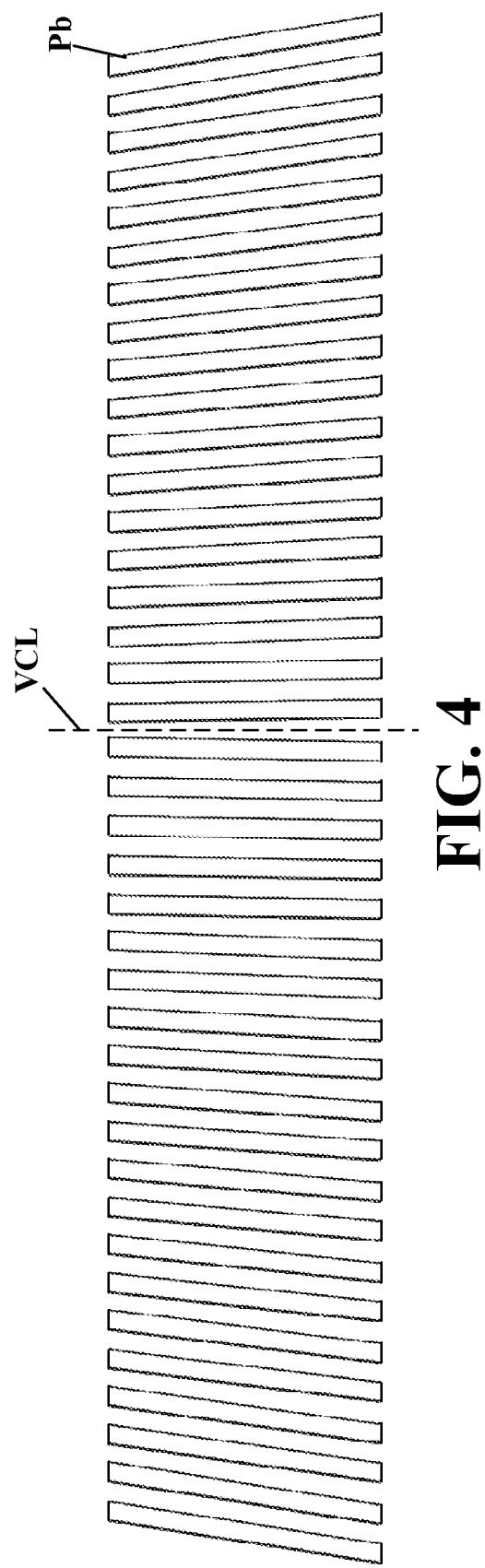
FIG. 4 is a schematic diagram of a plurality of bonding pins in a display panel in some embodiments of the present disclosure.

FIG. 4 is a schematic diagram of a plurality of bonding pins in a display panel in some embodiments of the present disclosure. Referring to FIG. 4, at least multiple ones of the plurality of bonding pins Pb on the base substrate are inclined with respect to a virtual central line VCL of the plurality of bonding pins Pb. The bonding pins closer to the virtual central line VCL have relatively smaller inclined angles with respect to a virtual central line VCL, the bonding pins further away from the virtual central line VCL have relatively greater inclined angles with respect to a virtual central line VCL. Further away the pins are from the virtual central line VCL, the greater the inclined angles become.

Figure 5:
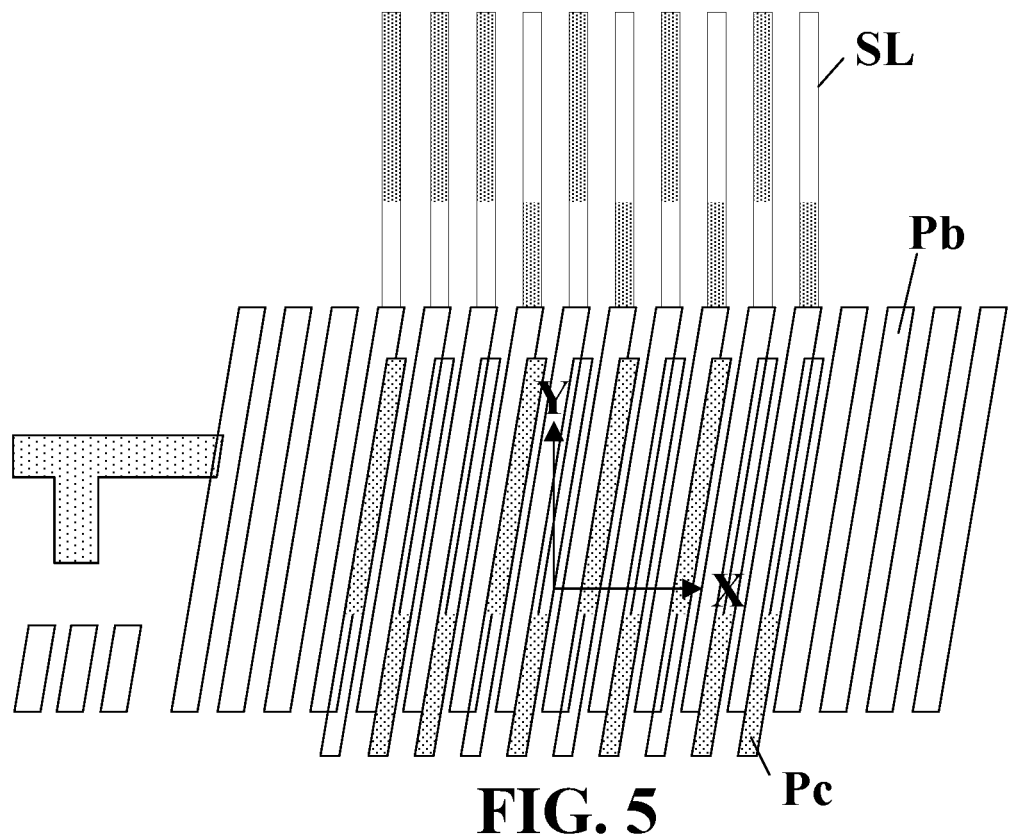
FIG. 5 and FIG. 6 illustrate a process of bonding a flexible printed circuit onto a display panel in some embodiments of the present disclosure.
Figure 6:
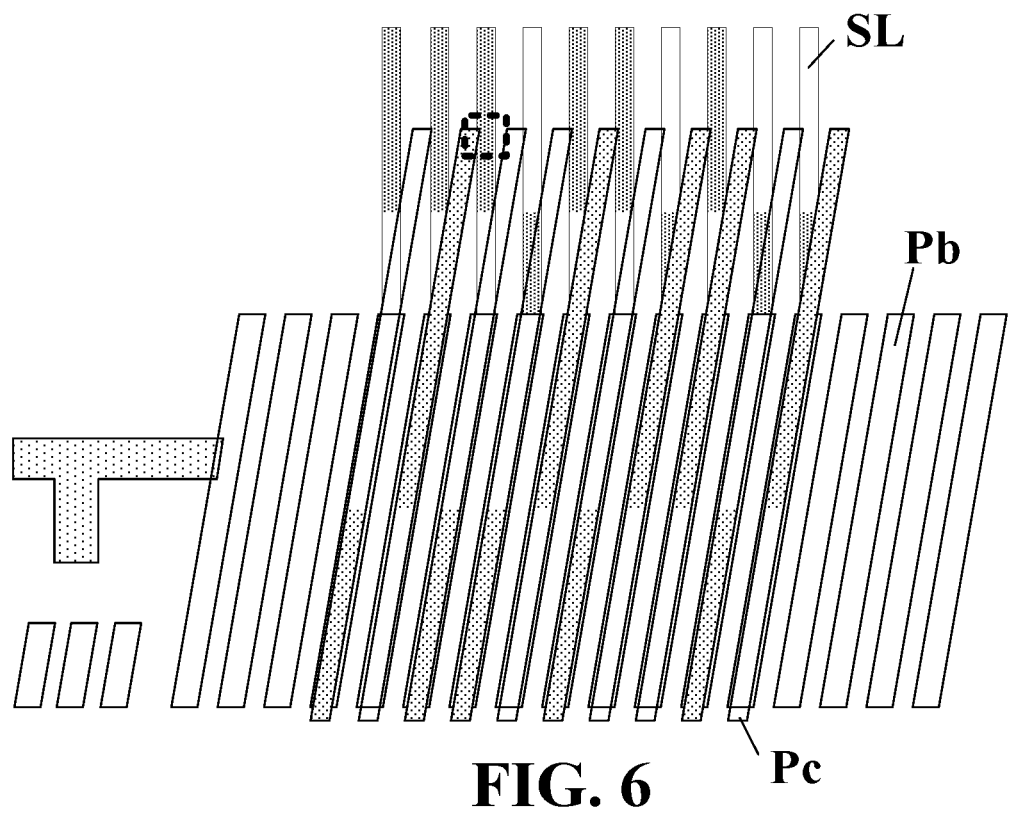

FIG. 5 and FIG. 6 illustrate a process of bonding a flexible printed circuit onto a display panel in some embodiments of the present disclosure. In the process of bonding a flexible printed circuit onto the display panel, as shown in FIG. 5, the plurality of bonding pins Pb are respectively aligned with the plurality of circuit pins Pc. Because the requirement for an alignment precision along a X-direction is higher than the requirement for an alignment precision along a Y-direction, the bonding pins are typically designed to be oblique, e.g., to the plurality of signal lines SL. In the alignment process, the plurality of circuit pins Pc are moved along the Y-direction, thereby achieving a relatively high alignment precision along the X-direction.

Because the relatively high alignment precision along the X-direction is achieved by moving the plurality of circuit pins Pc along the Y-direction, often times a short between the plurality of circuit pins Pc and the plurality of signal lines SL could occur, particularly when the movement along the Y-direction is relatively large, as shown in a short area circled by dotted lines in FIG. 6. The problem is particularly severe when an inclined angle between the bonding pin and the signal line is relatively large, for example, in a region of the plurality of bonding pins Pb further away from the virtual central line VCL in FIG. 4.

Figure 7A:
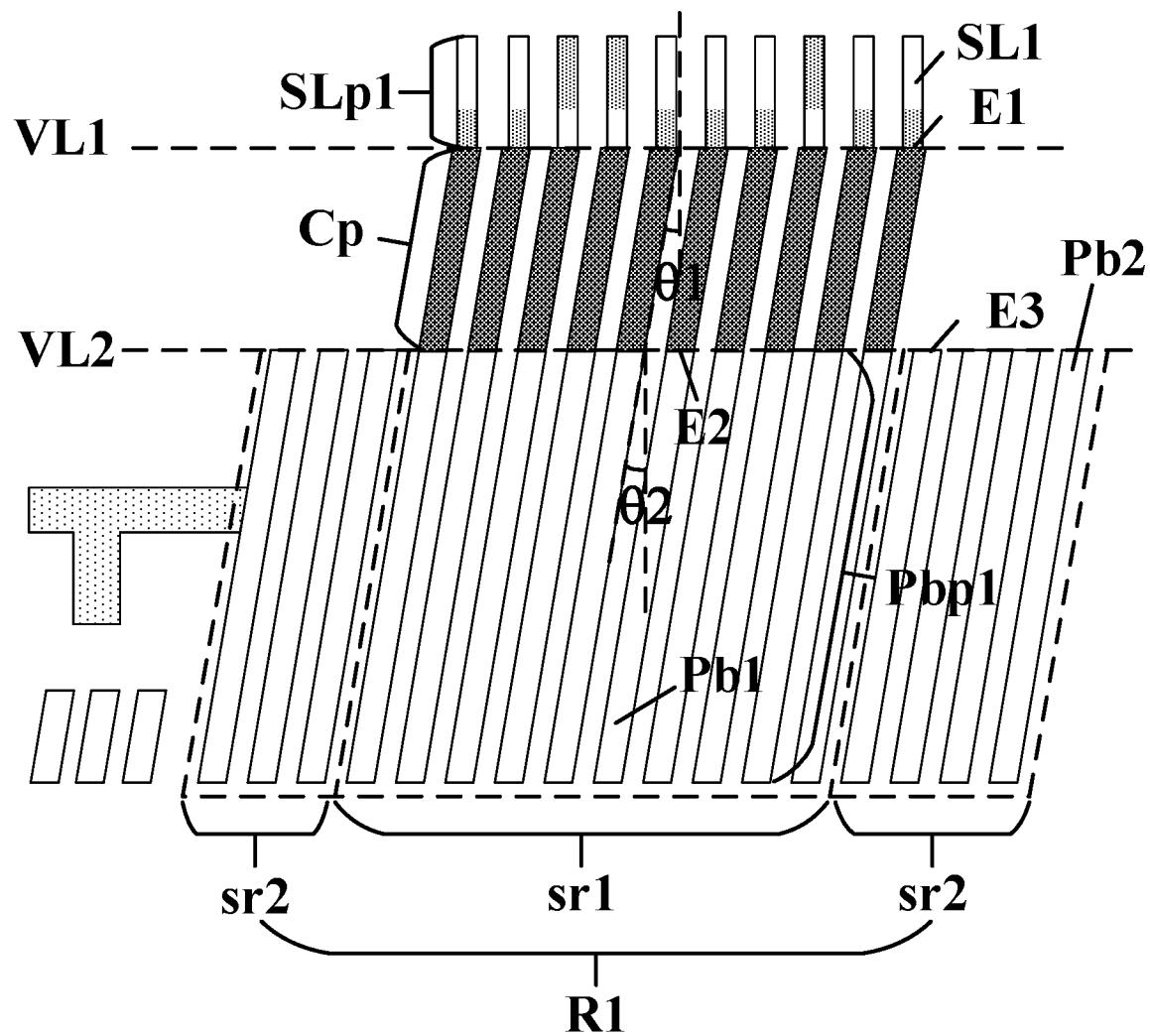
FIG. 7A is a zoom-in view of a bonding region of a display panel in some embodiments of the present disclosure.

FIG. 7A is a zoom-in view of a bonding region of a display panel in some embodiments of the present disclosure. Referring to FIG. 7A, the display panel in the bonding region includes a plurality of first signal lines SL1 on a base substrate, and a plurality of bonding pins on the base substrate and in the bonding region. The plurality of bonding pins include a plurality of first bonding pins Pb1 respectively electrically connected to the plurality of first signal lines SL1 and a plurality of second bonding pins Pb2 other than the plurality of first bonding pins Pb1. As annotated in FIG. 7A, the plurality of first signal lines SL1 include a plurality of first signal line portions SLp1 substantially parallel to each other. Ends E1 of the plurality of first signal line portions closer to the plurality of first bonding pins Pb1 arranged along a first virtual line VL1. The plurality of first bonding pins Pb1 include a plurality of first bonding pin portions Pbp1. Ends E2 of the plurality of first bonding pin portions Pbp1 and ends E3 of the plurality of second bonding pins Pb2 closer to the plurality of first signal lines SL1 arranged along a second virtual line VL2.

In some embodiments, the display panel further includes a plurality of connecting portions Cp respectively connecting the plurality of first signal line portions SLp1 to the plurality of first bonding pin portions Pbp1, for example, the plurality of connecting portions Cp respectively connecting ends E1 of the plurality of first signal line portions to the ends E2 of the plurality of first bonding pin portions Pbp1. The plurality of connecting portions Cp are disposed between the first virtual line VL1 and the second virtual line VL2. Optionally, the display panel is absent of connecting portions that are parts of or connected to the plurality of second bonding pins Pb2 between the first virtual line VL1 and the second virtual line VL2. As shown in FIG. 7A, the ends E3 of the plurality of second bonding pins Pb2 in some embodiments are not connected to any conductive elements, e.g., any signal lines. None of the plurality of second bonding pins Pb2 protrudes into a space between the first virtual line VL1 and the second virtual line VL2. Optionally, the plurality of second bonding pins Pb2 are floating.

Referring to FIG. 7A again, the plurality of first bonding pins Pb1 and the plurality of second bonding pins Pb2 are clustered in a first region R1. The plurality of first bonding pins Pb1 are clustered in a first sub-region sr1 in the first region R1. The plurality of second bonding pins Pb2 are clustered in a second sub-region sr2 in the first region R1. The first sub-region sr1 is non-overlapping with, and directly adjacent to, the second sub-region sr2.

Optionally, a respective one of the plurality of first bonding pin portions Pbp1 and a respective one of the plurality of connecting portions Cp are substantially parallel to each other. As used herein, the term "substantially parallel" means that an angle is in the range of 0 degree to approximately 45 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees.

Optionally, the respective one of the plurality of first bonding pin portions Pbp1 and the respective one of the plurality of connecting portions Cp are arranged at a substantially same inclined angle with respect to a respective one of the plurality of first signal line portions SL1. For example, the respective one of the plurality of connecting portions Cp is inclined with respect to the respective one of the plurality of first signal line portions SL1 by a first inclined angle $\theta 1$; and the respective one of the plurality of first bonding pin portions Pbp1 is inclined with respect to the respective one of the plurality of first signal line portions SL1 by a second inclined angle $\theta 2$. Optionally, the first inclined angle $\theta 1$ and the second inclined angle $\theta 2$ are substantially same. As used herein, the term "substantially same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value. Optionally, the first inclined angle $\theta 1$ is greater than zero. Optionally, the second inclined angle $\theta 2$ is greater than zero.

In some embodiment, a ratio of a combination of a length of a respective first bonding pin and a length of a respective connecting portion to a length of a respective second bonding pin is greater than 1 and equal to or less than 2, e.g., greater than 1 and equal to or less than 1.1, 1.1 to 1.2, 1.2 to 1.3, 1.3 to 1.4, 1.4 to 1.5, 1.5 to 1.6, 1.6 to 1.7, 1.7 to 1.8, 1.8 to 1.9, or 1.9 to 2.0.

Figure 7B:
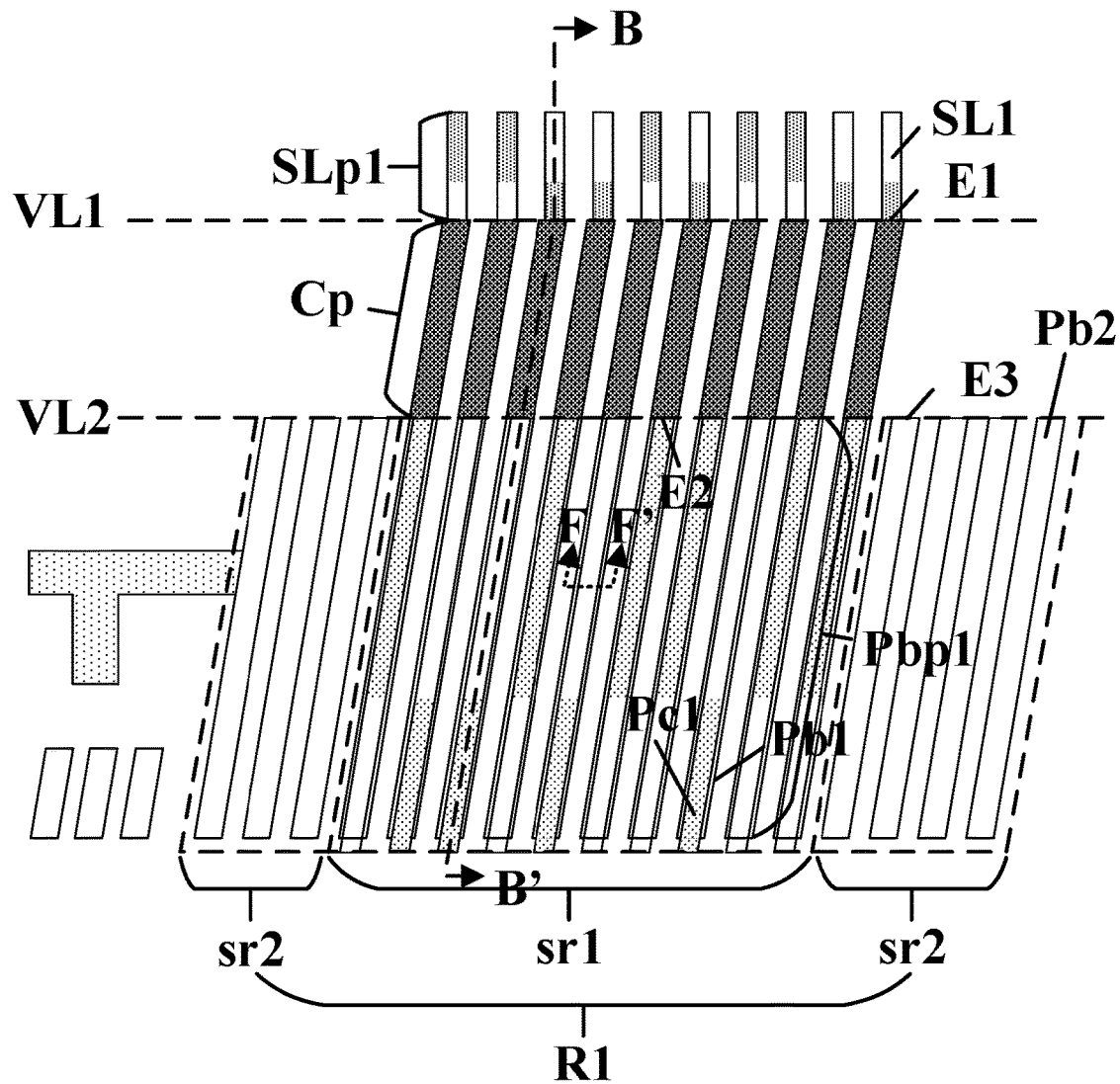
FIG. 7B is a zoom-in view of a bonding region of a display apparatus in some embodiments of the present disclosure.
Figure 7C:
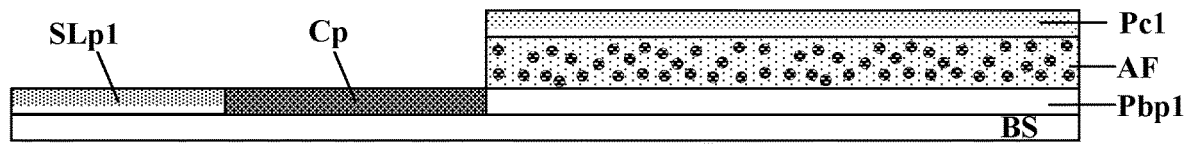
FIG. 7C is a cross-sectional view along a B-B' line in FIG. 7B.

FIG. 7B is a zoom-in view of a bonding region of a display apparatus in some embodiments of the present disclosure. Referring to FIG. 7B, the display apparatus in some embodiments includes a display panel depicted in FIG. 7C, and a flexible printed circuit bonded in a peripheral region of the display panel. In some embodiments, the flexible printed circuit includes a plurality of first circuit pins Pc1 respectively electrically connected to the plurality of first bonding pins Pb1 (e.g., through an anisotropic adhesive film). FIG. 7C is a cross-sectional view along a B-B' line in FIG. 7B. As shown in FIG. 7B and FIG. 7C, the plurality of first circuit pins Pc1 are respectively aligned with the plurality of first bonding pins Pb1 (e.g., along the Y-direction as shown in FIG. 5), the plurality of first circuit pins Pc1 are respectively electrically connected to the plurality of first bonding pins Pb1 through an anisotropic adhesive film AF. As a result of the alignment, an orthographic projection of a respective one of the plurality of first circuit pins Pc1 on the base substrate BS at least partially overlaps with an orthographic projections of a respective one of the plurality of first bonding pin portions Pbp1 on the base substrate BS, is non-overlapping with orthographic projections of the plurality of connecting portions CP on the base substrate BS, and is non-overlapping with orthographic projections of the plurality of first signal line portions SLp1 on the base substrate BS.

In some embodiments, the plurality of first bonding pins Pb1, the plurality of second bonding pins Pb2, and the plurality of first circuit pins Pc1 are clustered in a first region R1. The plurality of first bonding pins Pb1 and the plurality of first circuit pins Pc1 are clustered in a first sub-region sr1 in the first region R1. The plurality of second bonding pins Pb2 are clustered in a second sub-region sr2 in the first region R1. The first sub-region sr1 is non-overlapping with, and directly adjacent to, the second sub-region sr2.

Optionally, the respective one of the plurality of first circuit pins Pc1, the respective one of the plurality of first bonding pin portions Pbp1, and the respective one of the plurality of connecting portions Cp are substantially parallel to each other, and are arranged at a substantially same inclined angle with respect to the respective one of the plurality of first signal line portions SLp1.

In the present display panel and display apparatus, by having the plurality of connecting portions Cp, the plurality of circuit pins can be spaced apart from the plurality of signal lines such as the plurality of first signal lines SL1. Short between the circuit pin and the signal line due to alignment imprecision or thermal expansion can be eliminated.

Figure 8A:
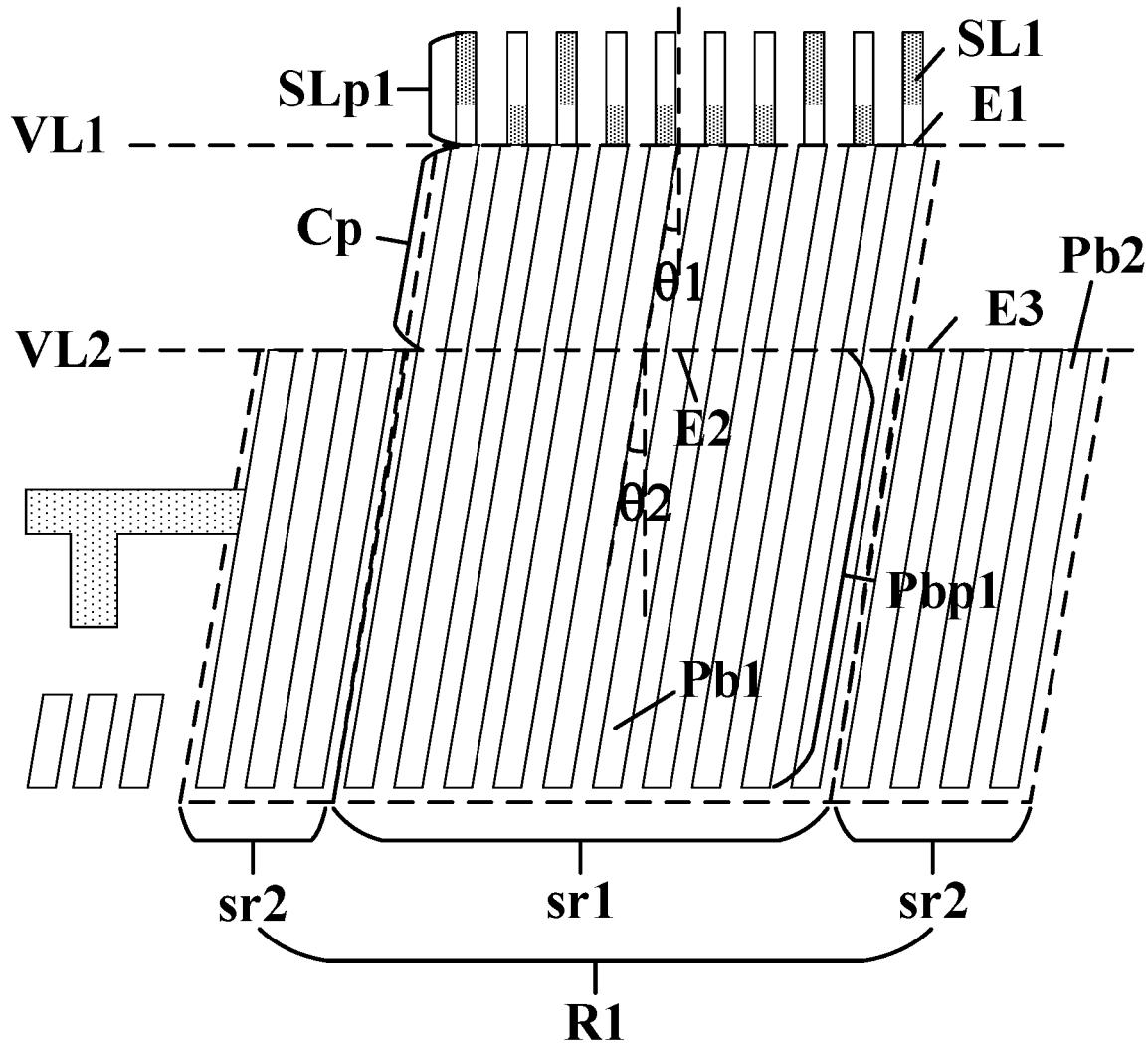
FIG. 8A is a zoom-in view of a bonding region of a display panel in some embodiments of the present disclosure.
Figure 8B:
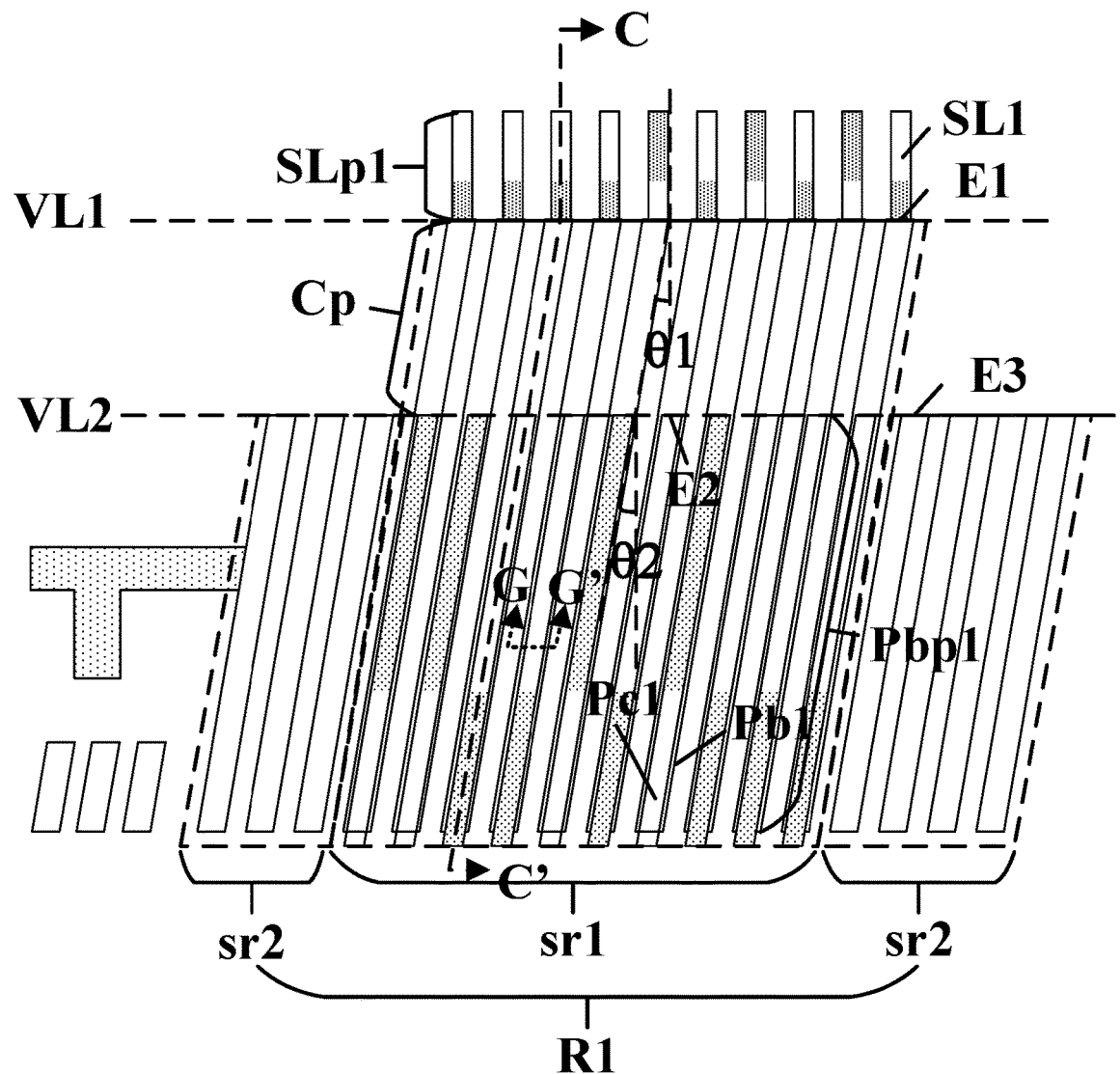
FIG. 8B is a zoom-in view of a bonding region of a display apparatus in some embodiments of the present disclosure.
Figure 8C:
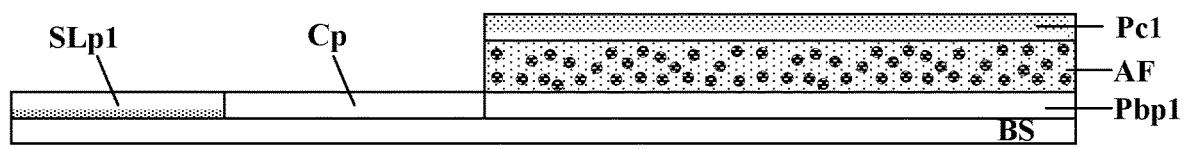
FIG. 8C is a cross-sectional view along a C-C' line in FIG. 8B.

In some embodiments, the plurality of connecting portions are respectively portions of the plurality of first bonding pin portions. FIG. 8A is a zoom-in view of a bonding region of a display panel in some embodiments of the present disclosure. FIG. 8B is a zoom-in view of a bonding region of a display apparatus in some embodiments of the present disclosure. FIG. 8C is a cross-sectional view along a C-C' line in FIG. 8B. Referring to FIG. 8A to FIG. 8C, the plurality of connecting portions Cp are respectively portions of the plurality of first bonding pin portions Pb1. A respective one of the plurality of first bonding pins Pb1 includes a respective one of the plurality of first bonding pin portions Pbp1 and a respective one of the plurality of connecting portions Cp.

Referring to FIG. 8A, the plurality of first bonding pin portions Pbp1, the plurality of connecting portions Cp, and the plurality of second bonding pins Pb2 are clustered in a first region R1. The plurality of first bonding pin portions Pbp1 and the plurality of connecting portions Cp are clustered in a first sub-region sr1 in the first region R1. The plurality of second bonding pins Pb2 are clustered in a second sub-region sr2 in the first region R1. The first sub-region sr1 is non-overlapping with, and directly adjacent to, the second sub-region sr2.

Referring to FIG. 8B, the plurality of first bonding pin portions Pbp1, the plurality of connecting portions Cp, the plurality of second bonding pins Pb2, and the plurality of first circuit pins Pc1 are clustered in a first region R1. The plurality of first bonding pin portions Pbp1, the plurality of connecting portions Cp, and the plurality of first circuit pins Pc1 are clustered in a first sub-region sr1 in the first region R1. The plurality of second bonding pins Pb2 are clustered in a second sub-region sr2 in the first region R1. The first sub-region sr1 is non-overlapping with, and directly adjacent to, the second sub-region sr2.

Figure 9A:
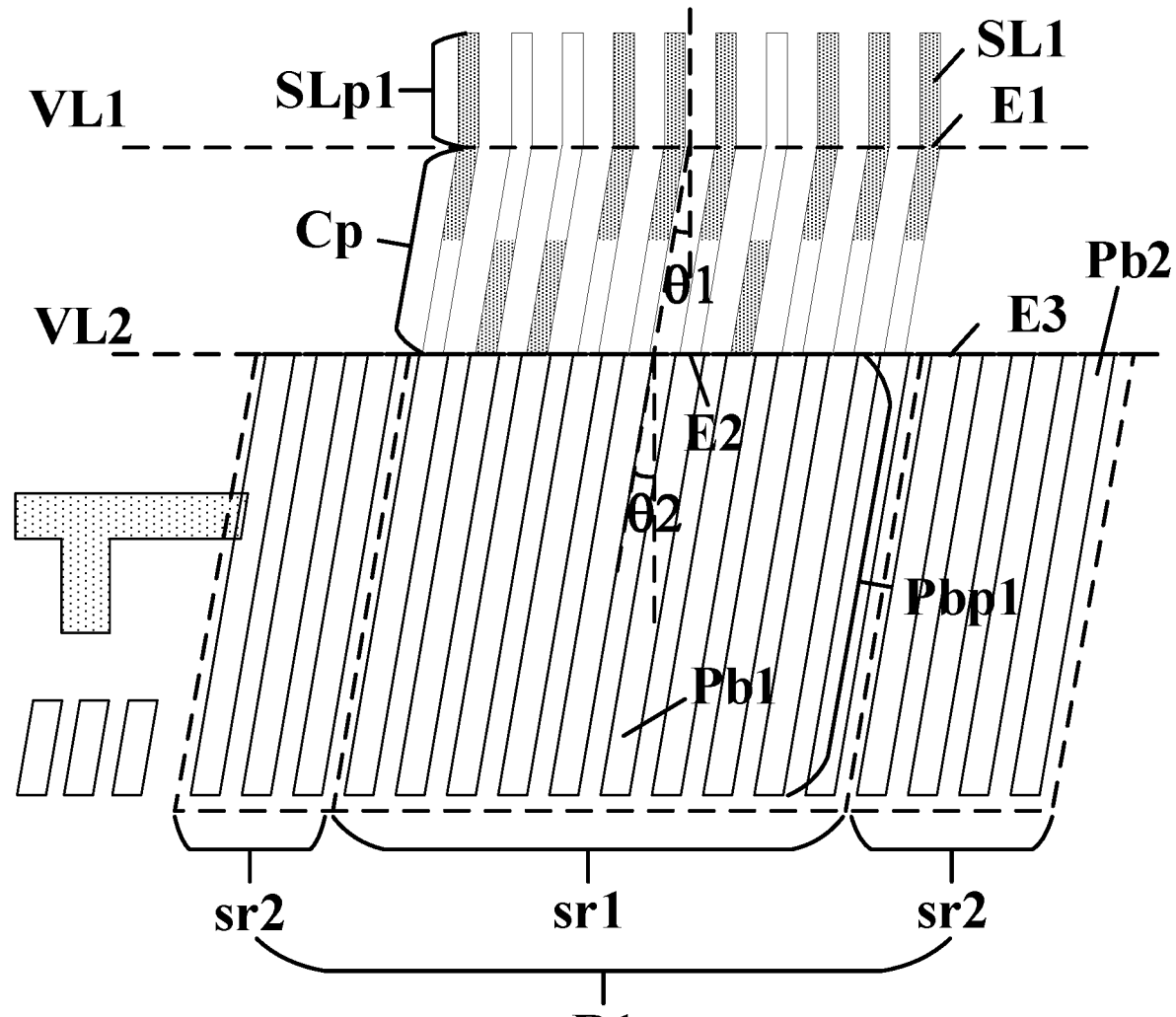
FIG. 9A is a zoom-in view of a bonding region of a display panel in some embodiments of the present disclosure.
Figure 9B:
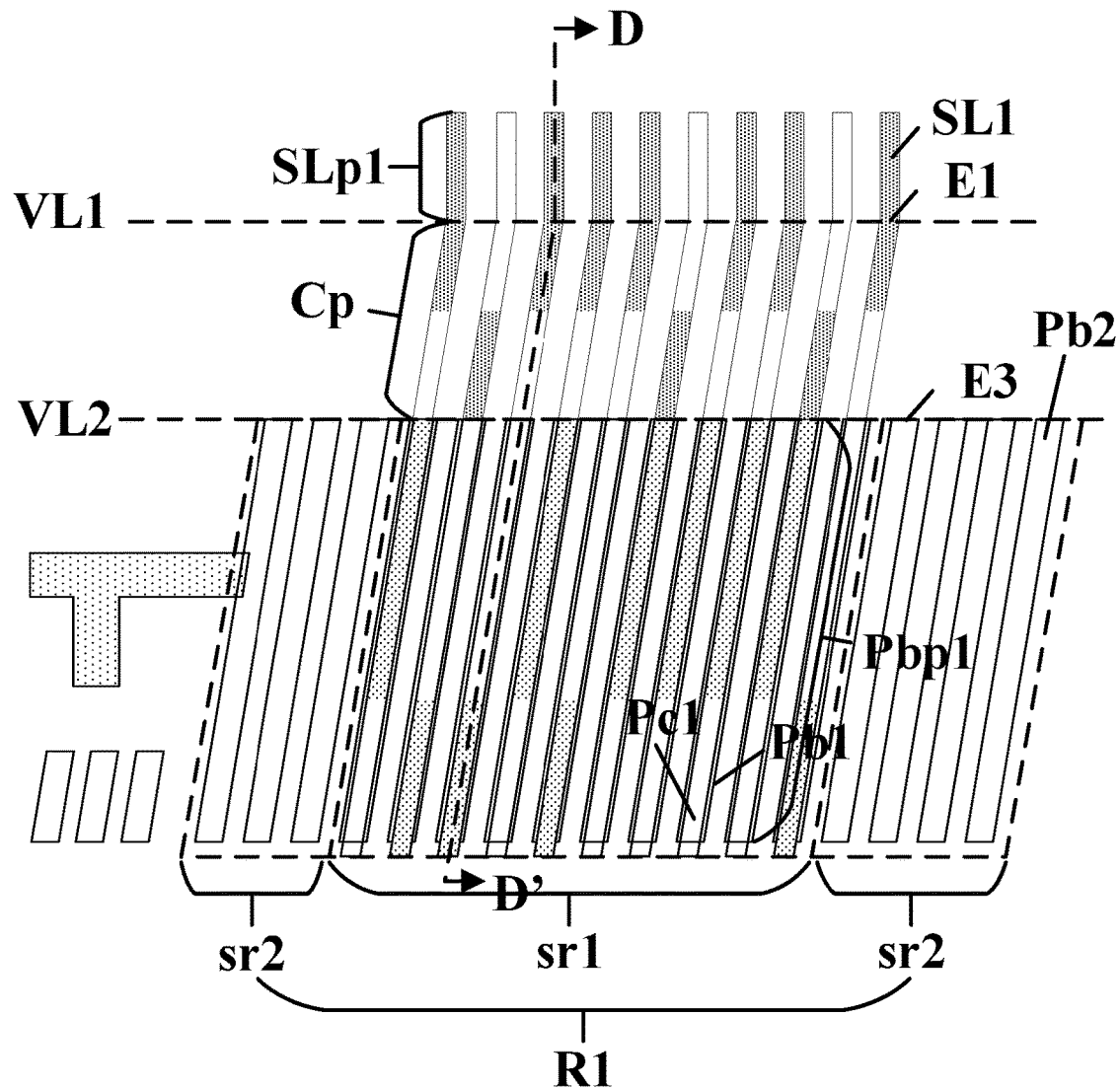
FIG. 9B is a zoom-in view of a bonding region of a display apparatus in some embodiments of the present disclosure.
Figure 9C:
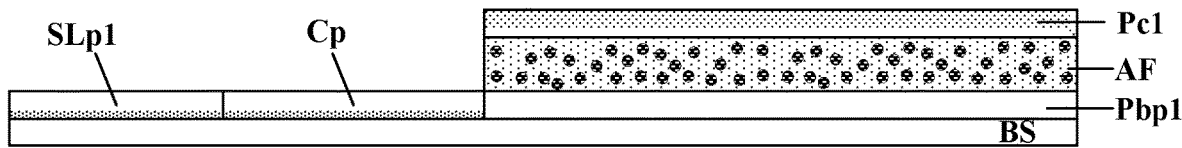
FIG. 9C is a cross-sectional view along a D-D' line in FIG. 9B.

In some embodiments, the plurality of connecting portions are respectively portions of the plurality of first signal lines. FIG. 9A is a zoom-in view of a bonding region of a display panel in some embodiments of the present disclosure. FIG. 9B is a zoom-in view of a bonding region of a display apparatus in some embodiments of the present disclosure. FIG. 9C is a cross-sectional view along a D-D' line in FIG. 9B. Referring to FIG. 9A to FIG. 9C, the plurality of connecting portions Cp are respectively portions of the plurality of first signal lines SL1. A respective one of the plurality of first signal lines SL1 includes a respective one of the plurality of first signal line portions SLp1 and a respective one of the plurality of connecting portions Cp.

Referring to FIG. 9A, the plurality of first bonding pin portions Pbp1 and the plurality of second bonding pins Pb2 are clustered in a first region R1. The plurality of first bonding pin portions Pbp1 are clustered in a first sub-region sr1 in the first region R1. The plurality of second bonding pins Pb2 are clustered in a second sub-region sr2 in the first region R1. The first sub-region sr1 is non-overlapping with, and directly adjacent to, the second sub-region sr2. The plurality of connecting portions Cp are outside the first region R1.

Referring to FIG. 9B, the plurality of first bonding pin portions Pbp1, the plurality of second bonding pins Pb2, and the plurality of first circuit pins Pc1 are clustered in a first region R1. The plurality of first bonding pin portions Pbp1 and the plurality of first circuit pins Pc1 are clustered in a first sub-region sr1 in the first region R1. The plurality of second bonding pins Pb2 are clustered in a second sub-region sr2 in the first region R1. The first sub-region sr1 is non-overlapping with, and directly adjacent to, the second sub-region sr2. The plurality of connecting portions Cp are outside the first region R1.

Figure 10A:
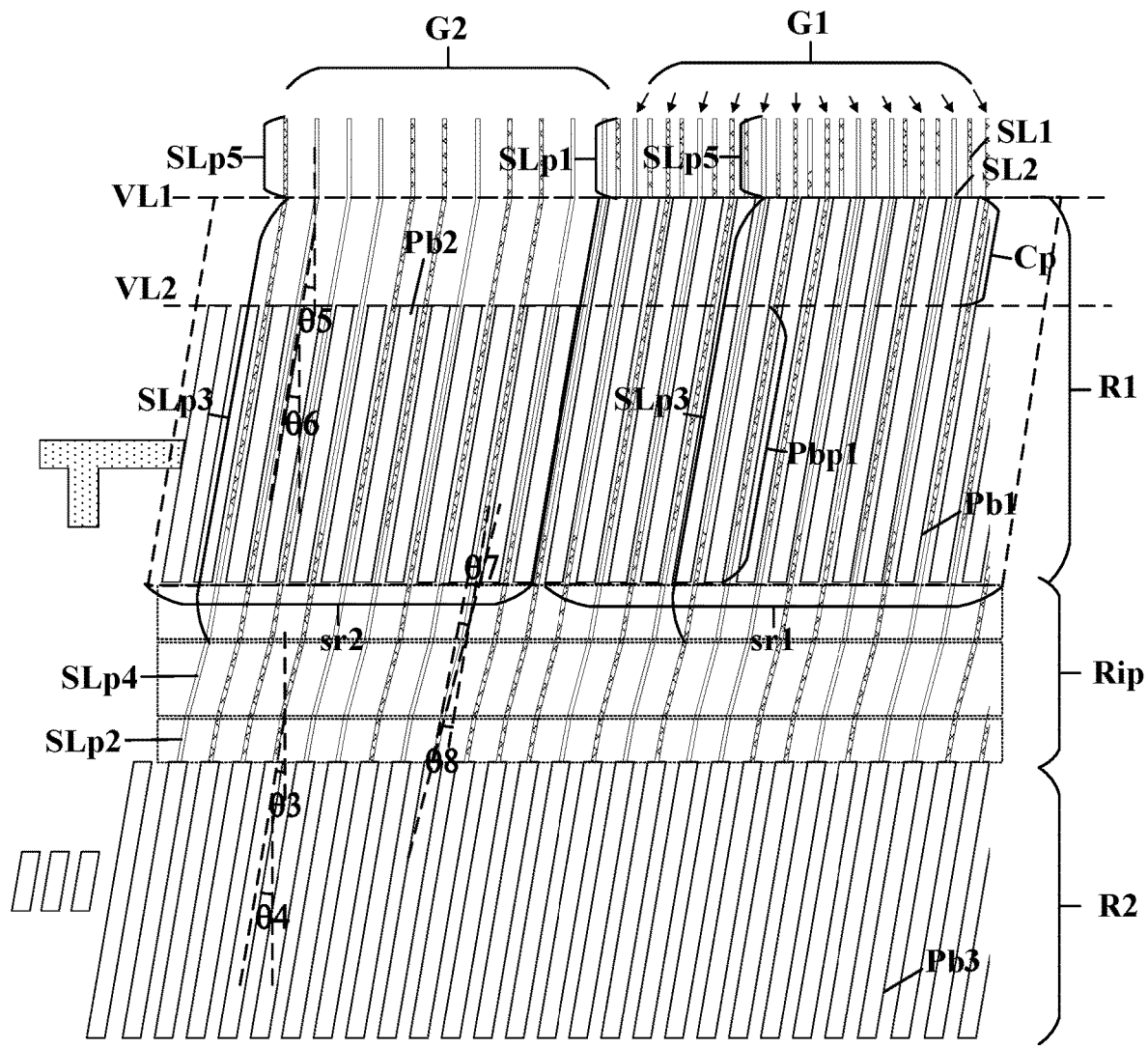
FIG. 10A is a zoom-in view of a bonding region of a display panel in some embodiments of the present disclosure.

FIG. 10A is a zoom-in view of a bonding region of a display panel in some embodiments of the present disclosure. Referring to FIG. 10A, in some embodiments, the display panel further includes a plurality of second signal lines SL2. The plurality of bonding pins further include a plurality of third bonding pins Pb3. The plurality of first bonding pins Pb1 and the plurality of second bonding pins Pb2 are clustered in a first region R1. The plurality of third bonding pins Pb3 are clustered in a second region R2. The first region R1 is spaced apart from the second region R2 by an inter-pin region Rip absent of any bonding pins. Optionally, the plurality of second signal lines SL2 respectively extend through the first region R1 and the inter-pin region Rip to respectively connect to the plurality of third bonding pins Pb3. Optionally, the plurality of first signal lines SL1 do not extend into any of the first region R1, the second region R2, or the inter-pin region Rip.

The plurality of bonding pins include a plurality of first bonding pins Pb1 respectively electrically connected to the plurality of first signal lines SL1 and a plurality of second bonding pins Pb2 other than the plurality of first bonding pins Pb1. The plurality of first signal lines SL1 include a plurality of first signal line portions SLp1 substantially parallel to each other. Ends of the plurality of first signal line portions closer to the plurality of first bonding pins Pb1 arranged along a first virtual line VL1. The plurality of first bonding pins Pb1 include a plurality of first bonding pin portions Pbp1. Ends of the plurality of first bonding pin portions Pbp1 and ends of the plurality of second bonding pins Pb2 closer to the plurality of first signal lines SL1 arranged along a second virtual line VL2.

In some embodiments, the display panel further includes a plurality of connecting portions Cp respectively connecting the plurality of first signal line portions SLp1 to the plurality of first bonding pin portions Pbp1, for example, the plurality of connecting portions Cp respectively connecting ends of the plurality of first signal line portions to the ends of the plurality of first bonding pin portions Pbp1. The plurality of connecting portions Cp are respectively portions of the plurality of first bonding pin portions Pb1. A respective one of the plurality of first bonding pins Pb1 includes a respective one of the plurality of first bonding pin portions Pbp1 and a respective one of the plurality of connecting portions Cp.

The plurality of connecting portions Cp are disposed between the first virtual line VL1 and the second virtual line VL2. Optionally, the display panel is absent of connecting portions that are parts of or connected to the plurality of second bonding pins Pb2 between the first virtual line VL1 and the second virtual line VL2. The ends of the plurality of second bonding pins Pb2 in some embodiments are not connected to any conductive elements, e.g., any signal lines. None of the plurality of second bonding pins Pb2 protrudes into a space between the first virtual line VL1 and the second virtual line VL2. Optionally, the plurality of second bonding pins Pb2 are floating. Optionally, a respective one of the plurality of first bonding pin portions Pbp1 and a respective one of the plurality of connecting portions Cp are substantially parallel to each other. Optionally, the respective one of the plurality of first bonding pin portions Pbp1 and the respective one of the plurality of connecting portions Cp are arranged at a substantially same inclined angle with respect to a respective one of the plurality of first signal line portions SL1.

In some embodiments, the plurality of second signal lines SL2 include a plurality of second signal line portions SLp2 in the inter-pin region Rip and respectively connected to the plurality of third bonding pins Pb3. A respective one of the plurality of second signal line portions SLp2 and a respective one of the plurality of third bonding pins Pb3 are substantially parallel to each other, and are arranged at a substantially same inclined angle with respect to a respective one of the plurality of first signal line portions SLp1. For example, the respective one of the plurality of second signal line portions SLp2 is inclined with respect to the respective one of the plurality of first signal line portions SLp1 by a third inclined angle θ3; and the respective one of the plurality of third bonding pins Pb3 is inclined with respect to the respective one of the plurality of first signal line portions SLp1 by a fourth inclined angle θ4. Optionally, the third inclined angle θ3 and the fourth inclined angle θ4 are substantially same. Optionally, the third inclined angle θ3 and the fourth inclined angle θ4 are substantially same as the first inclined angle θ1 and the second inclined angle θ2. Optionally, the third inclined angle θ3 and the fourth inclined angle θ4 are different from the first inclined angle θ1 and the second inclined angle θ2. Optionally, the third inclined angle θ3 is greater than zero. Optionally, the fourth inclined angle θ4 is greater than zero. Optionally, the first inclined angle θ1 is greater than zero. Optionally, the second inclined angle θ2 is greater than zero.

In some embodiments, the plurality of second signal lines SL2 further include a plurality of third signal line portions SLp3 extending through the first region R1 and partially into the inter-pin region Rip. A respective one of the plurality of third signal line portions Slp3 extends through a space between two directly adjacent bonding pins in the first region R1. For example, a first one of the plurality of third signal line portions Slp3 extends through a space between two directly adjacent second bonding pins of the plurality of second bonding pins Pb2 in the first region R1. A second one of the plurality of third signal line portions Slp3 extends through a space between two directly adjacent first bonding pins of the plurality of first bonding pins Pb1 in the first region R1.

In some embodiments, the respective one of the plurality of third signal line portions Slp3 and the two directly adjacent bonding pins in the first region R1 are substantially parallel to each other, and are arranged at a substantially same inclined angle with respect to a respective one of the plurality of first signal line portions SLp1. For example, the respective one of the plurality of third signal line portions Slp3 is inclined with respect to the respective one of the plurality of first signal line portions SLp1 by a fifth inclined angle θ5; and the two directly adjacent bonding pins in the first region R1 are inclined with respect to the respective one of the plurality of first signal line portions SLp1 by a sixth inclined angle θ6. Optionally, the fifth inclined angle θ5 and the sixth inclined angle θ6 are substantially same. Optionally, the fifth inclined angle θ5 and the sixth inclined angle θ6 are substantially same as the first inclined angle θ1 and the second inclined angle θ2. Optionally, the fifth inclined angle θ5 and the sixth inclined angle θ6 are different from the first inclined angle θ1 and the second inclined angle θ2. Optionally, the fifth inclined angle θ5 and the sixth inclined angle θ6 are substantially same as the third inclined angle θ3 and the fourth inclined angle θ4. Optionally, the fifth inclined angle θ5 and the sixth inclined angle θ6 are different from the third inclined angle θ3 and the fourth inclined angle θ4. Optionally, the fifth inclined angle θ5 is greater than zero. Optionally, the sixth inclined angle θ6 is greater than zero. Optionally, the third inclined angle θ3 is greater than zero. Optionally, the fourth inclined angle θ4 is greater than zero. Optionally, the first inclined angle θ1 is greater than zero. Optionally, the second inclined angle θ2 is greater than zero.

In some embodiments, the plurality of first bonding pins Pb1 are clustered in a first sub-region sr1 in the first region R1; and the plurality of second bonding pins Pb2 are clustered in a second sub-region sr2 in the first region R1. Optionally, the plurality of first bonding pins Pb1 are limited in the first sub-region sr1, and the plurality of second bonding pins Pb2 are limited in the second sub-region sr2.

In some embodiments, the plurality of third signal line portions SLp3 include a first group G1 of third signal line portions in the first sub-region sr1. A respective third signal line portion in the first group G1 of third signal line portions extends through a space between two directly adjacent first bonding pins of the plurality of first bonding pins Pb1 in the first sub-region sr1. Optionally, the respective third signal line portion in the first group G1 of third signal line portions and the two directly adjacent first bonding pins in the first sub-region sr1 are substantially parallel to each other.

Optionally, the respective third signal line portion in the first group G1 of third signal line portions and the two directly adjacent first bonding pins in the first sub-region sr1 are arranged at a substantially same inclined angle with respect to a respective one of the plurality of first signal line portions SLp1.

In some embodiments, the plurality of third signal line portions SLp3 include a second group G2 of third signal line portions in the second sub-region sr2. A respective third signal line portion in the second group G2 of third signal line portions extends through a space between two directly adjacent second bonding pins of the plurality of second bonding pins Pb2 in the second sub-region sr2. Optionally, the respective third signal line portion in the second group G2 of third signal line portions and the two directly adjacent second bonding pins in the second sub-region sr2 are substantially parallel to each other. Optionally, the respective third signal line portion in the second group G2 of third signal line portions and the two directly adjacent second bonding pins in the second sub-region sr2 are arranged at a substantially same inclined angle with respect to a respective one of the plurality of first signal line portions SLp1.

In some embodiments, the plurality of second signal lines SL2 further include a plurality of fourth signal line portions SLp4 in the inter-pin region Rip and respectively connecting the plurality of third signal line portions SLp3 and the plurality of second signal line portions SLp2. A respective one of the plurality of fourth signal line portions SLp4 is arranged at an inclined angle with respect to a respective one of the plurality of second signal line portions SLp2, and arranged at an inclined angle with respect to a respective one of the plurality of third signal line portions SLp3. For example, the respective one of the plurality of fourth signal line portions SLp4 is inclined with respect to the respective one of the plurality of third signal line portions SLp3 by a seventh inclined angle θ7; and the respective one of the plurality of fourth signal line portions SLp4 is inclined with respect to the respective one of the plurality of second signal line portions SLp2 by an eighth inclined angle θ8. Optionally, the seventh inclined angle θ7 is greater than zero. Optionally, the eighth inclined angle θ8 is greater than zero.

In some embodiments, the plurality of second signal lines SL2 further include a plurality of fifth signal line portions SLp5 respectively connected to the plurality of third signal line portions SLp3. Optionally, the plurality of fifth signal line portions SLp5 and the plurality of first signal line portions SLp1 are substantially parallel to each other.

In some embodiments, the plurality of first bonding pins Pb1 are clustered in a first sub-region sr1 in the first region R1. The plurality of third signal line portions SLp3 include a first group G1 of third signal line portions in the first sub-region sr1. A respective third signal line portion in the first group G1 of third signal line portions extends through a space between two directly adjacent first bonding pins of the plurality of first bonding pins Pb1 in the first sub-region sr1. The respective third signal line portion in the first group G1 of third signal line portions and the two directly adjacent first bonding pins in the first sub-region sr1 are substantially parallel to each other, and are arranged at a substantially same inclined angle with respect to a respective one of the plurality of first signal line portions Slp1. The plurality of fifth signal line portions include a first group G1 of fifth signal line portions. Optionally, signal line portions of the first group G1 of fifth signal line portions and the plurality of first signal line portions Slp1 are alternately arranged.

Figure 10B:
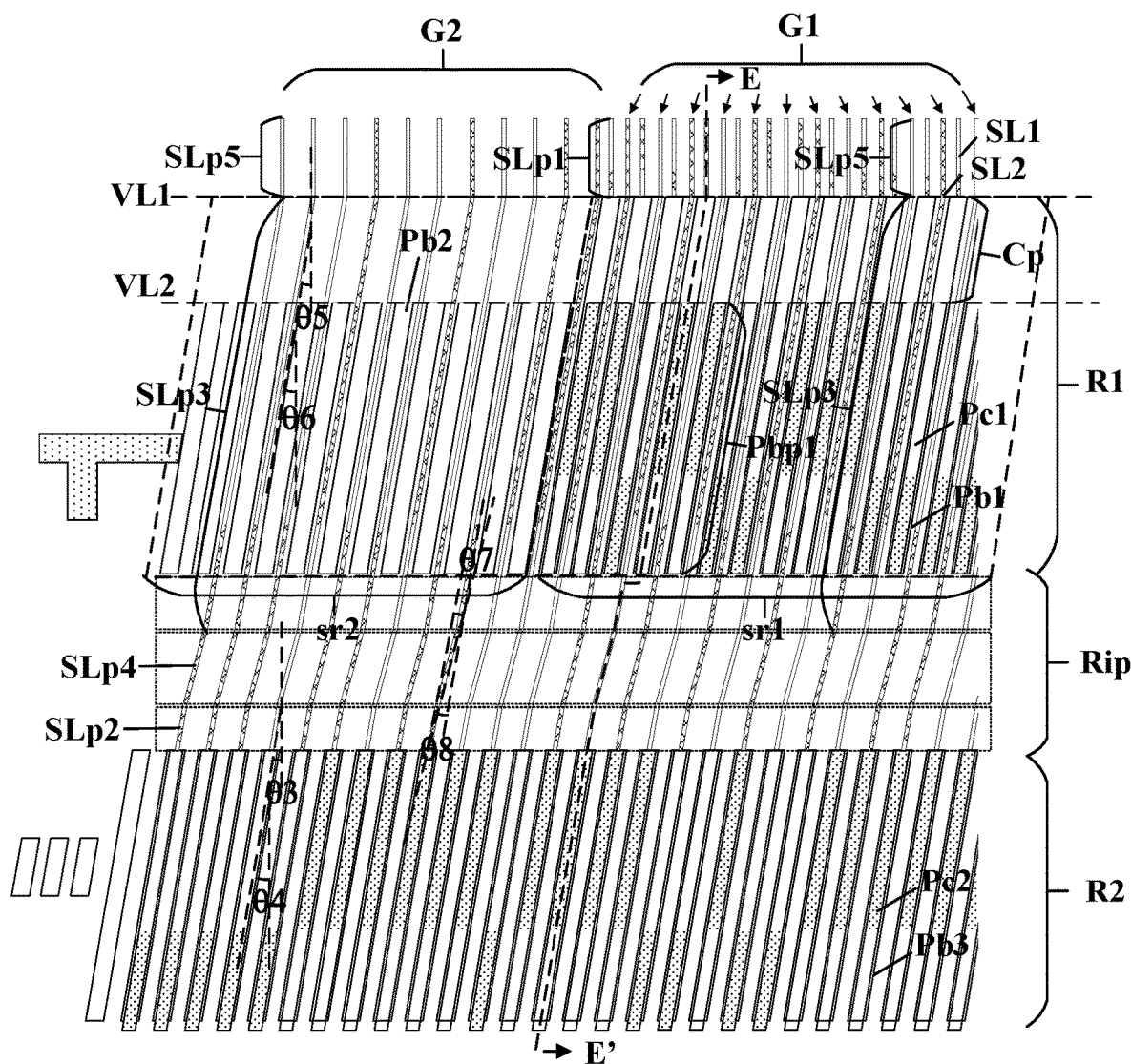
FIG. 10B is a zoom-in view of a bonding region of a display apparatus in some embodiments of the present disclosure.

FIG. 10B is a zoom-in view of a bonding region of a display apparatus in some embodiments of the present disclosure. Referring to FIG. 10B, in some embodiments, the flexible printed circuit comprises a plurality of first circuit pins Pc1 respectively electrically connected to the plurality of first bonding pins Pb1, and a plurality of second circuit pins Pc2 respectively electrically connected to the plurality of third bonding pins Pb3. Optionally, a respective one of the plurality of second circuit pins Pc2, a respective one of the plurality of second signal line portions SLp2, and a respective one of the plurality of third bonding pins Pb3 are substantially parallel to each other, and are arranged at a substantially same inclined angle with respect to a respective one of the plurality of first signal line portions SLp1.

Figure 10C:
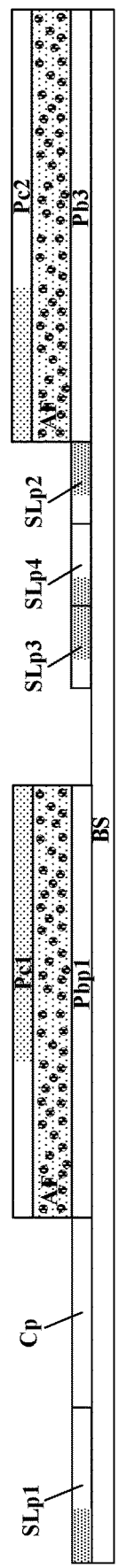
FIG. 10C is a cross-sectional view along an E-E' line in FIG. 10B.

FIG. 10C is a cross-sectional view along an E-E' line in FIG. 10B. Referring to FIG. 10A to FIG. 10C, in some embodiments, an orthographic projection of a respective one of the plurality of second circuit pins Pc2 on the base substrate BS at least partially overlaps with an orthographic projections of the respective one of the plurality of third bonding pins Pb3 on the base substrate BS, and is non-overlapping with orthographic projections of the plurality of second signal line portions SLp2 on the base substrate BS.

In the present display panel and display apparatus, by having the plurality of connecting portions Cp, the plurality of circuit pins can be spaced apart from the plurality of signal lines such as the plurality of first signal lines SL1. Short between the circuit pin and the signal line due to alignment imprecision or thermal expansion can be eliminated. Further, in the present display panel and display apparatus, the bonding pins and circuit pins are arranged in a first region R1 and a second region R2 spaced apart by an inter-pin region Rip. Moreover, the signal lines proximal to the bonding pins are arranged to have a substantially same inclined angle as the bonding pins. A complicated, multi-array bonding structure can be formed to allow precise bonding of the flexible printed circuit onto the display panel.

Figure 11:
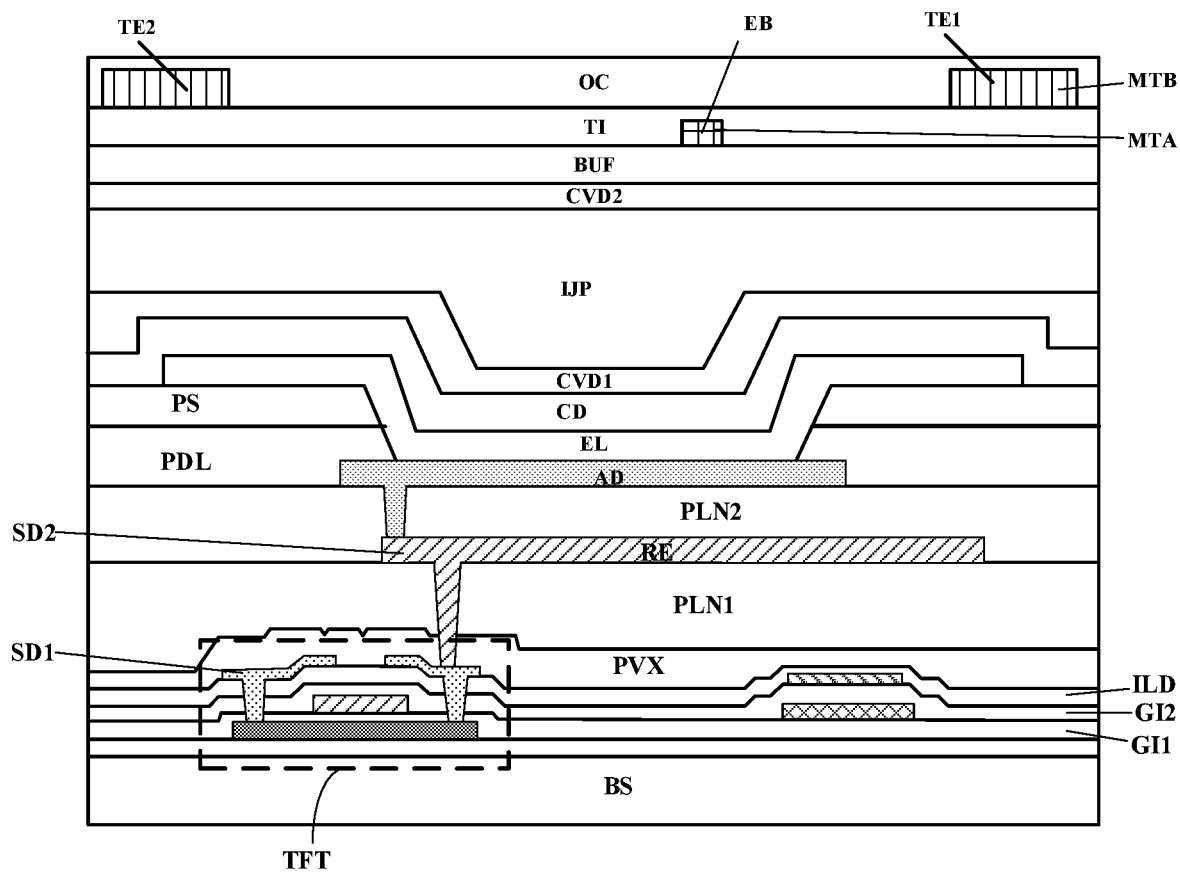
FIG. 11 is a cross sectional view of a display panel in some embodiments according to the present disclosure.

FIG. 11 is a cross sectional view of a display panel in some embodiments according to the present disclosure. Referring to FIG. 11, in a display region of the display panel, the display panel includes a base substrate BS, a plurality of thin film transistors TFT on the base substrate BS, a passivation layer PVX on a side of the plurality of thin film transistors TFT away from the base substrate BS, a first planarization layer PLN1 on side of the passivation layer PVX away from the base substrate BS, a relay electrode RE on side of the first planarization layer PLN1 away from the passivation layer PVX, a second planarization layer PLN2 on a side of the relay electrode RE away from the first planarization layer PLN1, a pixel definition layer PDL on a side of the second planarization layer PLN2 away from the first planarization layer PLN1 and defining subpixel apertures, an anode AD on a side of the second planarization layer PLN2 away from the first planarization layer PLN1, a light emitting layer EL on a side of the anode AD away from the second planarization layer PLN2, a cathode CD on a side of the light emitting layer EL away from the anode AD, a first inorganic encapsulating layer CVD1 on a side of the cathode CD away from light emitting layer EL, an organic encapsulating layer IJP on a side of the first inorganic encapsulating layer CVD1 away from the cathode CD, a second inorganic encapsulating layer CVD2 on a side of the organic encapsulating layer IJP away from the first inorganic encapsulating layer CVD1, a buffer layer BUF on a side of the second inorganic encapsulating layer CVD2 away from the organic encapsulating layer IJP, a first touch metal layer MTA (e.g., touch electrode bridges EB as shown in FIG. 11) on a side of the buffer layer BUF away from the second inorganic encapsulating layer CVD2, a touch insulating layer TI on a side of the buffer layer BUF away from the second inorganic encapsulating layer CVD2, a second touch metal layer MTB (e.g., the plurality of first touch mesh electrodes TE1 and the plurality of second touch mesh electrodes TE2 as shown in FIG. 11) on a side of the touch insulating layer TI away from the buffer layer BUF, and an overcoat layer OC on a side of the touch electrodes away from the touch insulating layer TI.

In some embodiments, in the display region of the display panel, the display panel further includes a first gate insulating layer GI1 on the base substrate BS, a second gate insulating layer GI2 on a side of the first gate insulating layer GI1 away from the base substrate BS, and an inter-layer dielectric layer ILD on a side of the second gate insulating layer GI2 away from the first gate insulating layer GI1. Optionally, a gate electrode of a respective one of the plurality of thin film transistors TFT is on a side of the first gate insulating layer GI1 away from the base substrate BS. The display panel further includes a first signal line layer SD1 on a side of the inter-layer dielectric layer ILD away from the second gate insulating layer GI2, and a second signal line layer SD2 on a side of the first planarization layer PLN1 away from the passivation layer PVX. Optionally, the first signal line layer SD1 includes a source electrode and a drain electrode of the respective one of the plurality of thin film transistors TFT. Optionally, the second signal line layer SD2 includes the relay electrode RE.

FIG. 12A is a cross-sectional view along an F-F' line in FIG. 7B. Referring to FIG. 12A, in some embodiments, a respective one of the plurality of first bonding pin portions Pbp1 has a multi-sub-layer structure. Optionally, the multi-sub-layer structure is a three-sub-layer structure. Optionally, the three-sub-layer structure includes a first sub-layer SUB1, a second sub-layer SUB2, and a third sub-layer SUBS, stacked together. Referring to FIG. 11 and FIG. 12A, in some embodiments, the first sub-layer SUB1 is part of the first signal line layer SD1, for example, the first sub-layer SUB1 is in a same layer as (and optionally made of a same material as) the source electrode and drain electrode of a respective one of the plurality of thin film transistors. Optionally, the second sub-layer SUB2 is part of the second signal line layer SD2, for example, the second sub-layer SUB2 is in a same layer as (and optionally made of a same material as) the relay electrode RE. Optionally, the third sub-layer SUB3 is part of the second touch metal layer MTB, for example, the third sub-layer SUB3 is in a same layer as (and optionally made of a same material as) the plurality of first touch mesh electrodes TE1 and the plurality of second touch mesh electrodes TE2.

In alternative embodiments, the multi-sub-layer structure is a two-sub-layer structure. Optionally, the two-sub-layer structure includes a first sub-layer SUB1 and a second sub-layer SUB2 stacked together. Optionally, the two-sub-layer structure includes a first sub-layer SUB1 and a third sub-layer SUB3 stacked together. Optionally, the two-sub-layer structure includes a second sub-layer SUB2 and a third sub-layer SUB3 stacked together.

In some embodiments, at least one of the first planarization layer PLN1, the second planarization layer PLN2, and the touch insulating layer TI extends into the bonding region. Referring to FIG. 12A, in some embodiments, the display panel includes a first planarization layer PLN1 between the second sub-layer SUB2 and the base substrate BS. Optionally, the display panel includes a first planarization layer PLN1, a second planarization layer PLN2, and a touch insulating layer TI between the third sub-layer SUB3 and the base substrate BS.

FIG. 12B is a cross-sectional view along a G-G' line in FIG. 8B. Referring to FIG. 12B, in some embodiments, a respective one of the plurality of first bonding pin portions Pbp1 has a multi-sub-layer structure. Optionally, the multi-sub-layer structure is a three-sub-layer structure. Optionally, the three-sub-layer structure includes a first sub-layer SUB1, a second sub-layer SUB2, and a third sub-layer SUB3, stacked together. Referring to FIG. 11 and FIG. 12B, in some embodiments, the first sub-layer SUB1 is part of the first signal line layer SD1, for example, the first sub-layer SUB1 is in a same layer as (and optionally made of a same material as) the source electrode and drain electrode of a respective one of the plurality of thin film transistors. Optionally, the second sub-layer SUB2 is part of the second signal line layer SD2, for example, the second sub-layer SUB2 is in a same layer as (and optionally made of a same material as) the relay electrode RE. Optionally, the third sub-layer SUB3 is part of the second touch metal layer MTB, for example, the third sub-layer SUB3 is in a same layer as (and optionally made of a same material as) the plurality of first touch mesh electrodes TE1 and the plurality of second touch mesh electrodes TE2.

In alternative embodiments, the multi-sub-layer structure is a two-sub-layer structure. Optionally, the two-sub-layer structure includes a first sub-layer SUB1 and a second sub-layer SUB2 stacked together. Optionally, the two-sub-layer structure includes a first sub-layer SUB1 and a third sub-layer SUB3 stacked together. Optionally, the two-sub-layer structure includes a second sub-layer SUB2 and a third sub-layer SUB3 stacked together.

In some embodiments, at least one of the second planarization layer PLN2 and the touch insulating layer TI extends into the bonding region. Referring to FIG. 12B, in some embodiments, the display panel includes a second planarization layer PLN2 and a touch insulating layer TI between the third sub-layer SUB3 and the base substrate BS.

Figure 13A:
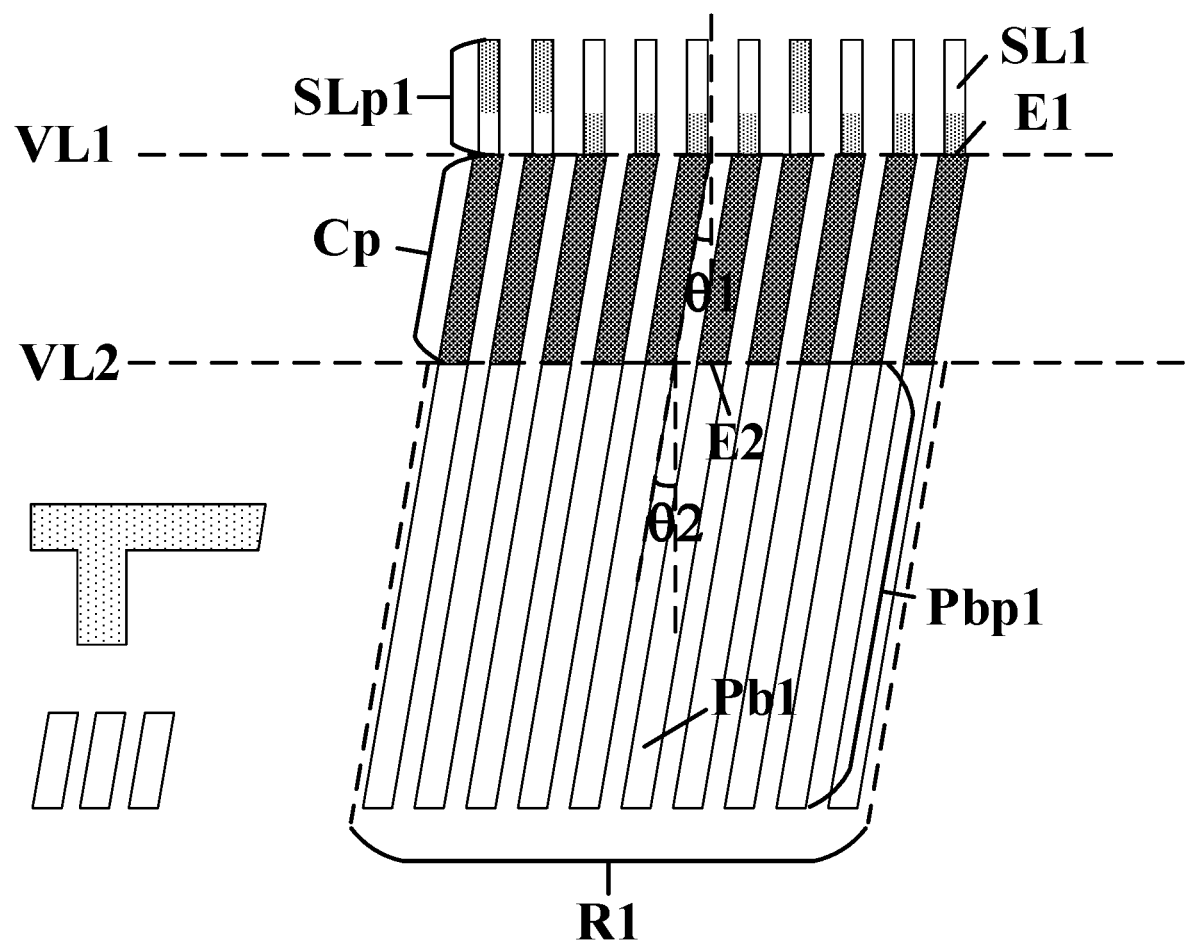
FIG. 13A is a zoom-in view of a bonding region of a display panel in some embodiments of the present disclosure.

FIG. 13A is a zoom-in view of a bonding region of a display panel in some embodiments of the present disclosure. Referring to FIG. 13A, the display panel in the bonding region includes a plurality of first signal lines SL1 on a base substrate, and a plurality of bonding pins on the base substrate and in the bonding region. The plurality of bonding pins include a plurality of first bonding pins Pb1 respectively electrically connected to the plurality of first signal lines SL1. As annotated in FIG. 13A, the plurality of first signal lines SL1 include a plurality of first signal line portions SLp1 substantially parallel to each other. Ends E1 of the plurality of first signal line portions closer to the plurality of first bonding pins Pb1 arranged along a first virtual line VL1. The plurality of first bonding pins Pb1 include a plurality of first bonding pin portions Pbp1. Ends E2 of the plurality of first bonding pin portions Pbp1 closer to the plurality of first signal lines SL1 arranged along a second virtual line VL2.

In some embodiments, the display panel further includes a plurality of connecting portions Cp respectively connecting the plurality of first signal line portions SLp1 to the plurality of first bonding pin portions Pbp1, for example, the plurality of connecting portions Cp respectively connecting ends E1 of the plurality of first signal line portions to the ends E2 of the plurality of first bonding pin portions Pbp1. The plurality of connecting portions Cp are disposed between the first virtual line VL1 and the second virtual line VL2. FIG. 13

Referring to FIG. 13A again, the plurality of first bonding pins Pb1 are clustered in a first region R1.

Optionally, a respective one of the plurality of first bonding pin portions Pbp1 and a respective one of the plurality of connecting portions Cp are substantially parallel to each other.

Optionally, the respective one of the plurality of first bonding pin portions Pbp1 and the respective one of the plurality of connecting portions Cp are arranged at a substantially same inclined angle with respect to a respective one of the plurality of first signal line portions SL1. For example, the respective one of the plurality of connecting portions Cp is inclined with respect to the respective one of the plurality of first signal line portions SL1 by a first inclined angle θ1; and the respective one of the plurality of first bonding pin portions Pbp1 is inclined with respect to the respective one of the plurality of first signal line portions SL1 by a second inclined angle θ2. Optionally, the first inclined angle θ1 and the second inclined angle θ2 are substantially same. Optionally, the first inclined angle θ1 is greater than zero. Optionally, the second inclined angle θ2 is greater than zero.

Figure 13B:
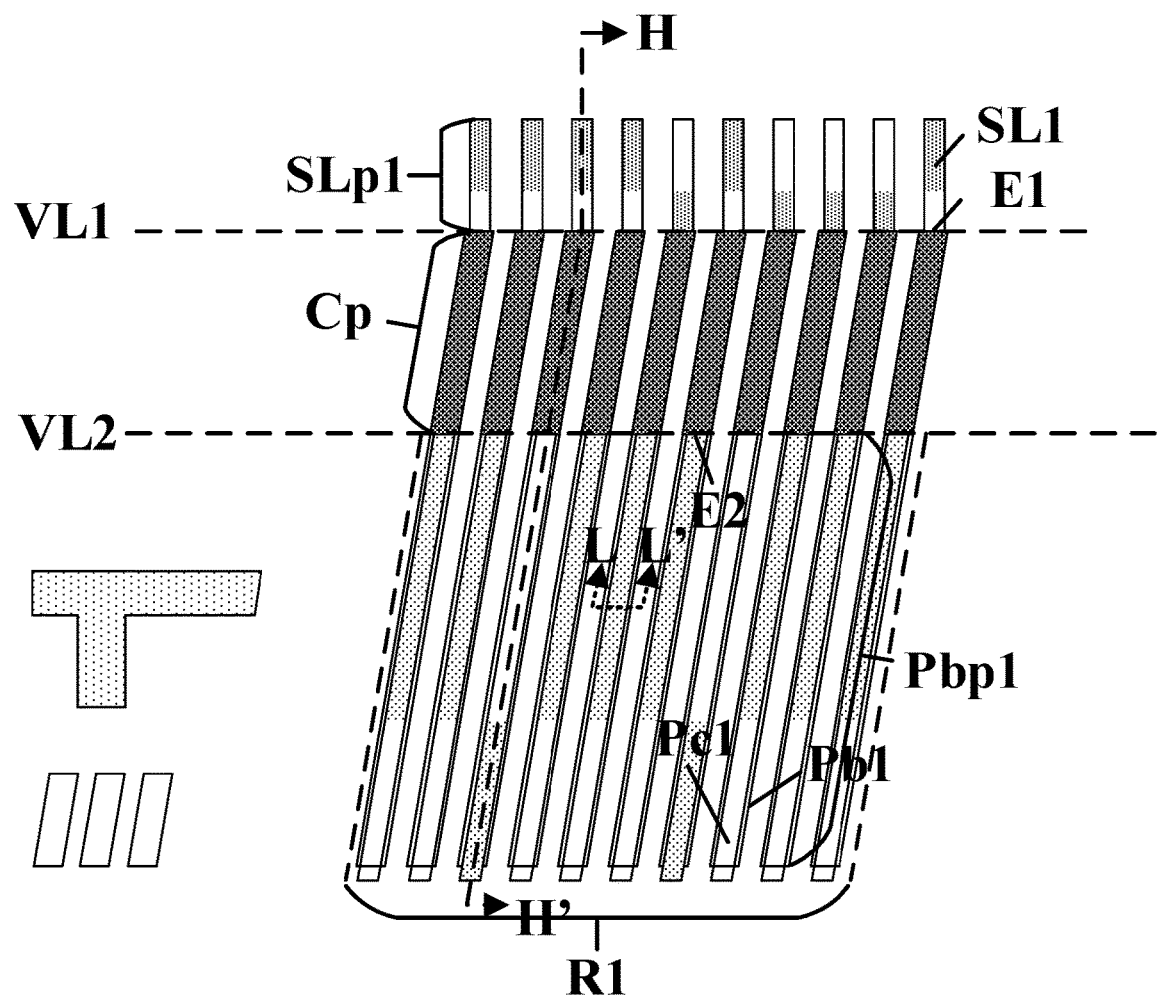
FIG. 13B is a zoom-in view of a bonding region of a display apparatus in some embodiments of the present disclosure.
Figure 13C:
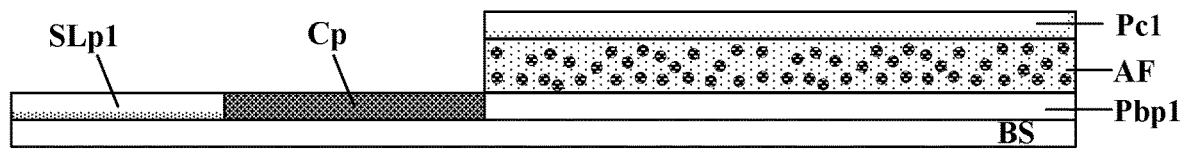
FIG. 13C is a cross-sectional view along an H-H' line in FIG. 13B.

FIG. 13B is a zoom-in view of a bonding region of a display apparatus in some embodiments of the present disclosure. Referring to FIG. 13B, the display apparatus in some embodiments includes a display panel depicted in FIG. 13C, and a flexible printed circuit bonded in a peripheral region of the display panel. In some embodiments, the flexible printed circuit includes a plurality of first circuit pins Pc1 respectively electrically connected to the plurality of first bonding pins Pb1 (e.g., through an anisotropic adhesive film). FIG. 13C is a cross-sectional view along an H-H' line in FIG. 13B. As shown in FIG. 13B and FIG. 13C, the plurality of first circuit pins Pc1 are respectively aligned with the plurality of first bonding pins Pb1 (e.g., along the Y-direction as shown in FIG. 13), the plurality of first circuit pins Pc1 are respectively electrically connected to the plurality of first bonding pins Pb1 through an anisotropic adhesive film AF. As a result of the alignment, an orthographic projection of a respective one of the plurality of first circuit pins Pc1 on the base substrate BS at least partially overlaps with an orthographic projections of a respective one of the plurality of first bonding pin portions Pbp1 on the base substrate BS, is non-overlapping with orthographic projections of the plurality of connecting portions CP on the base substrate BS, and is non-overlapping with orthographic projections of the plurality of first signal line portions SLp1 on the base substrate BS.

In some embodiments, the plurality of first bonding pins Pb1 and the plurality of first circuit pins Pc1 are clustered in a first region R1.

Optionally, the respective one of the plurality of first circuit pins Pc1, the respective one of the plurality of first bonding pin portions Pbp1, and the respective one of the plurality of connecting portions Cp are substantially parallel to each other, and are arranged at a substantially same inclined angle with respect to the respective one of the plurality of first signal line portions SLp1.

In the present display panel and display apparatus, by having the plurality of connecting portions Cp, the plurality of circuit pins can be spaced apart from the plurality of signal lines such as the plurality of first signal lines SL1. Short between the circuit pin and the signal line due to alignment imprecision or thermal expansion can be eliminated.

Figure 14A:
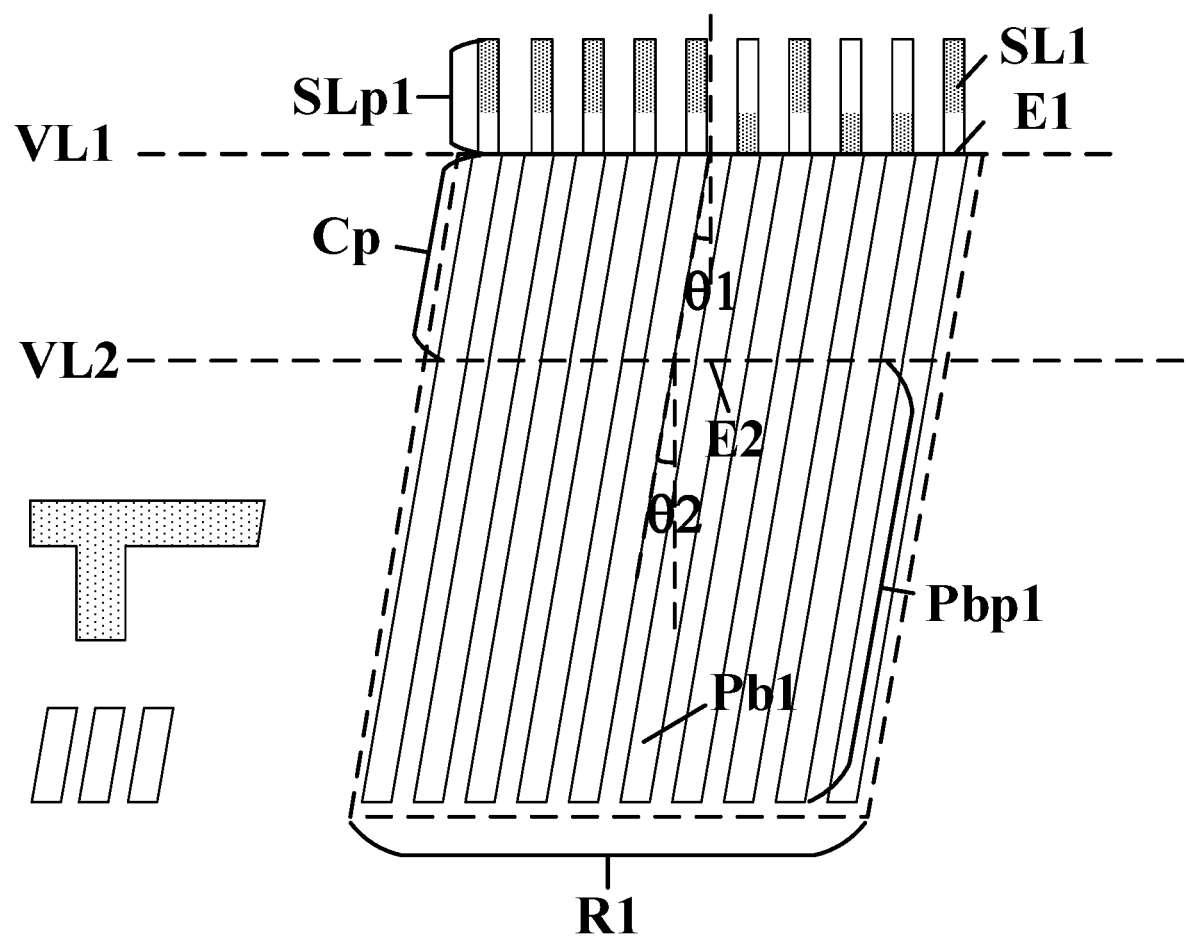
FIG. 14A is a zoom-in view of a bonding region of a display panel in some embodiments of the present disclosure.
Figure 14B:
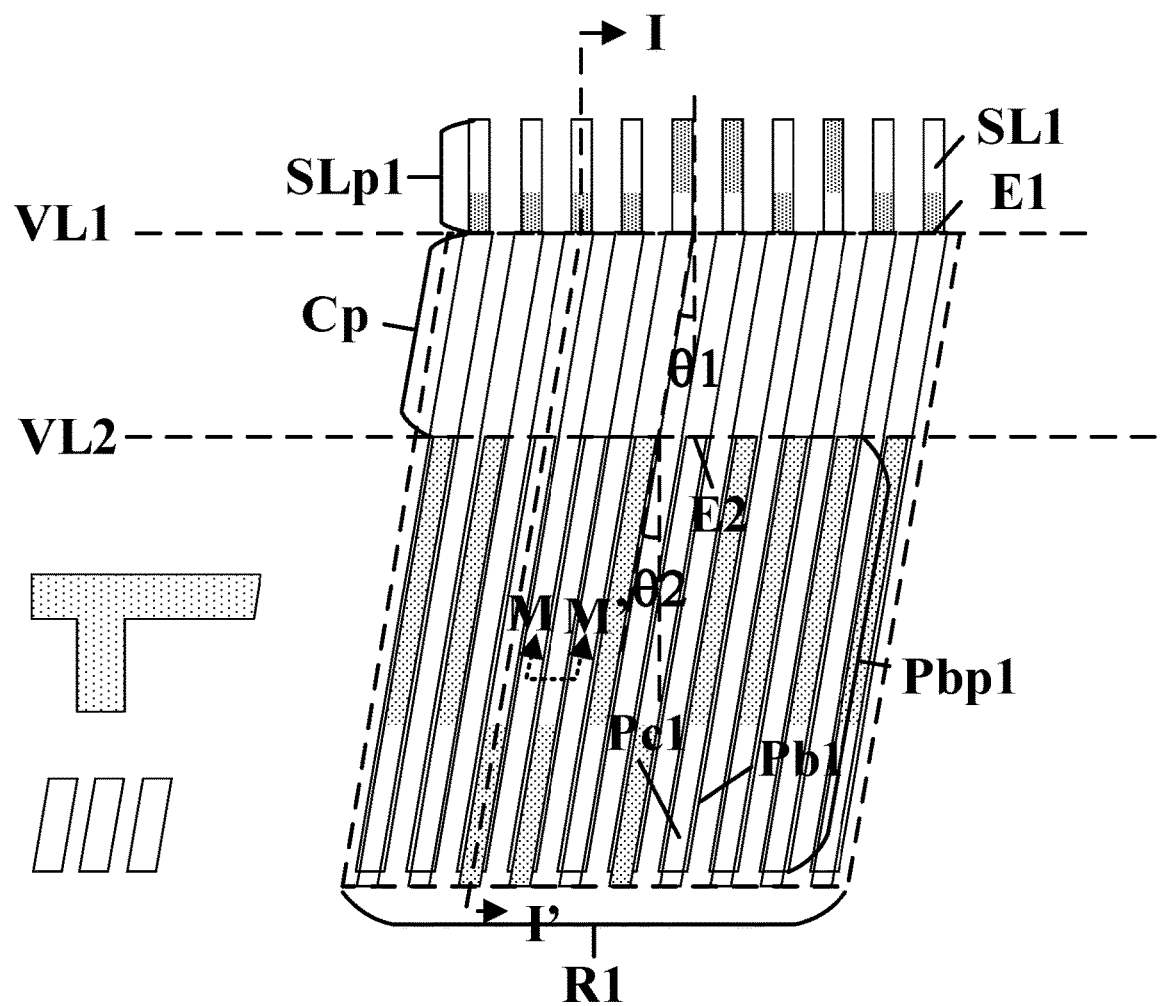
FIG. 14B is a zoom-in view of a bonding region of a display apparatus in some embodiments of the present disclosure.
Figure 14C:
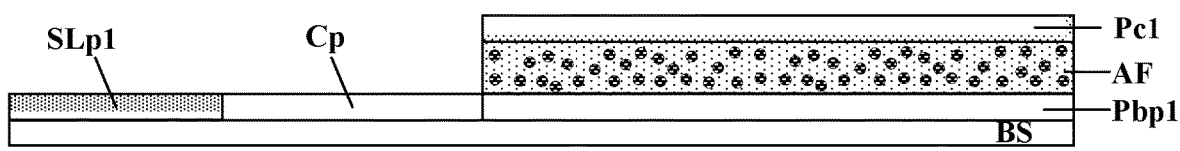
FIG. 14C is a cross-sectional view along an I-I' line in FIG. 14B.

In some embodiments, the plurality of connecting portions are respectively portions of the plurality of first bonding pin portions. FIG. 14A is a zoom-in view of a bonding region of a display panel in some embodiments of the present disclosure. FIG. 14B is a zoom-in view of a bonding region of a display apparatus in some embodiments of the present disclosure. FIG. 14C is a cross-sectional view along an I-I' line in FIG. 14B. Referring to FIG. 14A to FIG. 14C, the plurality of connecting portions Cp are respectively portions of the plurality of first bonding pin portions Pb1. A respective one of the plurality of first bonding pins Pb1 includes a respective one of the plurality of first bonding pin portions Pbp1 and a respective one of the plurality of connecting portions Cp.

Referring to FIG. 14A, the plurality of first bonding pin portions Pbp1 and the plurality of connecting portions Cp are clustered in a first region R1.

Referring to FIG. 14B, the plurality of first bonding pin portions Pbp1, the plurality of connecting portions Cp, and the plurality of first circuit pins Pc1 are clustered in a first region R1.

Figure 15A:
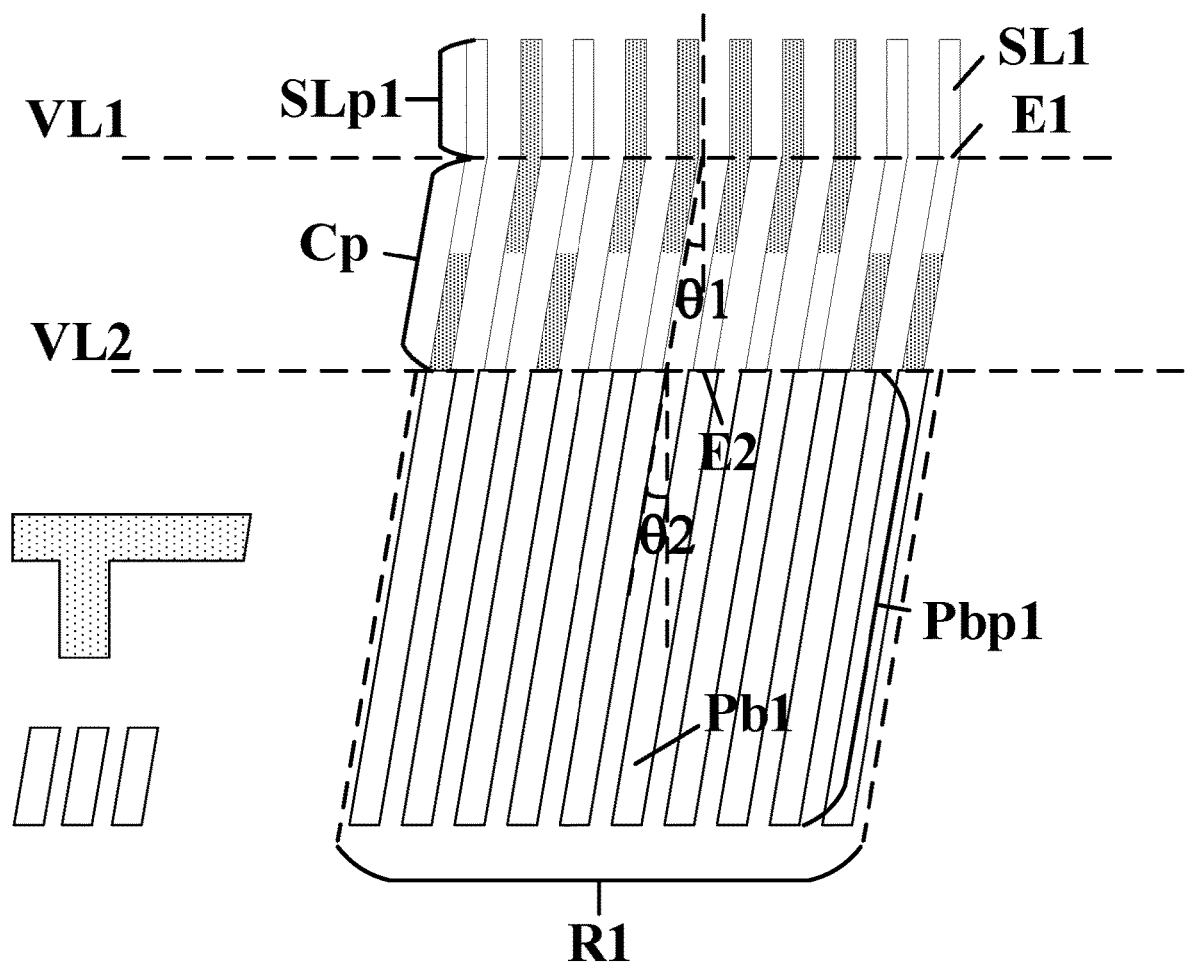
FIG. 15A is a zoom-in view of a bonding region of a display panel in some embodiments of the present disclosure.
Figure 15B:
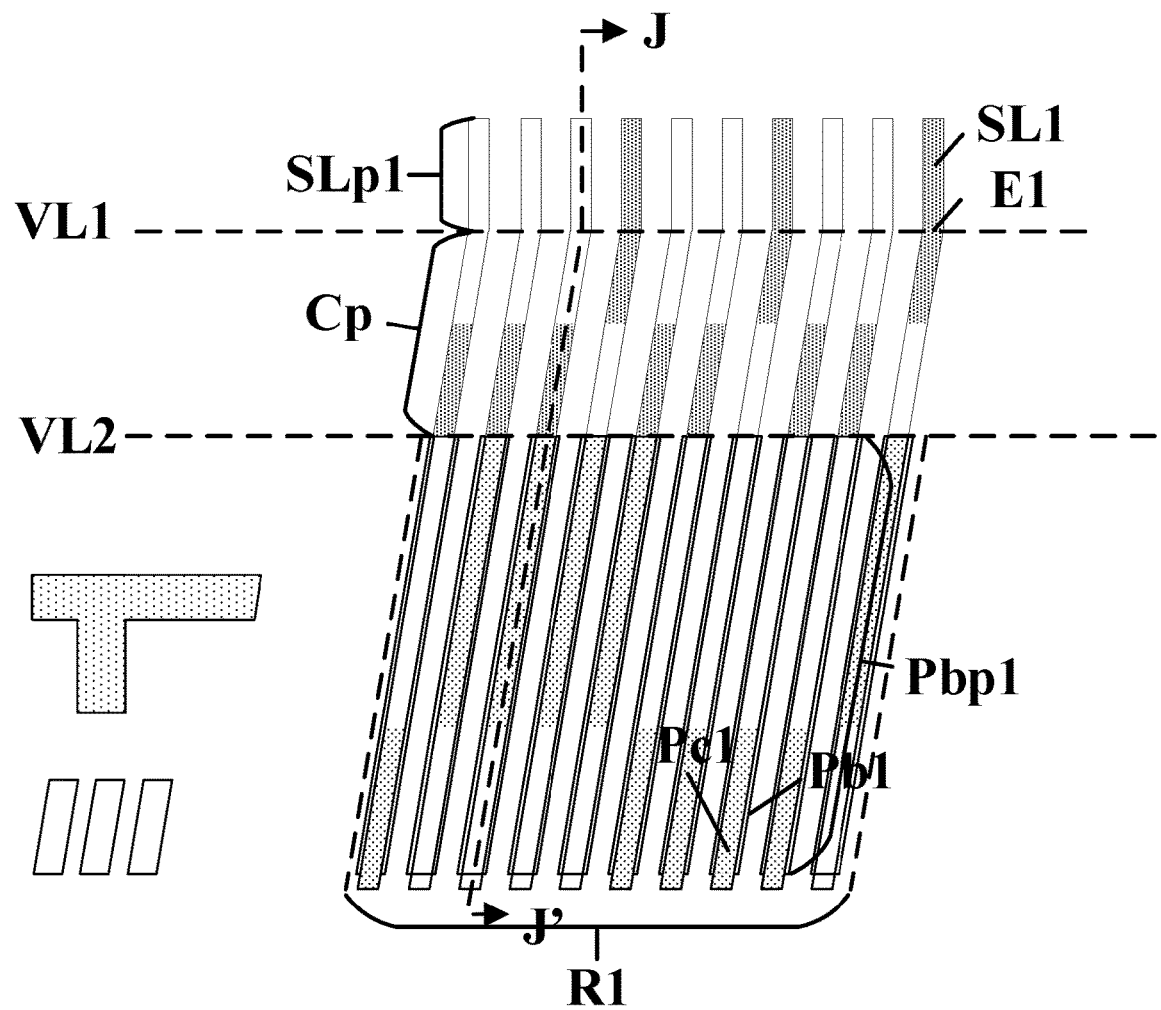
FIG. 15B is a zoom-in view of a bonding region of a display apparatus in some embodiments of the present disclosure.
Figure 15C:
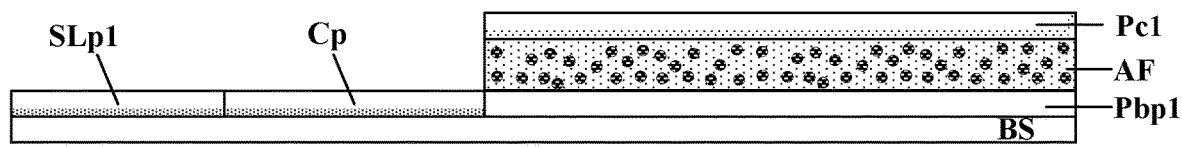
FIG. 15C is a cross-sectional view along a J-J' line in FIG. 15B.

In some embodiments, the plurality of connecting portions are respectively portions of the plurality of first signal lines. FIG. 15A is a zoom-in view of a bonding region of a display panel in some embodiments of the present disclosure. FIG. 15B is a zoom-in view of a bonding region of a display apparatus in some embodiments of the present disclosure. FIG. 15C is a cross-sectional view along a J-J' line in FIG. 15B. Referring to FIG. 15A to FIG. 15C, the plurality of connecting portions Cp are respectively portions of the plurality of first signal lines SL1. A respective one of the plurality of first signal lines SL1 includes a respective one of the plurality of first signal line portions SLp1 and a respective one of the plurality of connecting portions Cp.

Referring to FIG. 15A, the plurality of first bonding pin portions Pbp1 are clustered in a first region R1. The plurality of connecting portions Cp are outside the first region R1.

Referring to FIG. 15B, the plurality of first bonding pin portions Pbp1 and the plurality of first circuit pins Pc1 are clustered in a first region R1. The plurality of connecting portions Cp are outside the first region R1.

Figure 16A:
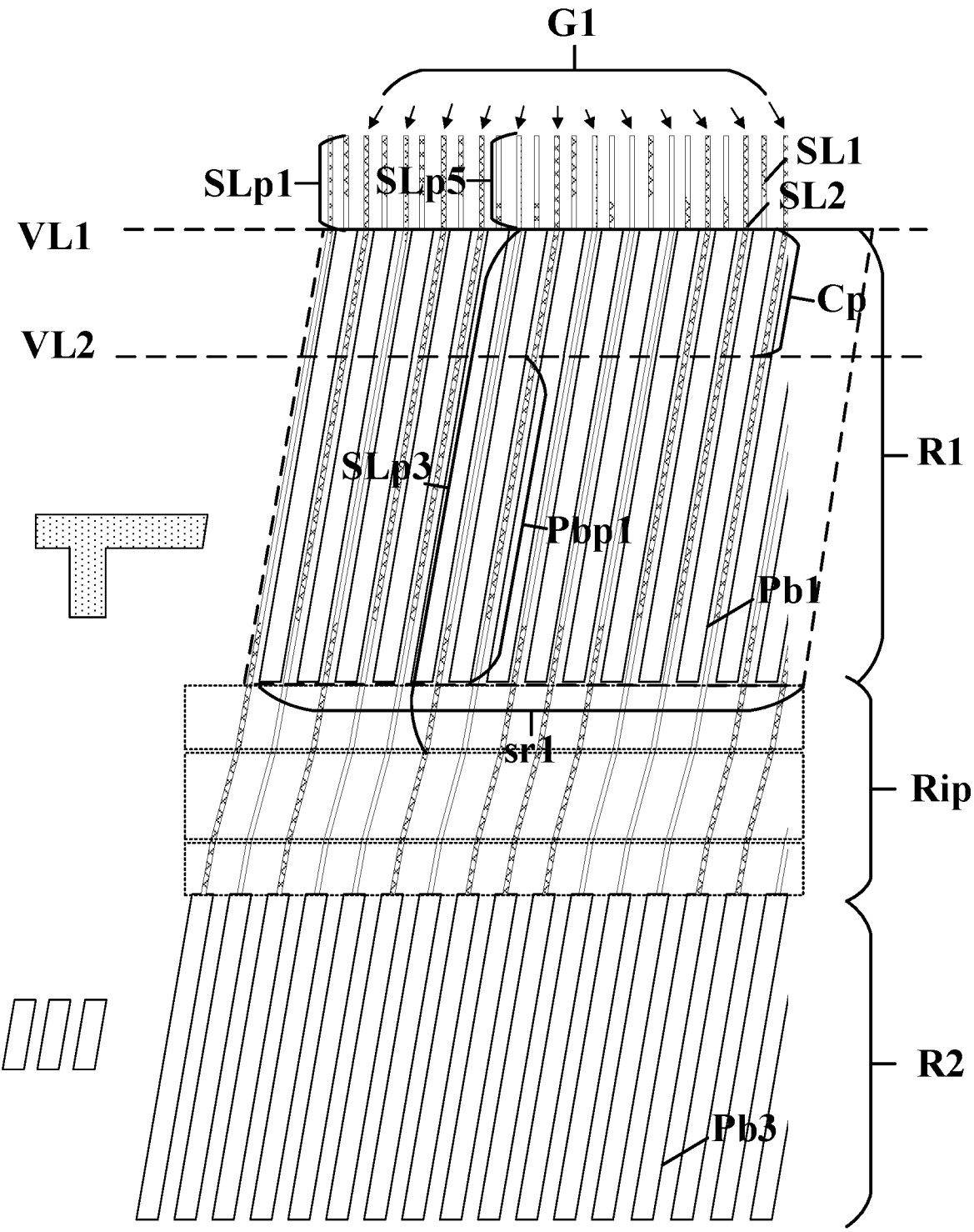
FIG. 16A is a zoom-in view of a bonding region of a display panel in some embodiments of the present disclosure.

FIG. 16A is a zoom-in view of a bonding region of a display panel in some embodiments of the present disclosure. Referring to FIG. 16A, in some embodiments, the display panel further includes a plurality of second signal lines SL2. The plurality of bonding pins further include a plurality of third bonding pins Pb3. The plurality of first bonding pins Pb1 are clustered in a first region R1. The plurality of third bonding pins Pb3 are clustered in a second region R2. The first region R1 is spaced apart from the second region R2 by an inter-pin region Rip absent of any bonding pins. Optionally, the plurality of second signal lines SL2 respectively extend through the first region R1 and the inter-pin region Rip to respectively connect to the plurality of third bonding pins Pb3. Optionally, the plurality of first signal lines SL1 do not extend into any of the first region R1, the second region R2, or the inter-pin region Rip.

The plurality of bonding pins include a plurality of first bonding pins Pb1 respectively electrically connected to the plurality of first signal lines SL1. The plurality of first signal lines SL1 include a plurality of first signal line portions SLp1 substantially parallel to each other. Ends of the plurality of first signal line portions closer to the plurality of first bonding pins Pb1 arranged along a first virtual line VL1. The plurality of first bonding pins Pb1 include a plurality of first bonding pin portions Pbp1. Ends of the plurality of first bonding pin portions Pbp1 closer to the plurality of first signal lines SL1 arranged along a second virtual line VL2.

In some embodiments, the display panel further includes a plurality of connecting portions Cp respectively connecting the plurality of first signal line portions SLp1 to the plurality of first bonding pin portions Pbp1, for example, the plurality of connecting portions Cp respectively connecting ends of the plurality of first signal line portions to the ends of the plurality of first bonding pin portions Pbp1. The plurality of connecting portions Cp are respectively portions of the plurality of first bonding pin portions Pb1. A respective one of the plurality of first bonding pins Pb1 includes a respective one of the plurality of first bonding pin portions Pbp1 and a respective one of the plurality of connecting portions Cp.

The plurality of connecting portions Cp are disposed between the first virtual line VL1 and the second virtual line VL2. Optionally, a respective one of the plurality of first bonding pin portions Pbp1 and a respective one of the plurality of connecting portions Cp are substantially parallel to each other. Optionally, the respective one of the plurality of first bonding pin portions Pbp1 and the respective one of the plurality of connecting portions Cp are arranged at a substantially same inclined angle with respect to a respective one of the plurality of first signal line portions SL1.

In some embodiments, the plurality of second signal lines SL2 include a plurality of second signal line portions SLp2 in the inter-pin region Rip and respectively connected to the plurality of third bonding pins Pb3. A respective one of the plurality of second signal line portions SLp2 and a respective one of the plurality of third bonding pins Pb3 are substantially parallel to each other, and are arranged at a substantially same inclined angle with respect to a respective one of the plurality of first signal line portions SLp1. For example, the respective one of the plurality of second signal line portions SLp2 is inclined with respect to the respective one of the plurality of first signal line portions SLp1 by a third inclined angle $\theta 3$; and the respective one of the plurality of third bonding pins Pb3 is inclined with respect to the respective one of the plurality of first signal line portions SLp1 by a fourth inclined angle $\theta 4$. Optionally, the third inclined angle $\theta 3$ and the fourth inclined angle $\theta 4$ are substantially same. Optionally, the third inclined angle $\theta 3$ and the fourth inclined angle $\theta 4$ are substantially same as the first inclined angle $\theta 1$ and the second inclined angle $\theta 2$. Optionally, the third inclined angle $\theta 3$ and the fourth inclined angle $\theta 4$ are different from the first inclined angle $\theta 1$ and the second inclined angle $\theta 2$. Optionally, the third inclined angle $\theta 3$ is greater than zero. Optionally, the fourth inclined angle $\theta 4$ is greater than zero. Optionally, the first inclined angle $\theta 1$ is greater than zero. Optionally, the second inclined angle $\theta 2$ is greater than zero.

In some embodiments, the plurality of second signal lines SL2 further include a plurality of third signal line portions SLp3 extending through the first region R1 and partially into the inter-pin region Rip. A respective one of the plurality of third signal line portions Slp3 extends through a space between two directly adjacent bonding pins in the first region R1. A second one of the plurality of third signal line portions Slp3 extends through a space between two directly adjacent first bonding pins of the plurality of first bonding pins Pb1 in the first region R1.

In some embodiments, the respective one of the plurality of third signal line portions Slp3 and the two directly adjacent bonding pins in the first region R1 are substantially parallel to each other, and are arranged at a substantially same inclined angle with respect to a respective one of the plurality of first signal line portions SLp1. For example, the respective one of the plurality of third signal line portions Slp3 is inclined with respect to the respective one of the plurality of first signal line portions SLp1 by a fifth inclined angle $\theta 5$; and the two directly adjacent bonding pins in the first region R1 are inclined with respect to the respective one of the plurality of first signal line portions SLp1 by a sixth inclined angle $\theta 6$. Optionally, the fifth inclined angle $\theta 5$ and the sixth inclined angle $\theta 6$ are substantially same. Optionally, the fifth inclined angle $\theta 5$ and the sixth inclined angle $\theta 6$ are substantially same as the first inclined angle $\theta 1$ and the second inclined angle $\theta 2$. Optionally, the fifth inclined angle $\theta 5$ and the sixth inclined angle $\theta 6$ are different from the first inclined angle $\theta 1$ and the second inclined angle $\theta 2$. Optionally, the fifth inclined angle $\theta 5$ and the sixth inclined angle $\theta 6$ are substantially same as the third inclined angle $\theta 3$ and the fourth inclined angle $\theta 4$. Optionally, the fifth inclined angle $\theta 5$ and the sixth inclined angle $\theta 6$ are different from the third inclined angle $\theta 3$ and the fourth inclined angle $\theta 4$. Optionally, the fifth inclined angle $\theta 5$ is greater than zero. Optionally, the sixth inclined angle $\theta 6$ is greater than zero. Optionally, the third inclined angle $\theta 3$ is greater than zero. Optionally, the fourth inclined angle $\theta 4$ is greater than zero. Optionally, the first inclined angle $\theta 1$ is greater than zero. Optionally, the second inclined angle $\theta 2$ is greater than zero.

In some embodiments, the plurality of first bonding pins Pb1 are clustered in the first region R1. Optionally, the plurality of first bonding pins Pb1 are limited in the first region R1.

In some embodiments, the plurality of third signal line portions SLp3 include a first group G1 of third signal line portions in the first region R1. A respective third signal line portion in the first group G1 of third signal line portions extends through a space between two directly adjacent first bonding pins of the plurality of first bonding pins Pb1 in the first region R1. Optionally, the respective third signal line portion in the first group G1 of third signal line portions and the two directly adjacent first bonding pins in the first region R1 are substantially parallel to each other. Optionally, the respective third signal line portion in the first group G1 of third signal line portions and the two directly adjacent first bonding pins in the first region R1 are arranged at a substantially same inclined angle with respect to a respective one of the plurality of first signal line portions SLp1.

In some embodiments, the plurality of second signal lines SL2 further include a plurality of fourth signal line portions SLp4 in the inter-pin region Rip and respectively connecting the plurality of third signal line portions SLp3 and the plurality of second signal line portions SLp2. A respective one of the plurality of fourth signal line portions SLp4 is arranged at an inclined angle with respect to a respective one of the plurality of second signal line portions SLp2, and arranged at an inclined angle with respect to a respective one of the plurality of third signal line portions SLp3. For example, the respective one of the plurality of fourth signal line portions SLp4 is inclined with respect to the respective one of the plurality of third signal line portions SLp3 by a seventh inclined angle $\theta 7$; and the respective one of the plurality of fourth signal line portions SLp4 is inclined with respect to the respective one of the plurality of second signal line portions SLp2 by an eighth inclined angle $\theta 8$. Optionally, the seventh inclined angle $\theta 7$ is greater than zero. Optionally, the eighth inclined angle $\theta 8$ is greater than zero.

In some embodiments, the plurality of second signal lines SL2 further include a plurality of fifth signal line portions SLp5 respectively connected to the plurality of third signal line portions SLp3. Optionally, the plurality of fifth signal line portions SLp5 and the plurality of first signal line portions SLp1 are substantially parallel to each other.

In some embodiments, the plurality of first bonding pins Pb1 are clustered in the first region R1. The plurality of third signal line portions SLp3 include a first group G1 of third signal line portions in the first region R1. A respective third signal line portion in the first group G1 of third signal line portions extends through a space between two directly adjacent first bonding pins of the plurality of first bonding pins Pb1 in the first region R1. The respective third signal line portion in the first group G1 of third signal line portions and the two directly adjacent first bonding pins in the first region R1 are substantially parallel to each other, and are arranged at a substantially same inclined angle with respect to a respective one of the plurality of first signal line portions Slp1. The plurality of fifth signal line portions include a first group G1 of fifth signal line portions. Optionally, signal line portions of the first group G1 of fifth signal line portions and the plurality of first signal line portions Slp1 are alternately arranged.

Figure 16B:
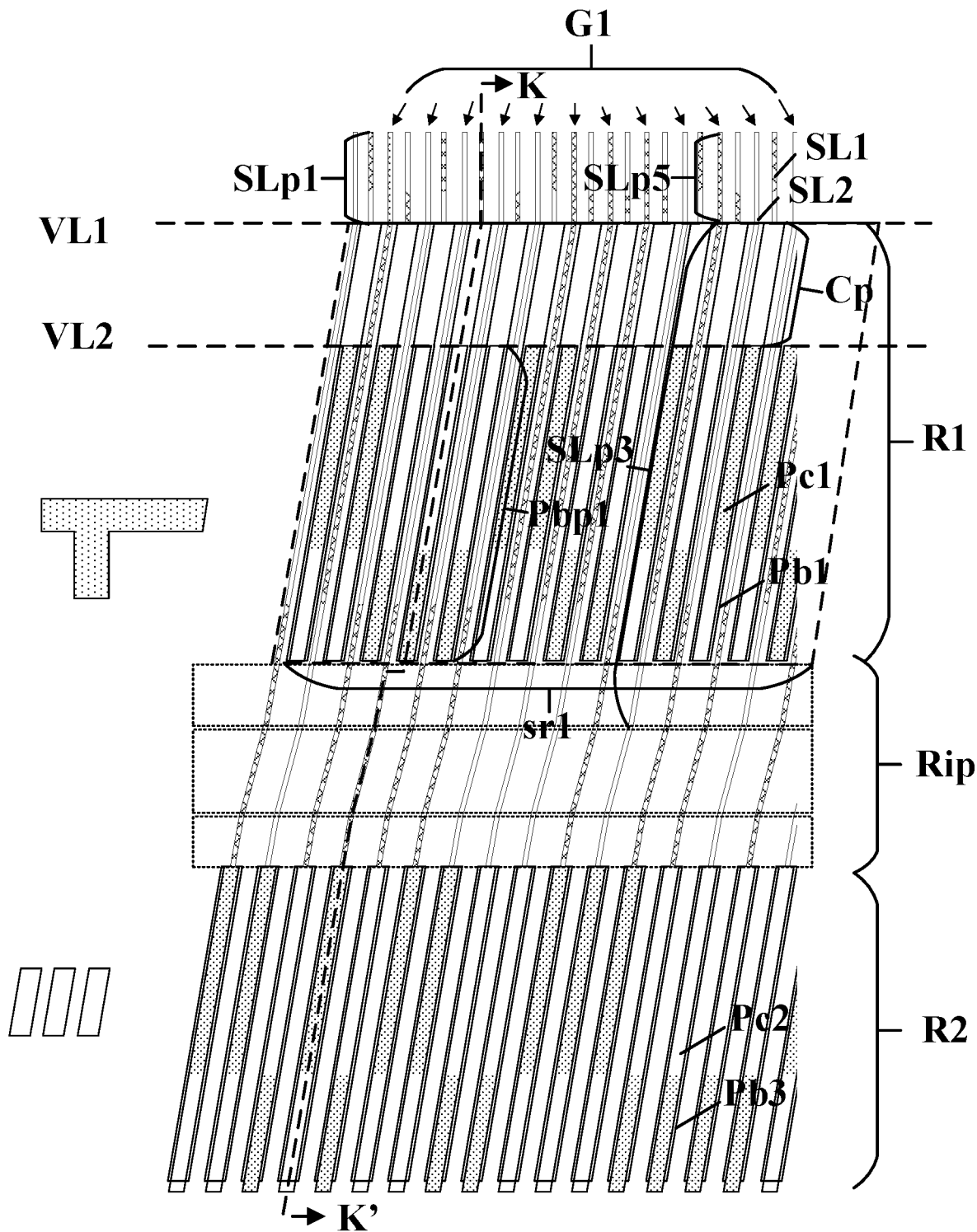
FIG. 16B is a zoom-in view of a bonding region of a display apparatus in some embodiments of the present disclosure.

FIG. 16B is a zoom-in view of a bonding region of a display apparatus in some embodiments of the present disclosure. Referring to FIG. 16B, in some embodiments, the flexible printed circuit comprises a plurality of first circuit pins Pc1 respectively electrically connected to the plurality of first bonding pins Pb1, and a plurality of second circuit pins Pc2 respectively electrically connected to the plurality of third bonding pins Pb3. Optionally, a respective one of the plurality of second circuit pins Pc2, a respective one of the plurality of second signal line portions SLp2, and a respective one of the plurality of third bonding pins Pb3 are substantially parallel to each other, and are arranged at a substantially same inclined angle with respect to a respective one of the plurality of first signal line portions SLp1.

FIG. 16C is a cross-sectional view along a K-K' line in FIG. 16B. Referring to FIG. 16A to FIG. 16C, in some embodiments, an orthographic projection of a respective one of the plurality of second circuit pins Pc2 on the base substrate BS at least partially overlaps with an orthographic projections of the respective one of the plurality of third bonding pins Pb3 on the base substrate BS, and is non-overlapping with orthographic projections of the plurality of second signal line portions SLp2 on the base substrate BS.

FIG. 17A is a cross-sectional view along an L-L' line in FIG. 13B. Referring to FIG. 17A, in some embodiments, a respective one of the plurality of first bonding pin portions Pbp1 has a multi-sub-layer structure. Optionally, the multi-sub-layer structure is a three-sub-layer structure. Optionally, the three-sub-layer structure includes a first sub-layer SUB1, a second sub-layer SUB2, and a third sub-layer SUB3, stacked together. Referring to FIG. 11 and FIG. 17A, in some embodiments, the first sub-layer SUB1 is part of the first signal line layer SD1, for example, the first sub-layer SUB1 is in a same layer as (and optionally made of a same material as) the source electrode and drain electrode of a respective one of the plurality of thin film transistors. Optionally, the second sub-layer SUB2 is part of the second signal line layer SD2, for example, the second sub-layer SUB2 is in a same layer as (and optionally made of a same material as) the relay electrode RE. Optionally, the third sub-layer SUB3 is part of the second touch metal layer MTB, for example, the third sub-layer SUB3 is in a same layer as (and optionally made of a same material as) the plurality of first touch mesh electrodes TE1 and the plurality of second touch mesh electrodes TE2.

In alternative embodiments, the multi-sub-layer structure is a two-sub-layer structure. Optionally, the two-sub-layer structure includes a first sub-layer SUB1 and a second sub-layer SUB2 stacked together. Optionally, the two-sub-layer structure includes a first sub-layer SUB1 and a third sub-layer SUB3 stacked together. Optionally, the two-sub-layer structure includes a second sub-layer SUB2 and a third sub-layer SUB3 stacked together.

In some embodiments, at least one of the first planarization layer PLN1, the second planarization layer PLN2, and the touch insulating layer TI extends into the bonding region. Referring to FIG. 17A, in some embodiments, the display panel includes a first planarization layer PLN1 between the second sub-layer SUB2 and the base substrate BS. Optionally, the display panel includes a first planarization layer PLN1, a second planarization layer PLN2, and a touch insulating layer TI between the third sub-layer SUB3 and the base substrate BS.

FIG. 17B is a cross-sectional view along an M-M' line in FIG. 14B. Referring to FIG. 17B, in some embodiments, a respective one of the plurality of first bonding pin portions Pbp1 has a multi-sub-layer structure. Optionally, the multi-sub-layer structure is a three-sub-layer structure. Optionally, the three-sub-layer structure includes a first sub-layer SUB1, a second sub-layer SUB2, and a third sub-layer SUB3, stacked together. Referring to FIG. 11 and FIG. 17B, in some embodiments, the first sub-layer SUB1 is part of the first signal line layer SD1, for example, the first sub-layer SUB1 is in a same layer as (and optionally made of a same material as) the source electrode and drain electrode of a respective one of the plurality of thin film transistors. Optionally, the second sub-layer SUB2 is part of the second signal line layer SD2, for example, the second sub-layer SUB2 is in a same layer as (and optionally made of a same material as) the relay electrode RE. Optionally, the third sub-layer SUB3 is part of the second touch metal layer MTB, for example, the third sub-layer SUB3 is in a same layer as (and optionally made of a same material as) the plurality of first touch mesh electrodes TE1 and the plurality of second touch mesh electrodes TE2.

In alternative embodiments, the multi-sub-layer structure is a two-sub-layer structure. Optionally, the two-sub-layer structure includes a first sub-layer SUB1 and a second sub-layer SUB2 stacked together. Optionally, the two-sub-layer structure includes a first sub-layer SUB1 and a third sub-layer SUB3 stacked together. Optionally, the two-sub-layer structure includes a second sub-layer SUB2 and a third sub-layer SUB3 stacked together.

In some embodiments, at least one of the second planarization layer PLN2 and the touch insulating layer TI extends into the bonding region. Referring to FIG. 17B, in some embodiments, the display panel includes a second planarization layer PLN2 and a touch insulating layer TI between the third sub-layer SUB3 and the base substrate BS.

In some embodiments, a respective one of the plurality of first bonding pin portions Pbp1 has a multi-sub-layer structure. Optionally, the multi-sub-layer structure is a three-sub-layer structure. Referring to FIG. 12A, the three-sub-layer structure in some embodiments includes a first sub-layer SUB1, a second sub-layer SUB2, and a third sub-layer SUB3, stacked together. Referring to FIG. 11 and FIG. 12A, in some embodiments, the first sub-layer SUB1 is part of the first signal line layer SD1, for example, the first sub-layer SUB1 is in a same layer as (and optionally made of a same material as) the source electrode and drain electrode of a respective one of the plurality of thin film transistors. Optionally, the second sub-layer SUB2 is part of the second signal line layer SD2, for example, the second sub-layer SUB2 is in a same layer as (and optionally made of a same material as) the relay electrode RE. Optionally, the third sub-layer SUB3 is part of the second touch metal layer MTB, for example, the third sub-layer SUB3 is in a same layer as (and optionally made of a same material as) the plurality of first touch mesh electrodes TE1 and the plurality of second touch mesh electrodes TE2.

In alternative embodiments, the multi-sub-layer structure is a two-sub-layer structure. Optionally, the two-sub-layer structure includes a first sub-layer SUB1 and a second sub-layer SUB2 stacked together. Optionally, the two-sub-layer structure includes a first sub-layer SUB1 and a third sub-layer SUB3 stacked together. Optionally, the two-sub-layer structure includes a second sub-layer SUB2 and a third sub-layer SUB3 stacked together.

Figure 18A:
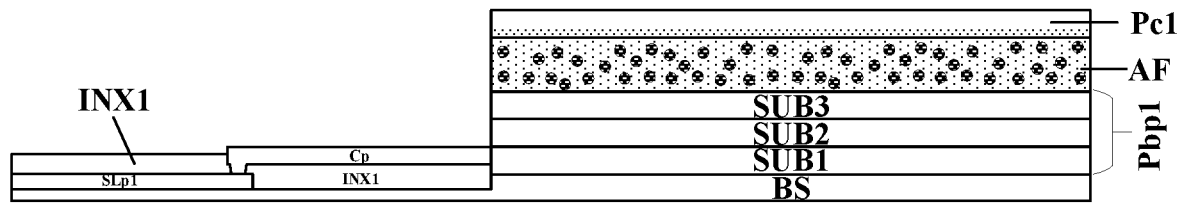
FIG. 18A shows a connection among a respective first signal line portion, a respective connecting portion, and a respective first bonding pin portion in some embodiments according to the present disclosure.

FIG. 18A shows a connection among a respective first signal line portion, a respective connecting portion, and a respective first bonding pin portion in some embodiments according to the present disclosure. Referring to FIG. 18A, the respective connecting portion in some embodiments is in a same layer as the first sub-layer SUB1 of the respective first bonding pin portion. In some embodiments, the respective connecting portion and the first sub-layer SUB1 are parts of the first signal line layer, for example, the respective connecting portion and the first sub-layer SUB1 are in a same layer as (and optionally made of a same material as) the source electrode and drain electrode of a respective one of the plurality of thin film transistors.

In some embodiments, the respective first signal line portion and the respective connecting portion are in different layers. Optionally, the display panel further includes one or more first insulating layers INX1 between the respective first signal line portion and the respective connecting portion. Optionally, the respective connecting portion extends through a via extending through the one or more first insulating layers INX1 to connect to the respective first signal line portion. In one example, the one or more first insulating layers INX1 include at least one of the second gate insulating layer or the inter-layer dielectric layer.

In one particular example, the respective connecting portion and the first sub-layer SUB1 are parts of the first signal line layer, and the respective first signal line portion is in the first gate metal layer. The first gate metal layer includes a first capacitor electrode of the storage capacitor of a pixel driving circuit of the display panel, and a gate electrode of a transistor of the pixel driving circuit of the display panel.

Figure 18B:
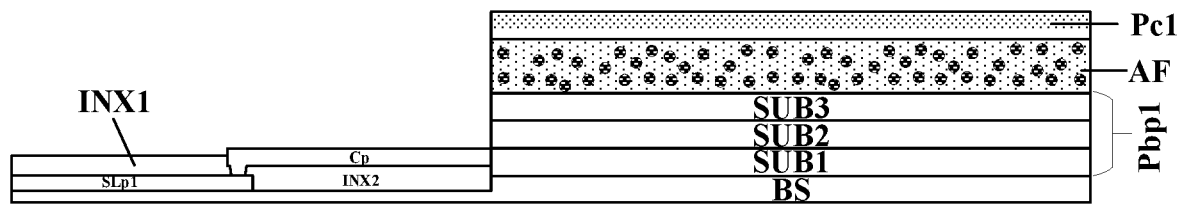
FIG. 18B shows a connection among a respective first signal line portion, a respective connecting portion, and a respective first bonding pin portion in some embodiments according to the present disclosure.

FIG. 18B shows a connection among a respective first signal line portion, a respective connecting portion, and a respective first bonding pin portion in some embodiments according to the present disclosure. Referring to FIG. 18B, the respective connecting portion in some embodiments is in a same layer as the first sub-layer SUB1 of the respective first bonding pin portion. In some embodiments, the respective connecting portion and the first sub-layer SUB1 are parts of the first signal line layer, for example, the respective connecting portion and the first sub-layer SUB1 are in a same layer as (and optionally made of a same material as) the source electrode and drain electrode of a respective one of the plurality of thin film transistors.

In some embodiments, the respective first signal line portion and the respective connecting portion are in different layers. Optionally, the display panel further includes one or more second insulating layers INX2 between the respective first signal line portion and the respective connecting portion. Optionally, the respective connecting portion extends through a via extending through the one or more second insulating layers INX2 to connect to the respective first signal line portion. In one example, the one or more second insulating layers INX2 include the inter-layer dielectric layer.

In one particular example, the respective connecting portion and the first sub-layer SUB1 are parts of the first signal line layer, and the respective first signal line portion is in the second gate metal layer. The second gate metal layer includes a second capacitor electrode of the storage capacitor of a pixel driving circuit of the display panel.

Figure 18C:
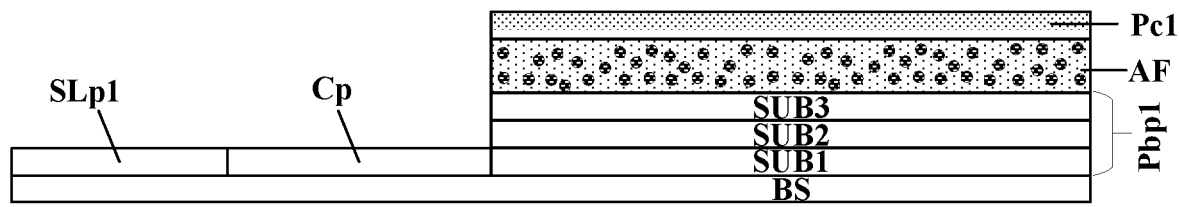
FIG. 18C shows a connection among a respective first signal line portion, a respective connecting portion, and a respective first bonding pin portion in some embodiments according to the present disclosure.

FIG. 18C shows a connection among a respective first signal line portion, a respective connecting portion, and a respective first bonding pin portion in some embodiments according to the present disclosure. Referring to FIG. 18C, the respective connecting portion in some embodiments is in a same layer as the first sub-layer SUB1 of the respective first bonding pin portion. In some embodiments, the respective connecting portion and the first sub-layer SUB1 are parts of the first signal line layer, for example, the respective connecting portion and the first sub-layer SUB1 are in a same layer as (and optionally made of a same material as) the source electrode and drain electrode of a respective one of the plurality of thin film transistors.

In some embodiments, the respective first signal line portion and the respective connecting portion are in a same layer. In one example, the respective first signal line portion and the respective connecting portion are parts of the first signal line layer.

In one particular example, the respective connecting portion, the first sub-layer SUB1, and the respective first signal line portion are parts of the first signal line layer.

Figure 18D:
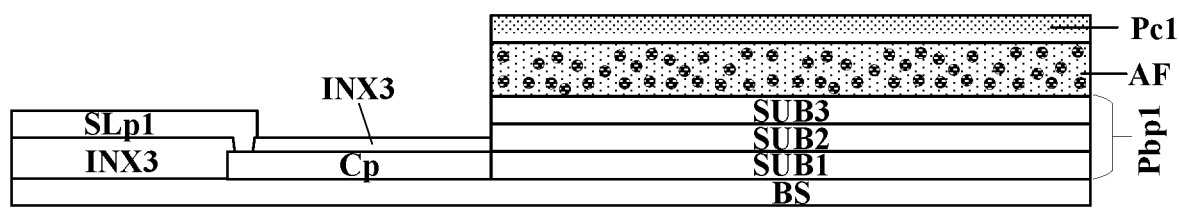
FIG. 18D shows a connection among a respective first signal line portion, a respective connecting portion, and a respective first bonding pin portion in some embodiments according to the present disclosure.

FIG. 18D shows a connection among a respective first signal line portion, a respective connecting portion, and a respective first bonding pin portion in some embodiments according to the present disclosure. Referring to FIG. 18D, the respective connecting portion in some embodiments is in a same layer as the first sub-layer SUB1 of the respective first bonding pin portion. In some embodiments, the respective connecting portion and the first sub-layer SUB1 are parts of the first signal line layer, for example, the respective connecting portion and the first sub-layer SUB1 are in a same layer as (and optionally made of a same material as) the source electrode and drain electrode of a respective one of the plurality of thin film transistors.

In some embodiments, the respective first signal line portion and the respective connecting portion are in different layers. Optionally, the display panel further includes one or more third insulating layers INX3 between the respective first signal line portion and the respective connecting portion. Optionally, the respective first signal line portion extends through a via extending through the one or more third insulating layers INX3 to connect to the respective connecting portion. In one example, the one or more third insulating layers INX3 include at least one of the passivation layer or the first planarization layer.

In one particular example, the respective connecting portion and the first sub-layer SUB1 are parts of the first signal line layer, and the respective first signal line portion is in the second signal line layer.

Figure 19A:
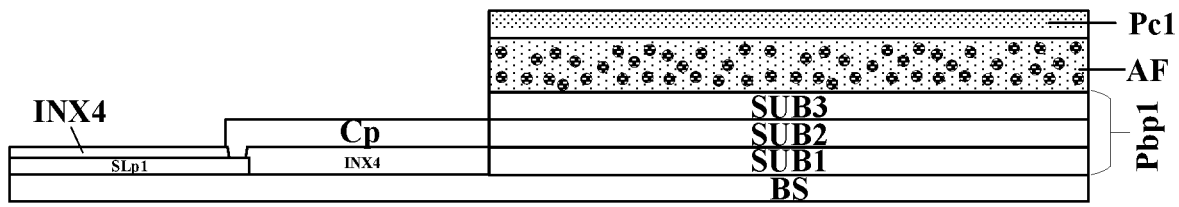
FIG. 19A shows a connection among a respective first signal line portion, a respective connecting portion, and a respective first bonding pin portion in some embodiments according to the present disclosure.

FIG. 19A shows a connection among a respective first signal line portion, a respective connecting portion, and a respective first bonding pin portion in some embodiments according to the present disclosure. Referring to FIG. 19A, the respective connecting portion in some embodiments is in a same layer as the second sub-layer SUB2 of the respective first bonding pin portion. In some embodiments, the respective connecting portion and the second sub-layer SUB2 are parts of the second signal line layer, for example, the respective connecting portion and the second sub-layer SUB2 are in a same layer as (and optionally made of a same material as) the relay electrode RE.

In some embodiments, the respective first signal line portion and the respective connecting portion are in different layers. Optionally, the display panel further includes one or more fourth insulating layers INX4 between the respective first signal line portion and the respective connecting portion. Optionally, the respective connecting portion extends through a via extending through the one or more fourth insulating layers INX4 to connect to the respective first signal line portion. In one example, the one or more fourth insulating layers INX4 include at least one of the second gate insulating layer, the inter-layer dielectric layer, the passivation layer, or the first planarization layer.

In one particular example, the respective connecting portion and the second sub-layer SUB2 are parts of the second signal line layer, and the respective first signal line portion is in the first gate metal layer. The first gate metal layer includes a first capacitor electrode of the storage capacitor of a pixel driving circuit of the display panel, and a gate electrode of a transistor of the pixel driving circuit of the display panel.

Figure 19B:
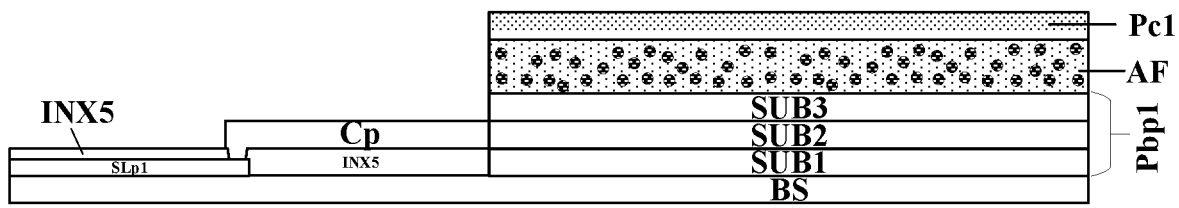
FIG. 19B shows a connection among a respective first signal line portion, a respective connecting portion, and a respective first bonding pin portion in some embodiments according to the present disclosure.

FIG. 19B shows a connection among a respective first signal line portion, a respective connecting portion, and a respective first bonding pin portion in some embodiments according to the present disclosure. Referring to FIG. 19B, the respective connecting portion in some embodiments is in a same layer as the second sub-layer SUB2 of the respective first bonding pin portion. In some embodiments, the respective connecting portion and the second sub-layer SUB2 are parts of the second signal line layer, for example, the respective connecting portion and the second sub-layer SUB2 are in a same layer as (and optionally made of a same material as) the relay electrode RE.

In some embodiments, the respective first signal line portion and the respective connecting portion are in different layers. Optionally, the display panel further includes one or more fifth insulating layers INX5 between the respective first signal line portion and the respective connecting portion. Optionally, the respective connecting portion extends through a via extending through the one or more fifth insulating layers INX5 to connect to the respective first signal line portion. In one example, the one or more fifth insulating layers INX5 include at least one of the inter-layer dielectric layer, the passivation layer, or the first planarization layer.

In one particular example, the respective connecting portion and the second sub-layer SUB2 are parts of the second signal line layer, and the respective first signal line portion is in the second gate metal layer. The second gate metal layer includes a second capacitor electrode of the storage capacitor of a pixel driving circuit of the display panel.

Figure 19C:
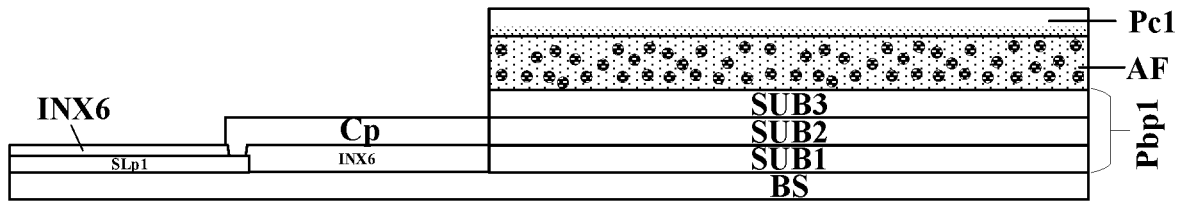
FIG. 19C shows a connection among a respective first signal line portion, a respective connecting portion, and a respective first bonding pin portion in some embodiments according to the present disclosure.

FIG. 19C shows a connection among a respective first signal line portion, a respective connecting portion, and a respective first bonding pin portion in some embodiments according to the present disclosure. Referring to FIG. 19C, the respective connecting portion in some embodiments is in a same layer as the second sub-layer SUB2 of the respective first bonding pin portion. In some embodiments, the respective connecting portion and the second sub-layer SUB2 are parts of the second signal line layer, for example, the respective connecting portion and the second sub-layer SUB2 are in a same layer as (and optionally made of a same material as) the relay electrode RE.

In some embodiments, the respective first signal line portion and the respective connecting portion are in different layers. Optionally, the display panel further includes one or more sixth insulating layers INX6 between the respective first signal line portion and the respective connecting portion. Optionally, the respective connecting portion extends through a via extending through the one or more sixth insulating layers INX6 to connect to the respective first signal line portion. In one example, the one or more sixth insulating layers INX6 include at least one of the passivation layer or the first planarization layer.

In one particular example, the respective connecting portion, the second sub-layer SUB2, and the respective first signal line portion are parts of the second signal line layer.

Figure 19D:
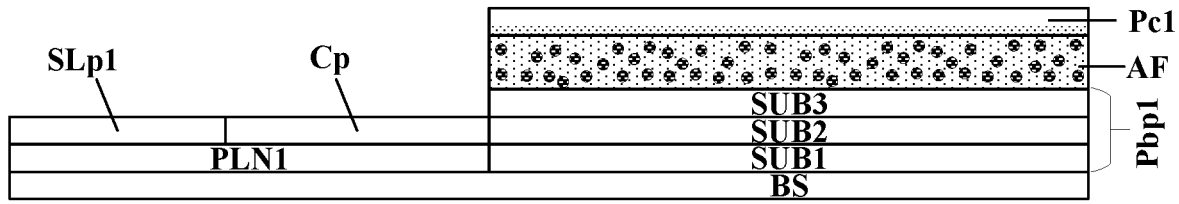
FIG. 19D shows a connection among a respective first signal line portion, a respective connecting portion, and a respective first bonding pin portion in some embodiments according to the present disclosure.

FIG. 19D shows a connection among a respective first signal line portion, a respective connecting portion, and a respective first bonding pin portion in some embodiments according to the present disclosure. Referring to FIG. 19D, the respective connecting portion in some embodiments is in a same layer as the second sub-layer SUB2 of the respective first bonding pin portion. In some embodiments, the respective connecting portion and the second sub-layer SUB2 are parts of the second signal line layer, for example, the respective connecting portion and the second sub-layer SUB2 are in a same layer as (and optionally made of a same material as) the relay electrode RE.

In some embodiments, the respective first signal line portion and the respective connecting portion are in a same layer. In one example, the respective first signal line portion and the respective connecting portion are parts of the second signal line layer.

In one particular example, the respective connecting portion, the second sub-layer SUB2, and the respective first signal line portion are parts of the second signal line layer.

Figure 20A:
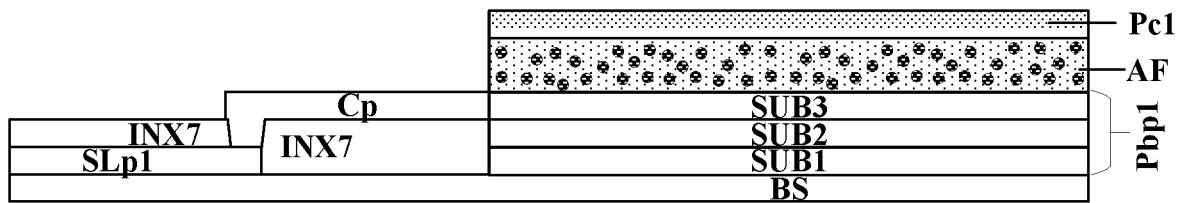
FIG. 20A shows a connection among a respective first signal line portion, a respective connecting portion, and a respective first bonding pin portion in some embodiments according to the present disclosure.

FIG. 20A shows a connection among a respective first signal line portion, a respective connecting portion, and a respective first bonding pin portion in some embodiments according to the present disclosure. Referring to FIG. 20A, the respective connecting portion in some embodiments is in a same layer as the third sub-layer SUB3 of the respective first bonding pin portion. In some embodiments, the respective connecting portion and the third sub-layer SUB3 are parts of the second touch metal layer, for example, the respective connecting portion and the third sub-layer SUB3 are in a same layer as (and optionally made of a same material as) the plurality of first touch mesh electrodes and the plurality of second touch mesh electrodes.

In some embodiments, the respective first signal line portion and the respective connecting portion are in different layers. Optionally, the display panel further includes one or more seventh insulating layers INX7 between the respective first signal line portion and the respective connecting portion. Optionally, the respective connecting portion extends through a via extending through the one or more seventh insulating layers INX7 to connect to the respective first signal line portion. In one example, the one or more seventh insulating layers INX7 include at least one of the second gate insulating layer, the inter-layer dielectric layer, the passivation layer, the first planarization layer, or the second planarization layer.

In one particular example, the respective connecting portion and the third sub-layer SUB3 are parts of the second touch metal layer, and the respective first signal line portion is in the first gate metal layer. The first gate metal layer includes a first capacitor electrode of the storage capacitor of a pixel driving circuit of the display panel, and a gate electrode of a transistor of the pixel driving circuit of the display panel.

Figure 20B:
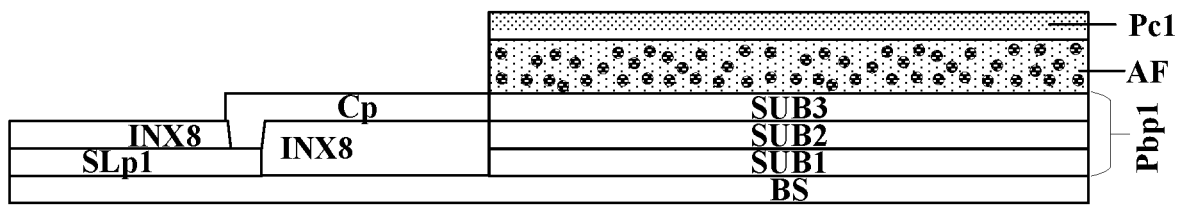
FIG. 20B shows a connection among a respective first signal line portion, a respective connecting portion, and a respective first bonding pin portion in some embodiments according to the present disclosure.

FIG. 20B shows a connection among a respective first signal line portion, a respective connecting portion, and a respective first bonding pin portion in some embodiments according to the present disclosure. Referring to FIG. 20B, the respective connecting portion in some embodiments is in a same layer as the third sub-layer SUB3 of the respective first bonding pin portion. In some embodiments, the respective connecting portion and the third sub-layer SUB3 are parts of the second touch metal layer, for example, the respective connecting portion and the third sub-layer SUB3 are in a same layer as (and optionally made of a same material as) the plurality of first touch mesh electrodes and the plurality of second touch mesh electrodes.

In some embodiments, the respective first signal line portion and the respective connecting portion are in different layers. Optionally, the display panel further includes one or more eighth insulating layers INX8 between the respective first signal line portion and the respective connecting portion. Optionally, the respective connecting portion extends through a via extending through the one or more eighth insulating layers INX8 to connect to the respective first signal line portion. In one example, the one or more eighth insulating layers INX8 include at least one of the inter-layer dielectric layer, the passivation layer, the first planarization layer, or the second planarization layer.

In one particular example, the respective connecting portion and the third sub-layer SUB3 are parts of the second touch metal layer, and the respective first signal line portion is in the second gate metal layer. The second gate metal layer includes a second capacitor electrode of the storage capacitor of a pixel driving circuit of the display panel.

Figure 20C:
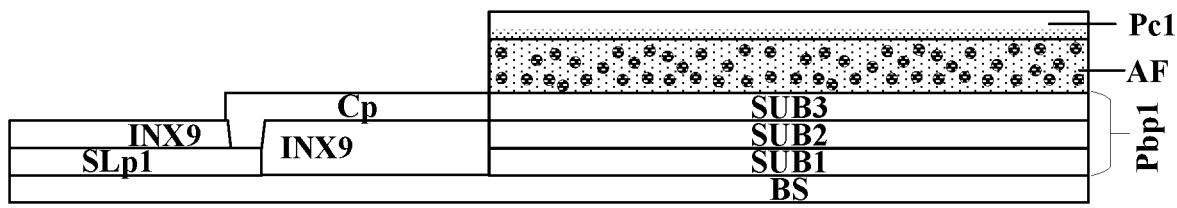
FIG. 20C shows a connection among a respective first signal line portion, a respective connecting portion, and a respective first bonding pin portion in some embodiments according to the present disclosure.

FIG. 20C shows a connection among a respective first signal line portion, a respective connecting portion, and a respective first bonding pin portion in some embodiments according to the present disclosure. Referring to FIG. 20C, the respective connecting portion in some embodiments is in a same layer as the third sub-layer SUB3 of the respective first bonding pin portion. In some embodiments, the respective connecting portion and the third sub-layer SUB3 are parts of the second touch metal layer, for example, the respective connecting portion and the third sub-layer SUB3 are in a same layer as (and optionally made of a same material as) the plurality of first touch mesh electrodes and the plurality of second touch mesh electrodes.

In some embodiments, the respective first signal line portion and the respective connecting portion are in different layers. Optionally, the display panel further includes one or more ninth insulating layers INX9 between the respective first signal line portion and the respective connecting portion. Optionally, the respective connecting portion extends through a via extending through the one or more ninth insulating layers INX9 to connect to the respective first signal line portion. In one example, the one or more ninth insulating layers INX9 include at least one of the passivation layer, the first planarization layer, or the second planarization layer.

In one particular example, the respective connecting portion and the third sub-layer SUB3 are parts of the second touch metal layer, and the respective first signal line portion is in the first signal line layer.

Figure 20D:
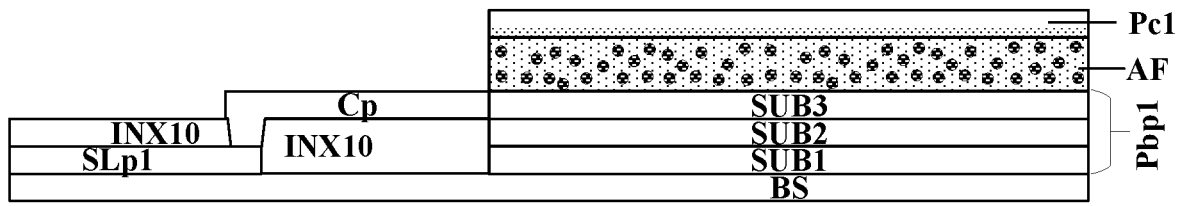
FIG. 20D shows a connection among a respective first signal line portion, a respective connecting portion, and a respective first bonding pin portion in some embodiments according to the present disclosure.

FIG. 20D shows a connection among a respective first signal line portion, a respective connecting portion, and a respective first bonding pin portion in some embodiments according to the present disclosure. Referring to FIG. 20D, the respective connecting portion in some embodiments is in a same layer as the third sub-layer SUB3 of the respective first bonding pin portion. In some embodiments, the respective connecting portion and the third sub-layer SUB3 are parts of the second touch metal layer, for example, the respective connecting portion and the third sub-layer SUB3 are in a same layer as (and optionally made of a same material as) the plurality of first touch mesh electrodes and the plurality of second touch mesh electrodes.

In some embodiments, the respective first signal line portion and the respective connecting portion are in different layers. Optionally, the display panel further includes one or more tenth insulating layers INX10 between the respective first signal line portion and the respective connecting portion. Optionally, the respective connecting portion extends through a via extending through the one or more tenth insulating layers INX10 to connect to the respective first signal line portion. In one example, the one or more tenth insulating layers INX10 include the second planarization layer.

In one particular example, the respective connecting portion and the third sub-layer SUB3 are parts of the second touch metal layer, and the respective first signal line portion is in the second signal line layer.

Figure 21A:
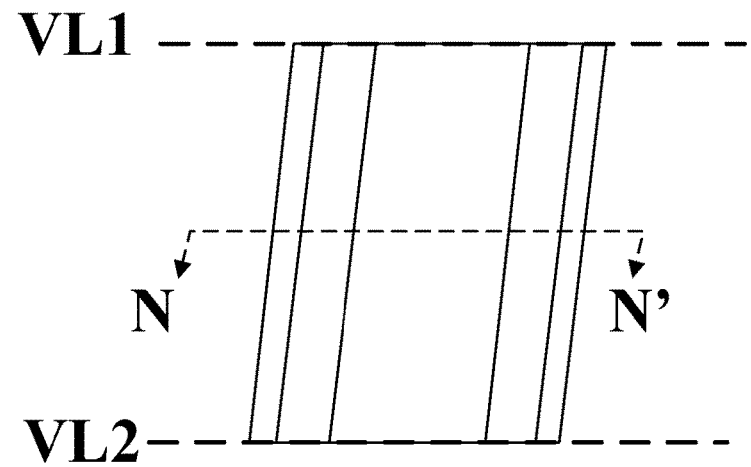
FIG. 21A is a schematic diagram illustrating the structure of a respective connection portion in some embodiments according to the present disclosure.
Figure 21B:
FIG. 21B is a cross-sectional view along an N-N' line in FIG. 21A.

FIG. 21A is a schematic diagram illustrating the structure of a respective connection portion in some embodiments according to the present disclosure. FIG. 21B is a cross-sectional view along an N-N' line in FIG. 21A. Referring to FIG. 21A, and as discussed above, the plurality of connecting portions Cp are disposed between the first virtual line VL1 and the second virtual line VL2. Referring to FIG. 21A and FIG. 21B, the display panel in a region between the first virtual line VL1 and the second virtual line VL2 includes a first pad PAD1, a second pad PAD2 on the first pad PAD1, and a respective connection portion of the plurality of connecting portions CP on a side of the second pad PAD2 away from the first pad PAD1. Optionally, the respective connecting pad is connected to the second pad PAD2, and the second pad PAD2 is connected to the first pad PAD1. Optionally, the display panel in the region between the first virtual line VL1 and the second virtual line VL2 further includes an inter-layer dielectric layer ILD on a side of the first pad PAD1 closer to the second pad PAD2, and on a side of the second pad PAD2 closer to the first pad PAD1. Optionally, the display panel in the region between the first virtual line VL1 and the second virtual line VL2 further includes a passivation layer PVX on a side of the second pad PAD2 away from the first pad PAD1, and a touch insulating layer TI on a side of the passivation layer PVX away from the second pad PAD2, wherein the passivation layer PVX is on a side of the touch insulating layer TI closer to the second pad PAD2, and the touch insulating layer TI is on a side of the respective connecting portion closer to the second pad PAD2.

In alternative embodiments, the display panel in the region between the first virtual line and the second virtual line includes a second gate insulating layer and an inter-layer dielectric layer, wherein the second gate insulating layer and the inter-layer dielectric layer are on a side of the first pad closer to the second pad, and on a side of the second pad closer to the first pad, and the inter-layer dielectric layer is on a side of the second gate insulating layer away from the first pad.

In some embodiments, the first pad PAD1 is in the first gate metal layer Gate1, the second pad PAD2 is in the first signal line layer SD1, and the respective connecting portion is in the second touch metal layer MTB.

Figure 22A:
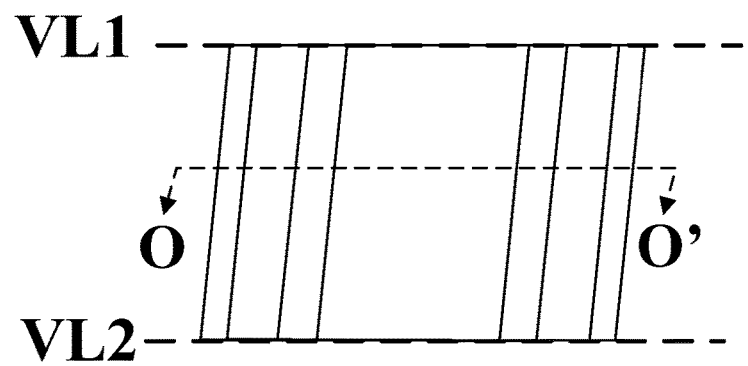
FIG. 22A is a schematic diagram illustrating the structure of a respective connection portion in some embodiments according to the present disclosure.
Figure 22B:
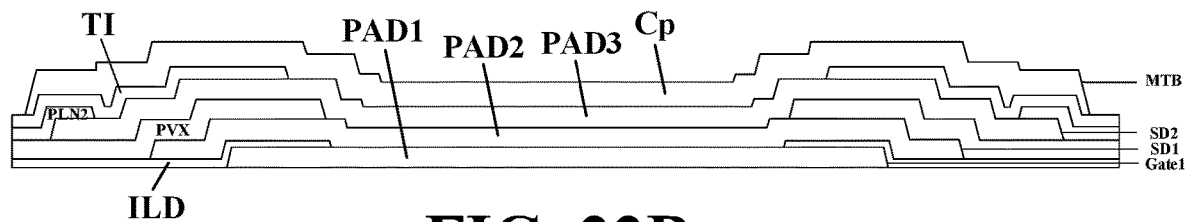
FIG. 22B is a cross-sectional view along an O-O' line in FIG. 22A.

FIG. 22A is a schematic diagram illustrating the structure of a respective connection portion in some embodiments according to the present disclosure. FIG. 22B is a cross-sectional view along an O-O' line in FIG. 22A. Referring to FIG. 22A, and as discussed above, the plurality of connecting portions Cp are disposed between the first virtual line VL1 and the second virtual line VL2. Referring to FIG. 22A and FIG. 22B, the display panel in a region between the first virtual line VL1 and the second virtual line VL2 includes a first pad PAD1, a second pad PAD2 on the first pad PAD1, a third pad PAD3 on a side of the second pad PAD2 away from the first pad PAD1, and a respective connection portion of the plurality of connecting portions CP on a side of the third pad PAD3 away from the second pad PAD2. Optionally, the respective connecting pad is connected to the third pad PAD3, the third pad PAD3 is connected to the second pad PAD2, and the second pad PAD2 is connected to the first pad PAD1. Optionally, the display panel in the region between the first virtual line VL1 and the second virtual line VL2 further includes an inter-layer dielectric layer ILD on a side of the first pad PAD1 closer to the second pad PAD2, and on a side of the second pad PAD2 closer to the first pad PAD1. Optionally, the display panel in the region between the first virtual line VL1 and the second virtual line VL2 further includes a passivation layer PVX on a side of the second pad PAD2 away from the first pad PAD1, and on a side of the third pad PAD3 closer to the second pad PAD2. Optionally, the display panel in the region between the first virtual line VL1 and the second virtual line VL2 further includes a passivation layer PVX on a side of the second pad PAD2 away from the first pad PAD1, and a touch insulating layer TI on a side of the third pad PAD3 away from the second pad PAD2, wherein the passivation layer PVX is on a side of the third pad PAD3 closer to the second pad PAD2, and the touch insulating layer TI is on a side of the respective connecting portion closer to the third pad PAD3.

In alternative embodiments, the display panel in the region between the first virtual line and the second virtual line includes a second gate insulating layer and an inter-layer dielectric layer, wherein the second gate insulating layer and the inter-layer dielectric layer are on a side of the first pad closer to the second pad, and on a side of the second pad closer to the first pad, and the inter-layer dielectric layer is on a side of the second gate insulating layer away from the first pad.

In some embodiments, the first pad PAD1 is in the first gate metal layer Gate1, the second pad PAD2 is in the first signal line layer SD1, the third pad PAD3 is in the second signal line layer SD2, and the respective connecting portion is in the second touch metal layer MTB.

In some embodiments, the respective first bonding pin portion and the respective connecting portion are substantially parallel to an extension direction. In some embodiments, along the extension direction, a length of the respective connecting portion along a direction from the first virtual line VL1 to the second virtual line VL2 is in a range of 50 μm to 250 μm, e.g., 50 μm to 100 μm, 100 μm to 150 μm, 150 μm to 200 μm, or 200 μm to 250 μm. In one example, along the extension direction, the length of the respective connecting portion along a direction from the first virtual line VL1 to the second virtual line VL2 is in a range of 100 μm to 200 μm.

Figure 23A:
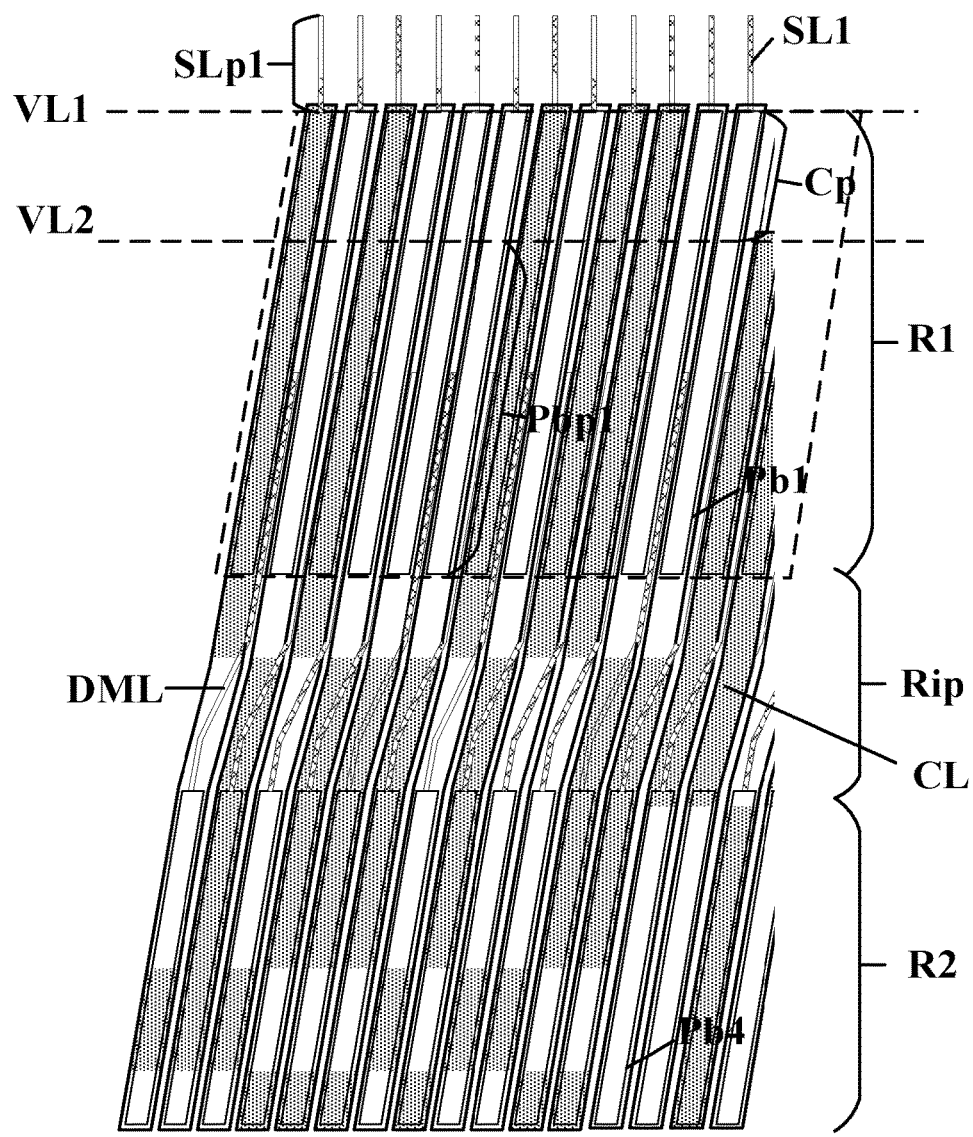
FIG. 23A is a zoom-in view of a bonding region of a display panel in some embodiments of the present disclosure.

FIG. 23A is a zoom-in view of a bonding region of a display panel in some embodiments of the present disclosure. Referring to FIG. 23A, in some embodiments, the display panel further includes a plurality of connecting lines CL. The plurality of bonding pins further include a plurality of fourth bonding pins Pb4. The plurality of first bonding pins Pb1 are clustered in a first region R1. The plurality of fourth bonding pins Pb4 are clustered in a second region R2. The first region R1 is spaced apart from the second region R2 by an inter-pin region Rip absent of any bonding pins.

In some embodiments, a respective connecting line of the plurality of connecting lines CL extends at least partially through the first region R1, through the inter-pin region Rip, and at least partially into the second region R2. In some embodiments, the respective connecting line is connected to a respective first bonding pin of the plurality of first bonding pins Pb1, and is connected to a respective fourth bonding pin of the plurality of fourth bonding pins Pb4, thereby electrically connecting the respective first bonding pin with the respective fourth bonding pin. The respective first bonding pin and the respective fourth bonding pin are configured to receive a same signal.

In some embodiments, the display panel further includes a plurality of dummy lines DML. A first end of a respective dummy line of the plurality of dummy lines DML is connected to a respective fourth bonding pin of the plurality of fourth bonding pins Pb4, a second end of the respective dummy line is disconnected, e.g., floating.

The plurality of bonding pins include a plurality of first bonding pins Pb1 respectively electrically connected to the plurality of first signal lines SL1, and a plurality of fourth bonding pins Pb4. The plurality of first signal lines SL1 include a plurality of first signal line portions SLp1 substantially parallel to each other. Ends of the plurality of first signal line portions closer to the plurality of first bonding pins Pb1 arranged along a first virtual line VL1. The plurality of first bonding pins Pb1 include a plurality of first bonding pin portions Pbp1. Ends of the plurality of first bonding pin portions Pbp1 closer to the plurality of first signal lines SL1 arranged along a second virtual line VL2.

In some embodiments, the display panel further includes a plurality of connecting portions Cp respectively connecting the plurality of first signal line portions SLp1 to the plurality of first bonding pin portions Pbp1, for example, the plurality of connecting portions Cp respectively connecting ends of the plurality of first signal line portions to the ends of the plurality of first bonding pin portions Pbp1. The plurality of connecting portions Cp are respectively portions of the plurality of first bonding pin portions Pb1. A respective one of the plurality of first bonding pins Pb1 includes a respective one of the plurality of first bonding pin portions Pbp1 and a respective one of the plurality of connecting portions Cp.

The plurality of connecting portions Cp are disposed between the first virtual line VL1 and the second virtual line VL2. Optionally, a respective one of the plurality of first bonding pin portions Pbp1 and a respective one of the plurality of connecting portions Cp are substantially parallel to each other. Optionally, the respective one of the plurality of first bonding pin portions Pbp1 and the respective one of the plurality of connecting portions Cp are arranged at a substantially same inclined angle with respect to a respective one of the plurality of first signal line portions SL1.

Figure 23B:
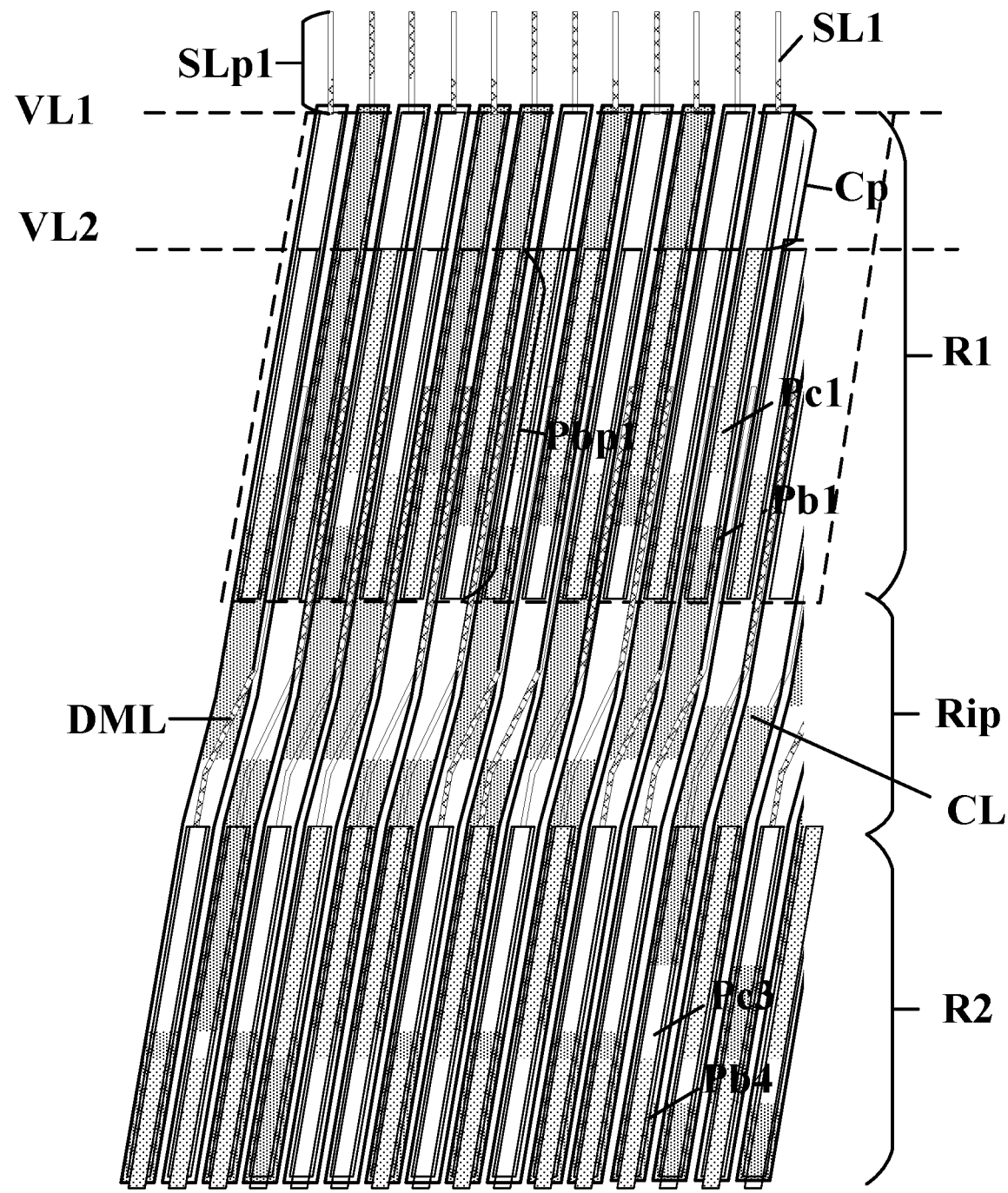
FIG. 23B is a zoom-in view of a bonding region of a display apparatus in some embodiments of the present disclosure.

FIG. 23B is a zoom-in view of a bonding region of a display apparatus in some embodiments of the present disclosure. Referring to FIG. 23B, in some embodiments, the flexible printed circuit comprises a plurality of first circuit pins Pc1 respectively electrically connected to the plurality of first bonding pins Pb1, and a plurality of third circuit pins Pc3 respectively electrically connected to the plurality of fourth bonding pins Pb4. Optionally, a respective one of the plurality of third circuit pins Pc3 and a respective one of the plurality of fourth bonding pins Pb4 are substantially parallel to each other, and are arranged at a substantially same inclined angle with respect to a respective one of the plurality of first signal line portions SLp1.

Figure 24:
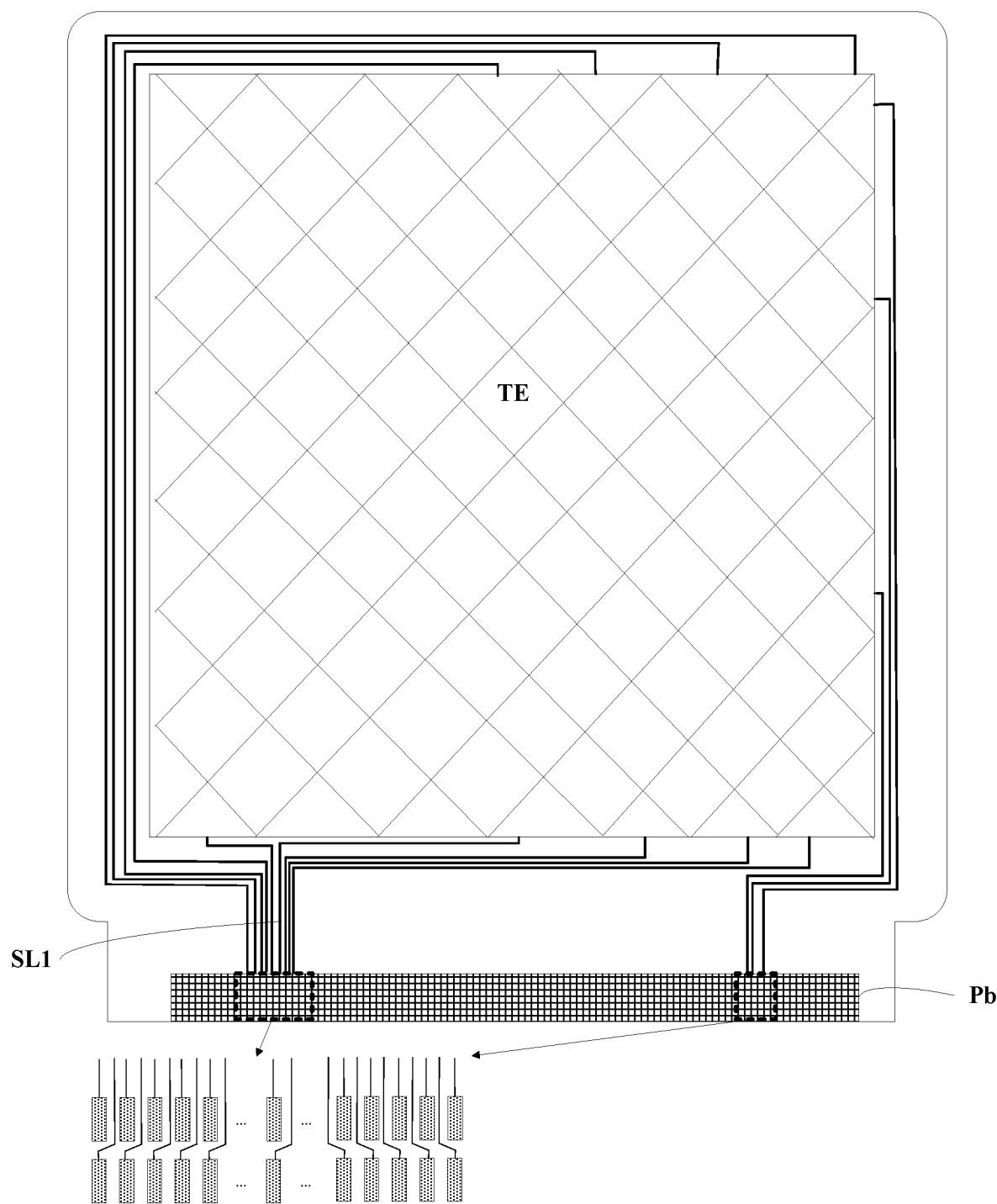
FIG. 24 is a schematic diagram illustrating the structure of a display panel in some embodiments of the present disclosure.

FIG. 24 is a schematic diagram illustrating the structure of a display panel in some embodiments of the present disclosure. Referring to FIG. 24, the display panel is a touch control display panel including a plurality of touch electrodes TE and a plurality of first signal lines SL1 connected to the plurality of touch electrodes TE. Optionally, the plurality of first signal lines SL1 are a plurality of touch control signal lines. The display panel further includes a plurality of bonding pins Pb. Optionally, the plurality of bonding pins Pb include a plurality of touch control bonding pins. The plurality of touch control bonding pins may be disposed on one or both sides of the display panel.

In another aspect, the present disclosure provides a display apparatus, including the display panel described herein or fabricated by a method described herein, and a flexible printed circuit bonded in a peripheral region of the display panel. In some embodiments, the flexible printed circuit includes a plurality of first circuit pins respectively electrically connected to the plurality of first bonding pins. Optionally, an orthographic projection of a respective one of the plurality of first circuit pins on the base substrate at least partially overlaps with an orthographic projections of a respective one of the plurality of first bonding pin portions on the base substrate, is non-overlapping with orthographic projections of the plurality of connecting portions on the base substrate, and is non-overlapping with orthographic projections of the plurality of first signal line portions on the base substrate. Optionally, the respective one of the plurality of first circuit pins, the respective one of the plurality of first bonding pin portions, and the respective one of the plurality of connecting portions are substantially parallel to each other, and are arranged at a substantially same inclined angle with respect to the respective one of the plurality of first signal line portions.

In some embodiments, the display panel further includes a plurality of second signal lines. The plurality of bonding pins further include a plurality of third bonding pins. The plurality of first bonding pins and the plurality of second bonding pins are clustered in a first region. The plurality of third bonding pins are clustered in a second region. The first region is spaced apart from the second region by an inter-pin region absent of any bonding pins. The plurality of second signal lines respectively extend through the first region and the inter-pin region to respectively connect to the plurality of third bonding pins. Optionally, the flexible printed circuit further includes a plurality of second circuit pins respectively electrically connected to the plurality of third bonding pins.

In some embodiments, the plurality of second signal lines further include a plurality of second signal line portions in the inter-pin region and respectively connected to the plurality of third bonding pins. Optionally, a respective one of the plurality of second circuit pins, a respective one of the plurality of second signal line portions, and a respective one of the plurality of third bonding pins are substantially parallel to each other, and are arranged at a substantially same inclined angle with respect to a respective one of the plurality of first signal line portions. Optionally, an orthographic projection of a respective one of the plurality of second circuit pins on the base substrate at least partially overlaps with an orthographic projections of the respective one of the plurality of third bonding pins on the base substrate, and is non-overlapping with orthographic projections of the plurality of second signal line portions on the base substrate.

In another aspect, the present disclosure provides a method of bonding a flexible printed circuit onto a display panel in a bonding region in a peripheral region of the display panel. The display panel includes a base substrate; a plurality of first signal lines on the base substrate; a plurality of bonding pins on the base substrate and in the bonding region, the plurality of bonding pins including a plurality of first bonding pins respectively electrically connected to the plurality of first signal lines. Optionally, the plurality of first signal lines include a plurality of first signal line portions substantially parallel to each other, ends of the plurality of first signal line portions closer to the plurality of first bonding pins arranged along a first virtual line. Optionally, the plurality of first bonding pins include a plurality of first bonding pin portions, ends of the plurality of first bonding pin portions closer to the plurality of first signal lines arranged along a second virtual line. Optionally, the display panel further includes a plurality of connecting portions respectively connecting the plurality of first signal line portions to the plurality of first bonding pin portions. Optionally, the plurality of connecting portions between the first virtual line and the second virtual line. Optionally, the plurality of bonding pins further includes a plurality of second bonding pins other than the plurality of first bonding pins. Optionally, the ends of the plurality of first bonding pin portions and ends of the plurality of second bonding pins closer to the plurality of first signal lines are arranged along the second virtual line.

In some embodiments, the method of bonding the flexible printed circuit onto the display panel includes providing a flexible printed circuit; electrically connecting a plurality of first circuit pins of the flexible printed circuit respectively to the plurality of first bonding pins of the display panel. In some embodiments, the step of electrically connecting the plurality of first circuit pins of the flexible printed circuit to the plurality of first bonding pins of the display panel includes aligning the plurality of first circuit pins of the flexible printed circuit respectively with the plurality of first bonding pins of the display panel; and electrically connecting the plurality of first circuit pins of the flexible printed circuit respectively with the plurality of first bonding pins of the display panel using an anisotropic adhesive film subsequent to the aligning. Specifically, the step of aligning the plurality of first circuit pins of the flexible printed circuit respectively with the plurality of first bonding pins of the display panel is performed so that an orthographic projection of a respective one of the plurality of first circuit pins on the base substrate at least partially overlaps with an orthographic projections of a respective one of the plurality of first bonding pin portions on the base substrate, is non-overlapping with orthographic projections of the plurality of connecting portions on the base substrate, and is non-overlapping with orthographic projections of the plurality of first signal line portions on the base substrate. Optionally, the step of aligning the plurality of first circuit pins of the flexible printed circuit respectively with the plurality of first bonding pins of the display panel is performed so that the respective one of the plurality of first circuit pins, the respective one of the plurality of first bonding pin portions, and the respective one of the plurality of connecting portions are substantially parallel to each other, and are arranged at a substantially same inclined angle with respect to the respective one of the plurality of first signal line portions.

In some embodiments, the display panel further comprises a plurality of second signal lines. The plurality of bonding pins further include a plurality of third bonding pins. The plurality of first bonding pins are clustered in a first region. The plurality of third bonding pins are clustered in a second region. The first region is spaced apart from the second region by an inter-pin region absent of any bonding pins. The plurality of second signal lines respectively extend through the first region and the inter-pin region to respectively connect to the plurality of third bonding pins. The flexible printed circuit includes a plurality of second circuit pins respectively electrically connected to the plurality of third bonding pins. In some embodiments, the method further includes electrically connecting the plurality of second circuit pins of the flexible printed circuit respectively to the plurality of third bonding pins of the display panel.

In some embodiments, the step of electrically connecting the plurality of second circuit pins of the flexible printed circuit respectively to the plurality of third bonding pins of the display panel includes aligning the plurality of second circuit pins of the flexible printed circuit respectively with the plurality of third bonding pins of the display panel; and electrically connecting the plurality of second circuit pins of the flexible printed circuit respectively with the plurality of third bonding pins of the display panel using an anisotropic adhesive film subsequent to the aligning. Specifically, the step of aligning the plurality of second circuit pins of the flexible printed circuit respectively with the plurality of third bonding pins of the display panel is performed so that an orthographic projection of a respective one of the plurality of second circuit pins on the base substrate at least partially overlaps with an orthographic projections of the respective one of the plurality of third bonding pins on the base substrate, and is non-overlapping with orthographic projections of the plurality of second signal line portions on the base substrate. Optionally, the step of aligning the plurality of second circuit pins of the flexible printed circuit respectively with the plurality of third bonding pins of the display panel is performed so that a respective one of the plurality of second circuit pins, a respective one of the plurality of second signal line portions, and a respective one of the plurality of third bonding pins are substantially parallel to each other, and are arranged at a substantially same inclined angle with respect to a respective one of the plurality of first signal line portions.

In another aspect, the present disclosure provides a method of fabricating a display panel having a bonding region for bonding a flexible printed circuit in a peripheral region of the display panel. In some embodiments, the method of fabricating the display panel include forming a plurality of first signal lines on the base substrate; and forming a plurality of bonding pins on the base substrate and in the bonding region. Optionally, forming the plurality of bonding pins includes forming a plurality of first bonding pins respectively electrically connected to the plurality of first signal lines. Optionally, forming the plurality of first signal lines includes forming a plurality of first signal line portions substantially parallel to each other, ends of the plurality of first signal line portions closer to the plurality of first bonding pins arranged along a first virtual line. Optionally, forming the plurality of first bonding pins includes forming a plurality of first bonding pin portions, ends of the plurality of first bonding pin portions closer to the plurality of first signal lines arranged along a second virtual line. Optionally, the method further includes forming a plurality of connecting portions respectively connecting the plurality of first signal line portions to the plurality of first bonding pin portions. Optionally, the plurality of connecting portions are formed between the first virtual line and the second virtual line. Optionally, forming the plurality of bonding pins further includes forming a plurality of second bonding pins other than the plurality of first bonding pins. Optionally, the ends of the plurality of first bonding pin portions and ends of the plurality of second bonding pins closer to the plurality of first signal lines are arranged along the second virtual line. Optionally, the display panel is absent of connecting portions that are parts of or connected to the plurality of second bonding pins between the first virtual line and the second virtual line.

In some embodiments, the plurality of connecting portions are respectively portions of the plurality of first signal lines. Forming a respective one of the plurality of first signal lines includes forming a respective one of the plurality of first signal line portions and forming a respective one of the plurality of connecting portions. Optionally, forming the respective one of the plurality of first signal line portions and forming the respective one of the plurality of connecting portions are performed in a same patterning step using a same material and a same mask.

In some embodiments, the plurality of connecting portions are respectively portions of the plurality of first bonding pin portions. Forming a respective one of the plurality of first bonding pins includes forming a respective one of the plurality of first bonding pin portions and forming a respective one of the plurality of connecting portions. Optionally, forming the respective one of the plurality of first bonding pin portions and forming the respective one of the plurality of connecting portions are performed in a same patterning step using a same material and a same mask.

In some embodiments, the plurality of first bonding pins are formed to be clustered in a first region. The plurality of first bonding pins are formed to be clustered in a first sub-region in the first region. Optionally, the plurality of first bonding pins and the plurality of second bonding pins are formed to be clustered in the first region. The plurality of second bonding pins are formed to be clustered in a second sub-region in the first region. The first sub-region is non-overlapping with, and directly adjacent to, the second sub-region.

Optionally, a respective one of the plurality of first bonding pin portions and a respective one of the plurality of connecting portions are formed to be substantially parallel to each other, and are formed to be arranged at a substantially same inclined angle with respect to a respective one of the plurality of first signal line portions.

In some embodiments, the method further includes forming a plurality of second signal lines. Forming the plurality of bonding pins further includes forming a plurality of third bonding pins. The plurality of first bonding pins are formed to be clustered in a first region. Optionally, the plurality of first bonding pins and the plurality of second bonding pins are formed to be clustered in the first region. The plurality of third bonding pins are formed to be clustered in a second region. The first region is spaced apart from the second region by an inter-pin region absent of any bonding pins. The plurality of second signal lines respectively extend through the first region and the inter-pin region to respectively connect to the plurality of third bonding pins.

In some embodiments, forming the plurality of second signal lines includes forming a plurality of second signal line portions in the inter-pin region. The plurality of second signal line portions are formed to be respectively connected to the plurality of third bonding pins. Optionally, a respective one of the plurality of second signal line portions and a respective one of the plurality of third bonding pins are formed to be substantially parallel to each other, and are formed to be arranged at a substantially same inclined angle with respect to a respective one of the plurality of first signal line portions.

In some embodiments, forming the plurality of second signal lines includes forming a plurality of third signal line portions extending through the first region and partially into the inter-pin region. A respective one of the plurality of third signal line portions extends through a space between two directly adjacent bonding pins in the first region. Optionally, the respective one of the plurality of third signal line portions and the two directly adjacent bonding pins in the first region are formed to be substantially parallel to each other, and are formed to be arranged at a substantially same inclined angle with respect to a respective one of the plurality of first signal line portions.

In some embodiments, the plurality of first bonding pins are formed to be clustered in a first sub-region in the first region. Optionally, forming the plurality of third signal line portions includes forming a first group of third signal line portions in the first sub-region. A respective third signal line portion in the first group of third signal line portions extends through a space between two directly adjacent first bonding pins of the plurality of first bonding pins in the first sub-region. The respective third signal line portion in the first group of third signal line portions and the two directly adjacent first bonding pins in the first sub-region are formed to be substantially parallel to each other, and are formed to be arranged at a substantially same inclined angle with respect to a respective one of the plurality of first signal line portions.

In some embodiments, forming the plurality of bonding pins further includes forming a plurality of second bonding pins other than the plurality of first bonding pins. Optionally, the ends of the plurality of first bonding pin portions and ends of the plurality of second bonding pins closer to the plurality of first signal lines are arranged along the second virtual line. Optionally, the plurality of first bonding pins and the plurality of second bonding pins are formed to be clustered in the first region. Optionally, the plurality of second bonding pins are clustered in a second sub-region in the first region. Optionally, forming the plurality of third signal line portions further includes forming a second group of third signal line portions in the second sub-region. A respective third signal line portion in the second group of third signal line portions extends through a space between two directly adjacent second bonding pins of the plurality of second bonding pins in the second sub-region. The respective third signal line portion in the second group of third signal line portions and the two directly adjacent second bonding pins in the second sub-region are formed to be substantially parallel to each other, and are formed to be arranged at a substantially same inclined angle with respect to a respective one of the plurality of first signal line portions.

In some embodiments, forming the plurality of second signal lines further includes forming a plurality of fourth signal line portions in the inter-pin region. The plurality of fourth signal line portions are formed to respectively connect the plurality of third signal line portions and the plurality of second signal line portions. A respective one of the plurality of fourth signal line portions is formed to be arranged at an inclined angle with respect to a respective one of the plurality of second signal line portions, and is formed to be arranged at an inclined angle with respect to a respective one of the plurality of third signal line portions.

In some embodiments, forming the plurality of second signal lines further includes forming a plurality of fifth signal line portions respectively connected to the plurality of third signal line portions. The plurality of fifth signal line portions and the plurality of first signal line portions are formed to be substantially parallel to each other.

In some embodiments, the plurality of first bonding pins are formed to be clustered in a first sub-region in the first region. Optionally, forming the plurality of third signal line portions includes forming a first group of third signal line portions in the first sub-region. A respective third signal line portion in the first group of third signal line portions extends through a space between two directly adjacent first bonding pins of the plurality of first bonding pins in the first sub-region. The respective third signal line portion in the first group of third signal line portions and the two directly adjacent first bonding pins in the first sub-region are formed to be substantially parallel to each other, and are formed to be arranged at a substantially same inclined angle with respect to a respective one of the plurality of first signal line portions. Optionally, forming the plurality of fifth signal line portions includes forming a first group of fifth signal line portions. Optionally, signal line portions of the first group of fifth signal line portions and the plurality of first signal line portions are formed to be alternately arranged.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel, having a bonding region for bonding a flexible printed circuit in a peripheral region of the display panel, comprising:
   a base substrate;
   a plurality of first signal lines on the base substrate; and
   a plurality of bonding pins on the base substrate and in the bonding region, the plurality of bonding pins comprising a plurality of first bonding pins respectively electrically connected to the plurality of first signal lines;
   wherein the plurality of first signal lines comprise a plurality of first signal line portions substantially parallel to each other, ends of the plurality of first signal line portions closer to the plurality of first bonding pins arranged along a first virtual line; and the plurality of first bonding pins comprise a plurality of first bonding pin portions, ends of the plurality of first bonding pin portions closer to the plurality of first signal lines arranged along a second virtual line;

wherein the display panel further comprises a plurality of connecting portions respectively connecting the plurality of first signal line portions to the plurality of first bonding pin portions;

the plurality of connecting portions are between the first virtual line and the second virtual line;

a respective first bonding pin portion of the plurality of first bonding pin portions comprises at least two sub-layers of a first sub-layer, a second sub-layer, and a third sub-layer, stacked together; and a respective connecting portion of the plurality of connecting portions comprises at least one sub-layer of the at least two sub-layers.

2. The display panel of claim 1, wherein the respective first bonding pin portion comprises the first sub-layer, the second sub-layer, and the third sub-layer, stacked together.

3. The display panel of claim 1, wherein the respective connecting portion is in a same layer as one of the first sub-layer, the second sub-layer, and the third sub-layer.

4. The display panel of claim 1, wherein the respective connecting portion is in a same layer as the first sub-layer, and a respective first signal line portion of the plurality of first signal line portions is a layer different from the respective connecting portion and the first sub-layer.

5. The display panel of claim 1, wherein the respective connecting portion and a respective first signal line portion of the plurality of first signal line portions are in a same layer as the first sub-layer.

6. The display panel of claim 1, wherein the respective connecting portion is in a same layer as the second sub-layer, and a respective first signal line portion of the plurality of first signal line portions is a layer different from the respective connecting portion and the second sub-layer.

7. The display panel of claim 1, wherein the respective connecting portion and a respective first signal line portion of the plurality of first signal line portions are in a same layer as the second sub-layer.

8. The display panel of claim 1, wherein the respective connecting portion is in a same layer as the third sub-layer, and a respective first signal line portion of the plurality of first signal line portions is a layer different from the respective connecting portion and the third sub-layer.

9. The display panel of claim 1, wherein the respective first bonding pin portion and the respective connecting portion are substantially parallel to each other, and are arranged at a substantially same inclined angle with respect to a respective first signal line portion of the plurality of first signal line portions.

10. The display panel of claim 1, wherein the display panel in a region between the first virtual line and the second virtual line comprises a first pad, a second pad on the first pad, a third pad on a side of the second pad away from the first pad, and the respective connection portion on a side of the third pad away from the second pad.

11. The display panel of claim 1, wherein the plurality of connecting portions are respectively portions of the plurality of first signal lines; and a respective one of the plurality of first signal lines comprises a respective one of the plurality of first signal line portions and a respective one of the plurality of connecting portions.

12. The display panel of claim 1, wherein the plurality of connecting portions are respectively portions of the plurality of first bonding pin portions; and a respective one of the plurality of first bonding pins comprises a respective one of the plurality of first bonding pin portions and a respective one of the plurality of connecting portions.

13. The display panel of claim 1, wherein the plurality of bonding pins further comprise a plurality of second bonding pins other than the plurality of first bonding pins; and the ends of the plurality of first bonding pin portions and ends of the plurality of second bonding pins closer to the plurality of first signal lines are arranged along the second virtual line.

14. The display panel of claim 13, wherein the display panel is absent of connecting portions that are parts of or connected to the plurality of second bonding pins between the first virtual line and the second virtual line.

15. The display panel of claim 14, wherein the plurality of first bonding pins and the plurality of second bonding pins are clustered in a first region;

the plurality of first bonding pins are clustered in a first sub-region in the first region;

the plurality of second bonding pins are clustered in a second sub-region in the first region; and the first sub-region is non-overlapping with, and directly adjacent to, the second sub-region.

16. The display panel of claim 1, further comprising a plurality of second signal lines;

wherein the plurality of bonding pins further comprise a plurality of third bonding pins;

the plurality of first bonding pins are clustered in a first region;

the plurality of third bonding pins are clustered in a second region;

the first region is spaced apart from the second region by an inter-pin region absent of any bonding pins; and the plurality of second signal lines respectively extend through the first region and the inter-pin region to respectively connect to the plurality of third bonding pins.

17. The display panel of claim 16, wherein the plurality of second signal lines comprise a plurality of second signal line portions in the inter-pin region and respectively connected to the plurality of third bonding pins; and a respective one of the plurality of second signal line portions and a respective one of the plurality of third bonding pins are substantially parallel to each other, and are arranged at a substantially same inclined angle with respect to a respective one of the plurality of first signal line portions.

18. The display panel of claim 16, wherein the plurality of second signal lines comprise a plurality of third signal line portions extending through the first region and partially into the inter-pin region;

a respective one of the plurality of third signal line portions extends through a space between two directly adjacent bonding pins in the first region; and the respective one of the plurality of third signal line portions and the two directly adjacent bonding pins in the first region are substantially parallel to each other, and are arranged at a substantially same inclined angle with respect to a respective one of the plurality of first signal line portions.

19. The display panel of claim 18, wherein the plurality of first bonding pins are clustered in a first sub-region in the first region;

the plurality of third signal line portions comprise a first group of third signal line portions in the first sub-region;

a respective third signal line portion in the first group of third signal line portions extends through a space between two directly adjacent first bonding pins of the plurality of first bonding pins in the first sub-region; and the respective third signal line portion in the first group of third signal line portions and the two directly adjacent first bonding pins in the first sub-region are substantially parallel to each other, and are arranged at a substantially same inclined angle with respect to a respective one of the plurality of first signal line portions.

20. A display apparatus, comprising the display panel of claim 1, and a flexible printed circuit bonded in a peripheral region of the display panel.

\* \* \* \* \*